United States Patent
Dibra et al.

(10) Patent No.: US 9,865,792 B2
(45) Date of Patent: Jan. 9, 2018

(54) SYSTEM AND METHOD FOR MANUFACTURING A TEMPERATURE DIFFERENCE SENSOR

(71) Applicant: Infineon Technologies AG, Neubiberg (DE)

(72) Inventors: Donald Dibra, Munich (DE); Christoph Kadow, Neuried (DE); Markus Zundel, Egmating (DE)

(73) Assignee: Infineon Technologies AG, Neubiberg (DE)

( * ) Notice: Subject to any disclaimer, the term of this patent is extended or adjusted under 35 U.S.C. 154(b) by 829 days.

(21) Appl. No.: 14/282,886

(22) Filed: May 20, 2014

(65) Prior Publication Data

US 2014/0251408 A1 Sep. 11, 2014

Related U.S. Application Data

(62) Division of application No. 13/426,530, filed on Mar. 21, 2012, which is a division of application No. (Continued)

(51) Int. Cl.
*G01K 7/04* (2006.01)
*H01L 35/32* (2006.01)
(Continued)

(52) U.S. Cl.
CPC ............... *H01L 35/32* (2013.01); *G01K 1/08* (2013.01); *G01K 7/02* (2013.01)

(58) Field of Classification Search
None
See application file for complete search history.

(56) References Cited

U.S. PATENT DOCUMENTS 5,830,372 A   11/1998   Hierold
6,543,934 B1   4/2003   Hammer et al.
(Continued)

FOREIGN PATENT DOCUMENTS

DE   4418207 C1   6/1995
DE   19600822 A1   7/1997
(Continued)

OTHER PUBLICATIONS

Akin, T., "CMOS-based Thermal Sensors", Advanced Micro and Nanosystems, 2005, pp. 479-512, vol. 2, Wiley-VCH.
(Continued)

*Primary Examiner* — Lisa Caputo
*Assistant Examiner* — Nasir U Ahmed
(74) *Attorney, Agent, or Firm* — Slater Matsil, LLP

(57) ABSTRACT

An embodiment of the invention relates to a Seebeck temperature difference sensor that may be formed in a trench on a semiconductor device. A portion of the sensor may be substantially surrounded by an electrically conductive shield. A plurality of junctions may be included to provide a higher Seebeck sensor voltage. The shield may be electrically coupled to a local potential, or left electrically floating. A portion of the shield may be formed as a doped well in the semiconductor substrate on which the semiconductor device is formed, or as a metal layer substantially covering the sensor. The shield may be formed as a first oxide layer on a sensor trench wall with a conductive shield formed on the first oxide layer, and a second oxide layer formed on the conductive shield. An absolute temperature sensor may be coupled in series with the Seebeck temperature difference sensor.

14 Claims, 61 Drawing Sheets

Related U.S. Application Data

12/431,504, filed on Apr. 28, 2009, now Pat. No. 8,169,045.

(51) Int. Cl.
*G01K 1/08* (2006.01)
*G01K 7/02* (2006.01)

(56) References Cited

U.S. PATENT DOCUMENTS

| | | | |
|---|---|---|---|
| 6,717,225 B2 | 4/2004 | Male | |
| 6,879,008 B2 | 4/2005 | Male | |
| 7,307,328 B2 * | 12/2007 | Meyer | G01K 7/01 257/370 |
| 7,544,545 B2 | 6/2009 | Chen et al. | |
| 7,994,599 B2 | 8/2011 | Herrnsdorf et al. | |
| 8,373,244 B2 | 2/2013 | Mowry et al. | |
| 2004/0145049 A1 | 7/2004 | McKinnell et al. | |
| 2006/0214693 A1 * | 9/2006 | Nakano | H01L 21/823425 326/87 |
| 2007/0215920 A1 | 9/2007 | Zundel et al. | |
| 2008/0210285 A1 * | 9/2008 | Hosono | H01L 35/34 136/239 |
| 2008/0238550 A1 * | 10/2008 | Sasaki | H01L 27/088 330/277 |
| 2008/0283955 A1 * | 11/2008 | Reynes | H01L 27/0211 257/470 |
| 2009/0218601 A1 | 9/2009 | Stephan et al. | |

FOREIGN PATENT DOCUMENTS

| | | |
|---|---|---|
| DE | 10009593 A1 | 9/2001 |
| DE | 202006010085 U1 | 12/2006 |
| DE | 102007010884 A1 | 9/2007 |
| DE | 102007063228 A1 | 7/2009 |

OTHER PUBLICATIONS

Boutchich, M., et al., "Characterization of Phosphorus and Boron Heavily Doped LPCVD Polysilicon Films in the Temperature Range 293-373 K", IEEE Electron Device Letters, Mar. 2002, pp. 139-141, vol. 23, No. 3.

Detzel, Th., et al., "Analysis of Wire Bond and Metallization Degradation Mechanisms in DMOS Power Transistors Stressed Under Thermal Overload Conditions", ESREF 2004, pp. 1-6, Zurich, Switzerland.

Dibra D., et al., "Scaling of Temperature Sensors for Smart Power MOSFETs", 9th International Seminar on Power Semiconductors (ISPS 2008), Aug. 27-29, 2008, pp. 139-145, Prague, Czech Republic.

Glavanovics, M., et al., "Impact of Thermal Overload Operation on Wirebond and Metallization Reliability in Smart Power Devices", Solid State Device Research Conference, Proceedings of the 34th European, Sep. 21-23, 2004, pp. 273-276.

Russo, S., et al., "Fast Thermal Fatigue on Top Metal Layer of Power Devices", Microelectronics Reliability, Sep. 2002, pp. 1617-1622, vol. 42, No. 9, Elsevier Science Ltd.

"Short Circuit Reliability Characterization of Smart Power Devices for 12V Systems", Automotive Electronics Council, Component Technical Committee, AEC-Q101-006-REV, Sep. 14, 2006, pp. 1-14.

Smorodin, T., et al., "A Temperature Gradient Induced Failure Mechanism in Metallization Under Fast Thermal Cycling", Manuscript, Nov. 21, 2007, pp. 1-10.

Van Herwaarden, A.W., "The Seebeck Effect in Silicon ICs" Sensors and Actuators, 6, Jun. 5-7, 1984, pp. 245-254, Elsevier Sequoia, The Netherlands.

Akin, T., "CMOS-based Thermal Sensors", Advanced Micro and Nanosystems, 2005, pp. 479-512, vol. 2, Wiley-VCH Verlag GmbH & Co. kGaA.

Detzel, Th., et al., "Analysis of Wire Bond and Metallization Degradation Mechanisms in DMOS Power Transistors Stressed Under Thermal Overload Conditions", ESREF Sep. 2004, pp. 1-6, Microelectronics Reliability 44(9), Zurich, Switzerland.

Glavanovics, M., et al., "Impact of Thermal Overload Operation on Wirebond and Metallization Reliability in Smart Power Devices", Proceedings of the 34th European Solid State Device Research Conference, Sep. 21-23, 2004, pp. 273-276.

* cited by examiner

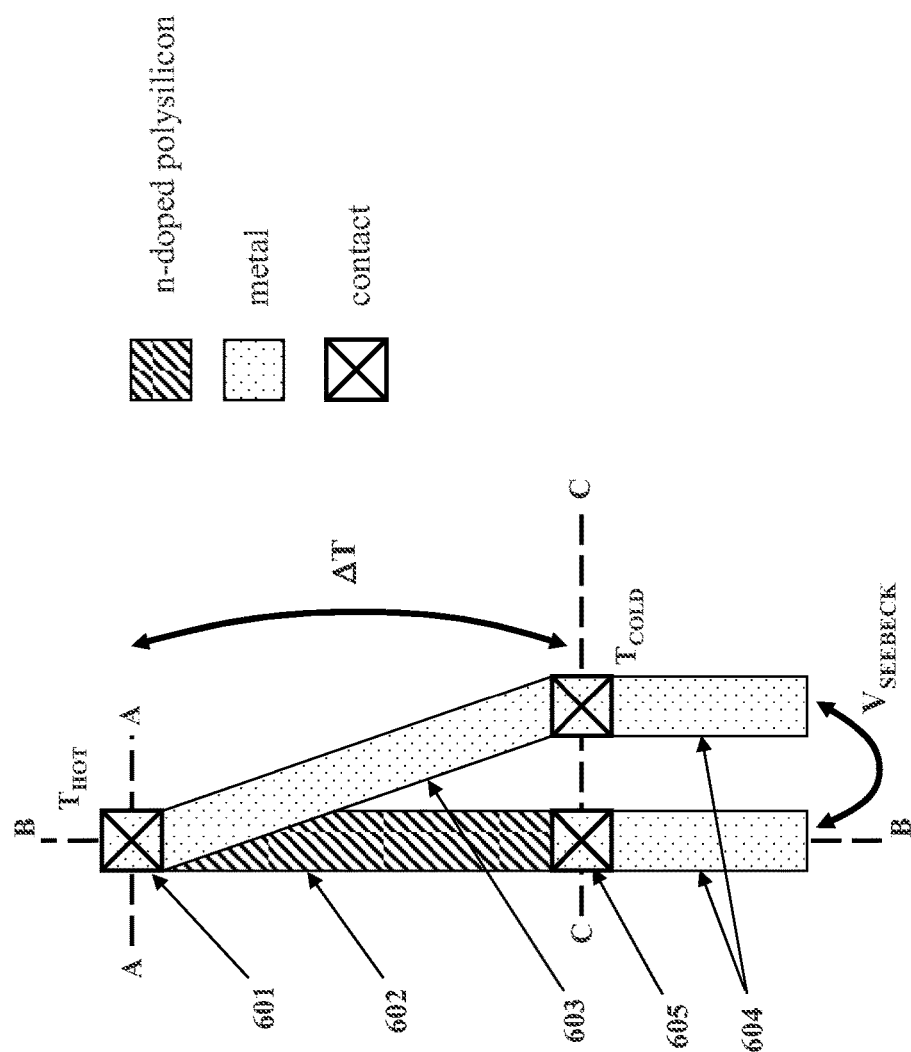

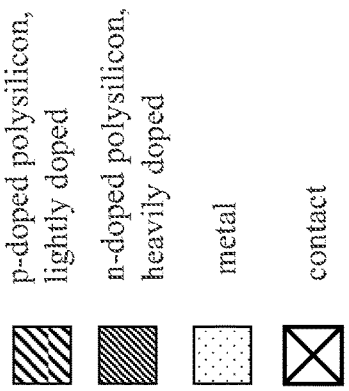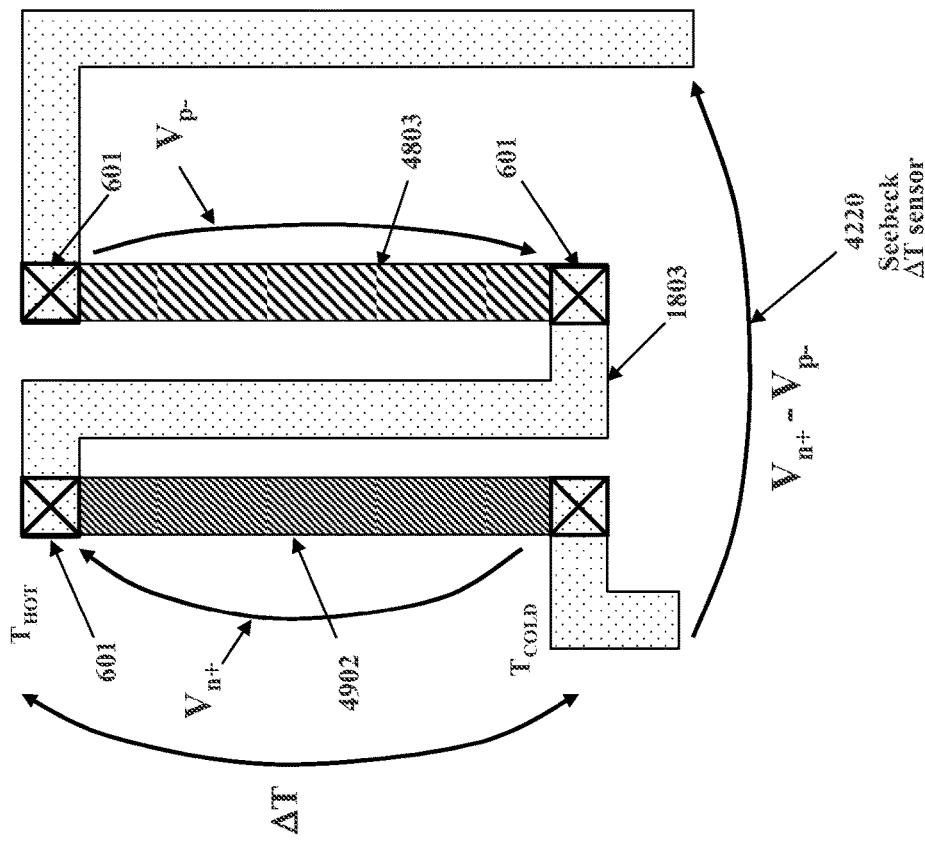
Figure 50

SYSTEM AND METHOD FOR MANUFACTURING A TEMPERATURE DIFFERENCE SENSOR

This is a divisional application of U.S. application Ser. No. 13/426,530, entitled "System and Method for Manufacturing a Temperature Difference Sensor," which was filed on Mar. 21, 2012 which is a divisional application of U.S. application Ser. No. 12/431,504, issued on May 1, 2012 as U.S. Pat. No. 8,169,045, entitled "System and Method for Constructing Shielded Seebeck Temperature Difference Sensor," which was filed on Apr. 28, 2009, both of which are incorporated herein by reference.

TECHNICAL FIELD

An embodiment of the invention relates generally to sensing a temperature and methods, and more particularly to a Seebeck temperature difference sensor formed in an integrated circuit.

BACKGROUND

Power semiconductor devices are used in power applications to switch external loads. The power semiconductor devices either can be discrete components or can be integrated into smart power integrated circuits ("ICs"). During operation, the power semiconductor devices should be protected from high temperatures and high temperature gradients to ensure product reliability. Single-pulse failures are typically caused by the highest temperature in the power semiconductor device. Failures under cyclic loading typically occur in the metallization or in the bond wire connections. For automotive 12 V-systems, product reliability under repetitive high-current operation is particularly important for market acceptance.

To reduce or prevent temperature-induced failures, a local temperature is sensed in a power semiconductor device, and the operation of the device may be altered or stopped if the sensed temperature exceeds a temperature limit. Temperature measurements in semiconductor integrated circuits can be based on reverse- or forward-biased characteristics of a p-n junction, which is generally used for temperature sensing in most semiconductor power devices.

Alternatively, or in addition to, an absolute temperature measurement, a spatial temperature difference can be measured across the semiconductor chip. Such a temperature difference can, for example, be measured with two p-n junctions. Alternatively, a Seebeck temperature difference sensor can be used.

The Seebeck effect, employed in Seebeck temperature difference sensors, produces an electric field in every material in the presence of a spatial temperature gradient, and may be used to sense a temperature difference. The magnitude of the Seebeck effect varies among materials. The magnitude of the Seebeck effect is characterized by the Seebeck coefficient alpha ("α"). The Seebeck coefficient alpha is particularly large in semiconductors and particularly small in metals. A Seebeck temperature difference sensor typically includes two traces of materials that differ in their Seebeck coefficients. These two traces are electrically connected to each other only in the hot region. This electrical connection is ideally a low ohmic junction without nonlinearities. In the cold region, the two traces are electrically isolated from each other and are connected to sensor circuitry. In the presence of a temperature difference, a voltage develops along each trace due to the Seebeck effect. Because the Seebeck coefficients are different in the two materials, the voltages across the two materials are different from each other. Hence, the sum of the two voltages does not vanish, and the sum is proportional to the temperature difference. In the cold region, the sum of these two voltages is measured by the sensor circuitry. In contrast to p-n junctions, the Seebeck voltage develops along the trace of the materials, and not at the junction of the two materials. The voltage only depends on the temperature difference; it is not dependent on the routing of the traces.

Compared to p-n junctions, Seebeck temperature difference sensors may be constructed with smaller size and simpler driving circuitry. Because the output voltage of a Seebeck temperature sensor is proportional to a temperature difference, no current sources are needed as in the case of p-n junction temperature sensors.

Integrated temperature sensors have become an essential part of a device protection strategy, particularly for a power semiconductor device. However, such integrated temperature sensors should work reliably in an electrically noisy environment because a large time rate of change of voltage ("dV/dt") and a large time rate of change of current ("dI/dt") can occur during switching of a power semiconductor device. Power semiconductor devices used in electrically noisy environments can compromise a small signal level produced by a temperature-sensing device based on the Seebeck effect.

Thus, there is a need for a process and related method to provide a signal representing a temperature difference, which may include an added absolute temperature, in an integrated circuit that provide a reliable representation of temperature, and that may be required to operate in an electrically noisy environment, overcoming deficiencies of conventional approaches.

SUMMARY OF THE INVENTION

In accordance with an exemplary embodiment and a related method, a Seebeck temperature difference sensor is formed of oppositely doped polysilicon traces in a sensor trench in an epitaxial layer of a semiconductor device. In an embodiment, the oppositely doped polysilicon traces are separated by an oxide layer excepting a point of contact between the oppositely doped polysilicon traces. In an embodiment, the point of contact between the oppositely doped polysilicon traces is an ohmic contact. In a further embodiment, an electrostatic shield is formed in another trench adjacent to the sensor trench. In a further embodiment, a first oxide layer is formed on a wall of the sensor trench, a conductive shield is formed on the first oxide layer, and a second oxide layer is formed on the conductive shield. In a further embodiment, an oxide layer is deposited over the Seebeck temperature difference sensor, and a conductive shield is formed on the oxide layer. In a further embodiment, the semiconductor device includes a power semiconductor device. In an embodiment, the power semiconductor device is a MOSFET ("metal-oxide semiconductor field-effect transistor") or other power-switching device such as an insulated gate bipolar transistor.

In accordance with a further exemplary embodiment and a related method, a Seebeck temperature difference sensor is formed of a junction of dissimilar materials, and an absolute temperature sensor is coupled in series with the Seebeck temperature difference sensor. In an embodiment, a Seebeck coefficient of the Seebeck temperature difference sensor and a temperature coefficient of the absolute temperature sensor are substantially equal. In an embodiment, the absolute temperature sensor comprises a resistor formed as a doped semiconductor trace. In an embodiment, the Seebeck temperature difference sensor comprises a plurality of the junctions of dissimilar materials. In an embodiment, the dissimilar materials comprise differently doped semiconductor materials. In a further embodiment, a shield is formed of an electrically conductive material substantially surrounding the Seebeck temperature difference sensor and the absolute temperature sensor.

BRIEF DESCRIPTION OF THE DRAWINGS

The details of one or more embodiments of the invention are set forth in the accompanying drawings and the description below. Other features, objects, and advantages of the invention will be apparent from the description and drawings, and from the claims. In the figures, identically numbered reference symbols generally designate the same component parts throughout the various views, and may be described only once in the interest of brevity. For a more complete understanding of the invention, reference is now made to the following descriptions taken in conjunction with the accompanying drawings, in which:

FIGS. 50 and 51 illustrate plan-view drawings of temperature-independent Seebeck temperature difference sensors formed by a lightly doped polysilicon trace and a heavily doped polysilicon trace of opposite doping types coupled in series, constructed according to embodiments;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to exemplary embodiments in a specific context, namely a semiconductor device including an integrated temperature sensor. The integrated temperature sensor may be formed in a trench, and may include an integrated shield. The integrated temperature sensor may be formed to include sensing an absolute temperature by sensing a temperature difference with a Seebeck temperature difference sensor coupled to an absolute temperature sensor. The Seebeck temperature difference sensor including the absolute temperature sensor may be formed with the same temperature coefficient. The Seebeck temperature difference sensor may be formed with a Seebeck coefficient that is independent of temperature. Measured and processed temperature values may be coupled to and evaluated by a temperature difference protection circuit or by an absolute temperature protection circuit.

An embodiment of the invention may be applied, without limitation, to various power switching and power conversion arrangements that include a power semiconductor switch, for example, a power semiconductor switch in an automotive or power conversion application. A temperature-sensing arrangement including a shielded Seebeck temperature difference sensor integrated in the power MOSFET or other semiconductor power switching device such as a bipolar switch can be constructed and applied using processes as introduced herein in different contexts using inventive concepts described herein, for example, a power-switching device employed in an electric power conversion application, in a motor speed control application, or in a power amplifier application. A temperature-sensing arrangement as described herein may be applied to an integrated circuit that dissipates a significant power level, such as a digital signal processor or a microprocessor, which may require a temperature-sensing signal for its operation or protection.

Figure 1A:
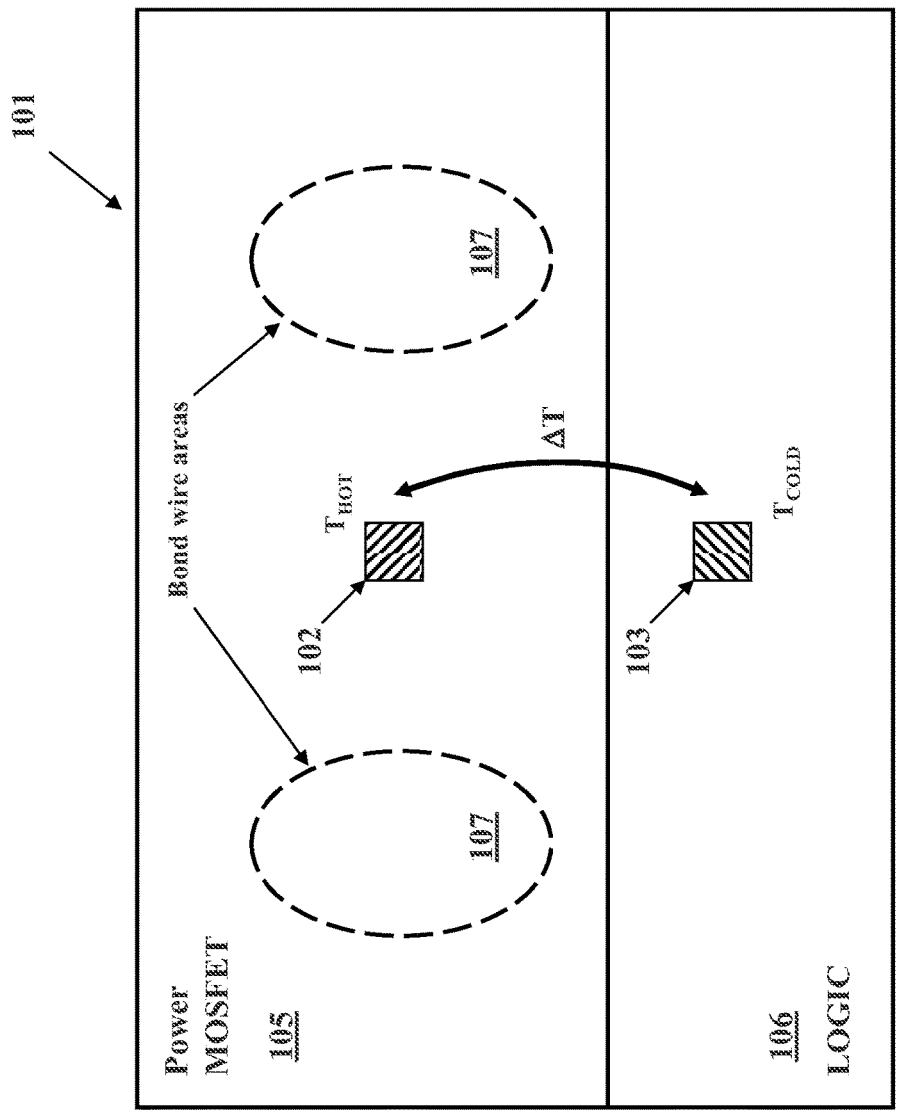
FIGS. 1A and 1B illustrate typical layouts of a temperature sensing arrangement of a semiconductor die formed with a power MOSFET coupled to control logic.

Referring initially to FIG. 1A, illustrated is a typical layout of a temperature sensing arrangement of a semiconductor die 101 formed with a power MOSFET 105 coupled to control logic 106. The control logic 106 is included to protect the power MOSFET 105, for example, during an overload or a short-circuit condition. The temperature sensor 102 for measuring a local hot temperature value ($T_{HOT}$) is located within or proximate the active region of the power semiconductor device, such as a power MOSFET, and the temperature sensor 103 for measuring the cold temperature value ($T_{COLD}$) is located outside the active region of the power semiconductor device, typically in the region of the control logic 106. A p-n junction diode is commonly used for absolute temperature sensing for semiconductor power devices.

Figure 1B:
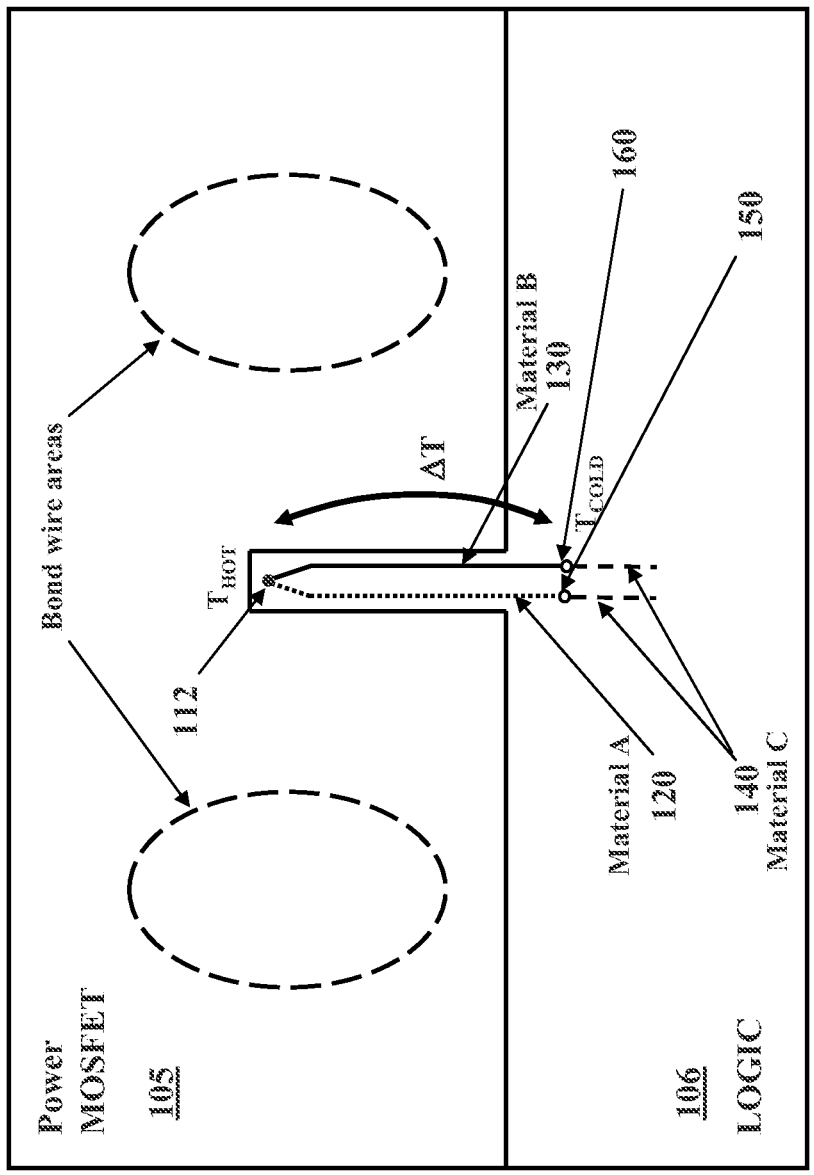

Turning now to FIG. 1B, illustrated is a Seebeck temperature difference sensor arrangement included with a power semiconductor device to provide temperature protection. The Seebeck temperature difference sensor includes a junction 112 of dissimilar electrically conductive materials, a first material "A" 120, and a second material "B" 130. The junction 112 is located in a hot region of the power semiconductor device, but in an alternative arrangement, the junction 112 may be located in a cold region of a power semiconductor device. Contact 150 of the first material is located in a cold region of the power semiconductor device, and is coupled by means of a third material "C" 140 to sensor circuitry. A contact may be formed for example, without limitation, of aluminum, copper, tungsten, or highly doped polysilicon. Another contact 160 of the second material is also located in the cold region of the power semiconductor device, and is coupled by means of the third material 140 to the sensor circuitry.

A Seebeck temperature difference sensor may be constructed employing junctions of dissimilar materials, such as illustrated in FIG. 1B. For example, a Seebeck temperature difference sensor may be formed by a junction of a p-type and an n-type semiconductor, by a junction of dissimilar metals such as aluminum, copper, or gold, or by a junction of a metal and a semiconductor. Without loss of functionality, the junction may include intermediate structures such as additional junctions, layers, or doping profiles. For example, the junction between p-type and n-type semiconductors may be formed by contacting both semiconductors with ohmic contacts and connecting the two contacts with a metal. Such intermediate structures may be used to facilitate producing the ohmic characteristics of the junction. These intermediate structures may be located in the hot region. A Seebeck temperature difference sensor may also be formed by a junction of the same semiconductor material similarly doped, but doped at different doping densities.

As described herein, a shielded Seebeck temperature difference sensor integrated with a power semiconductor device is employed to measure a temperature difference, ΔT, between a hot and a cold region of an integrated circuit. A shielded Seebeck temperature difference sensor so constructed may be used in an electrically noisy environment, wherein the shielding structure protects the low voltage sensor signal from noise induced by high voltage swings in the power semiconductor device and from other noise sources. The temperature sensor includes one or more junctions made from at least two different materials that are located in the hot region of the semiconductor die. Traces formed of the different materials that form the junction are routed to a cold region of the device. A voltage develops along the traces of the different materials according to the Seebeck effect. The sum of these voltages is measured at the ends of the traces, typically in the cold region. Because the materials are different, the summed voltage does not sum to zero. The summed voltage is proportional to the temperature difference "ΔT" along the traces between the hot and cold junctions. The junctions and traces, as described herein, may be enclosed by an electrically shielding structure, which can form a substantially complete or partial enclosure of the sensor. The shielding structure is formed of an electrically conductive material that is electrically isolated from the sensor. If an electric field is present outside a conductive shielding structure, the electric field terminates on the shield. Hence the signal produced by the sensor is not substantially disturbed by the external electric field.

The shielding structure described herein enables integration of a Seebeck temperature difference sensor with a power semiconductor device because the signals produced by the Seebeck temperature difference sensor are small, typically between 10 mV and 100 mV for a temperature difference of 100 K. The signal of a Seebeck temperature difference sensor is therefore several orders of magnitude smaller than voltages in typical power applications, which are typically 10 V to 10 kV. During switching of a power semiconductor device in a power system, circuits exhibiting large dV/dt (time rate of change of voltage) and large dI/dt (time rate of change of current) near a Seebeck temperature difference sensor would disturb a signal produced by the sensor if the sensor was not shielded. Noise-inducing switching transients are frequently present in a power system, as well as other noise sources such as a motor constructed with a conventional mechanical commutator.

The shielding structure can be connected either to a fixed potential, e.g., a local ground potential or to a dc supply voltage, or can be used as a guard ring wherein the shielding structure is coupled, for example, using a voltage follower, to the same potential as a signal line. The shielding structure can also be left floating, or coupled to a fixed potential through a high resistance.

Turning now to FIGS. 2A through 5, illustrated in the respective drawings are several configurations of a semiconductor power switch and an integrated shielded Seebeck temperature difference sensor 208, 308, 408, and 508, constructed according to embodiments. The integrated shielded Seebeck temperature difference sensor includes a power MOSFET, a shield, and a Seebeck temperature difference sensing arrangement.

Figure 2A:
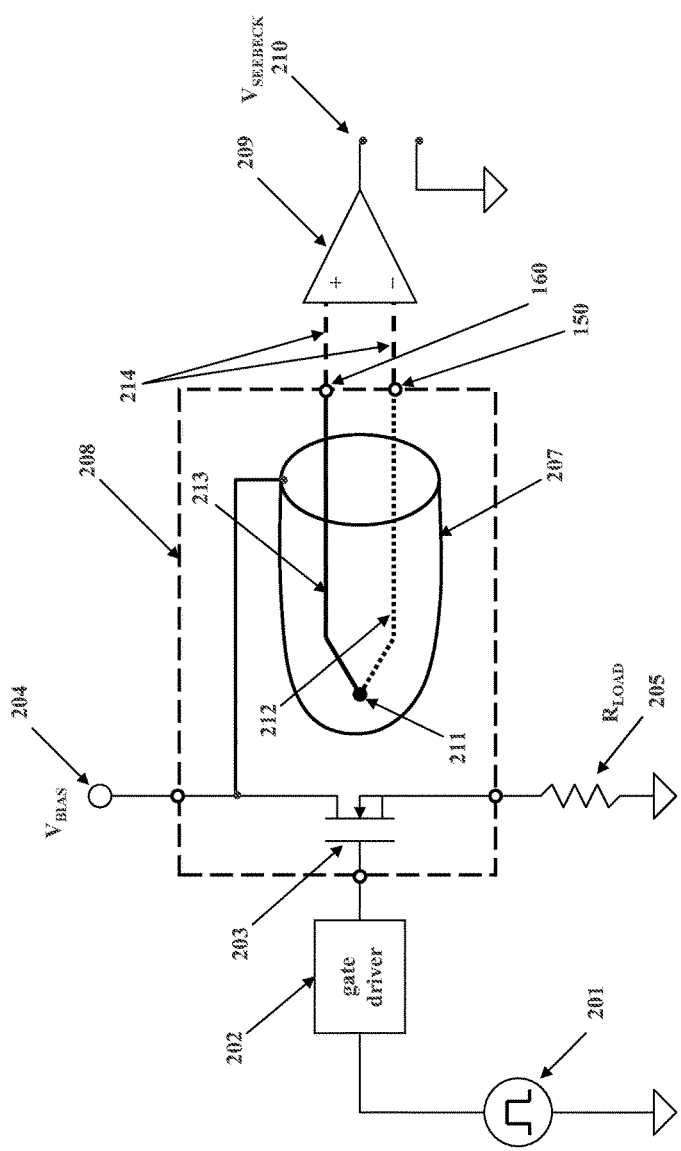
FIGS. 2A through 5 illustrate several configurations of a semiconductor power switch and an integrated shielded Seebeck temperature difference sensor, constructed according to embodiments.

FIG. 2A illustrates a simplified schematic drawing of a shielded Seebeck temperature difference sensor 208, formed with a junction 211 of dissimilar materials located in a hot region of an integrated circuit, integrated with a power MOSFET 203 in a high-side circuit configuration with the shield 207. The junction 211 is located in a region of a hot local temperature of the integrated circuit. The shield 207 is coupled to a fixed shield potential supplied by a local bias voltage source 204. The Seebeck junction illustrated in FIG. 2A is formed at the junctions of conductors 212 and 213 that are formed of dissimilar materials as described previously hereinabove with reference to FIG. 1B.

In the exemplary shielded Seebeck temperature difference sensors illustrated in FIGS. 2A through 5, the power semiconductor device, without limitation, is the power MOSFET 203. As illustrated in FIG. 2A, the power MOSFET 203 is coupled to the local bias voltage source 204 providing a bias voltage $V_{BIAS}$ and to a load resistor $R_{LOAD}$ 205. The load resistor 205 in turn is coupled to local circuit ground. The control terminal of the power MOSFET 203, i.e., its gate, is coupled to a gate driver 202 to that in turn is coupled to a signal source 201 configured to generate a signal to quickly enable and disable conductivity of the power MOSFET 203. The signal produced by the sensor is sensed by instrumentation amplifier 209 to produce the Seebeck voltage $V_{SEEBECK}$ 210. A third electrically conductive semiconductor material may be employed to couple the signal produced by the shielded Seebeck temperature difference sensor on traces 214 to the instrumentation amplifier 209.

Figure 2B:
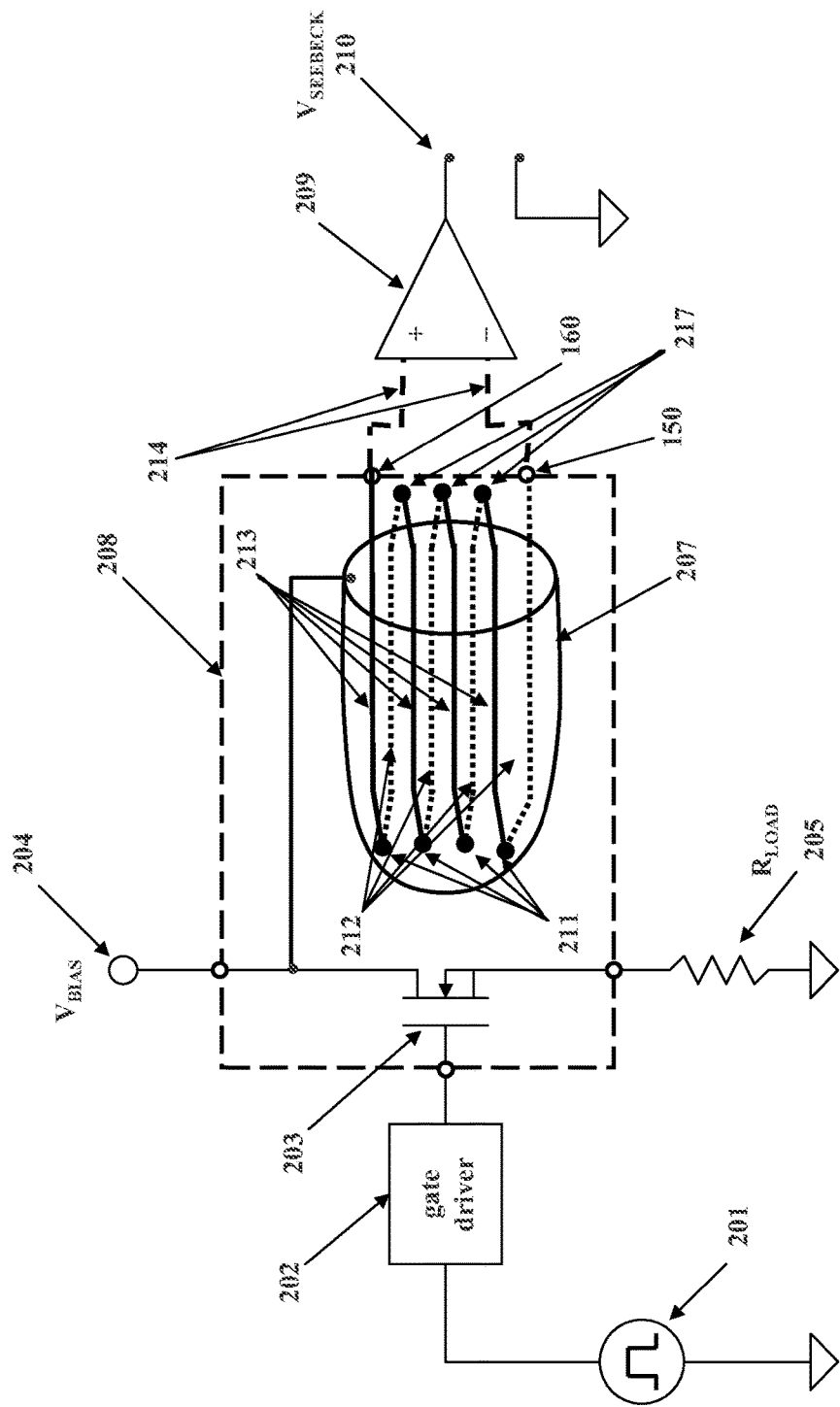

Turning now to FIG. 2B, illustrated is a simplified schematic drawing of the shielded Seebeck temperature difference sensor 208 including a plurality of hot junctions 211 and cold junctions 217. The junctions are constructed with electrically conductive traces 212 and 213 formed of dissimilar materials.

Figure 3:
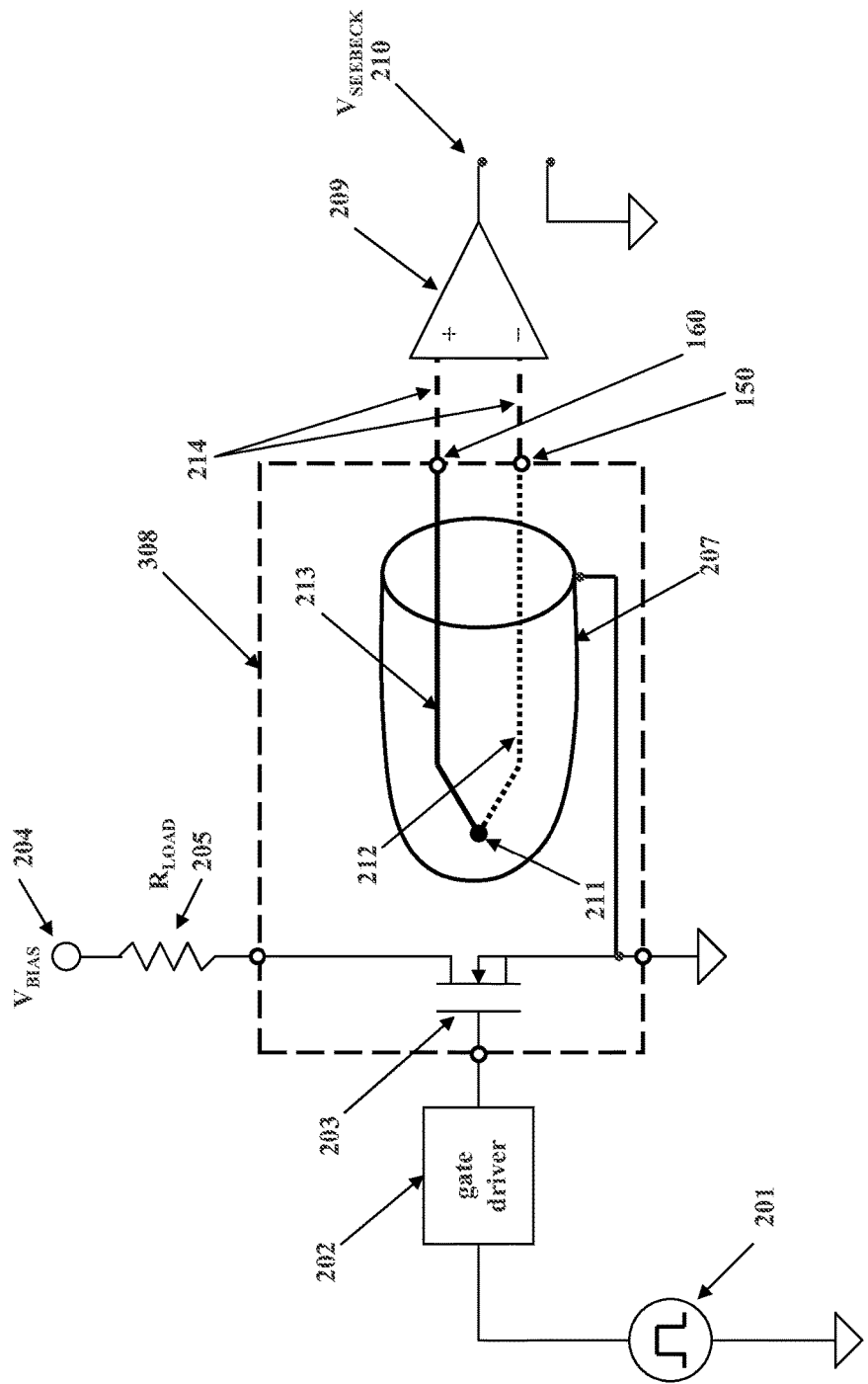

Turning now to FIG. 3, illustrated is a simplified schematic drawing of a shielded Seebeck temperature difference sensor 308 integrated with a power MOSFET 203 in a low-side circuit configuration, wherein the shield 207 is coupled to a local circuit ground.

Figure 4:
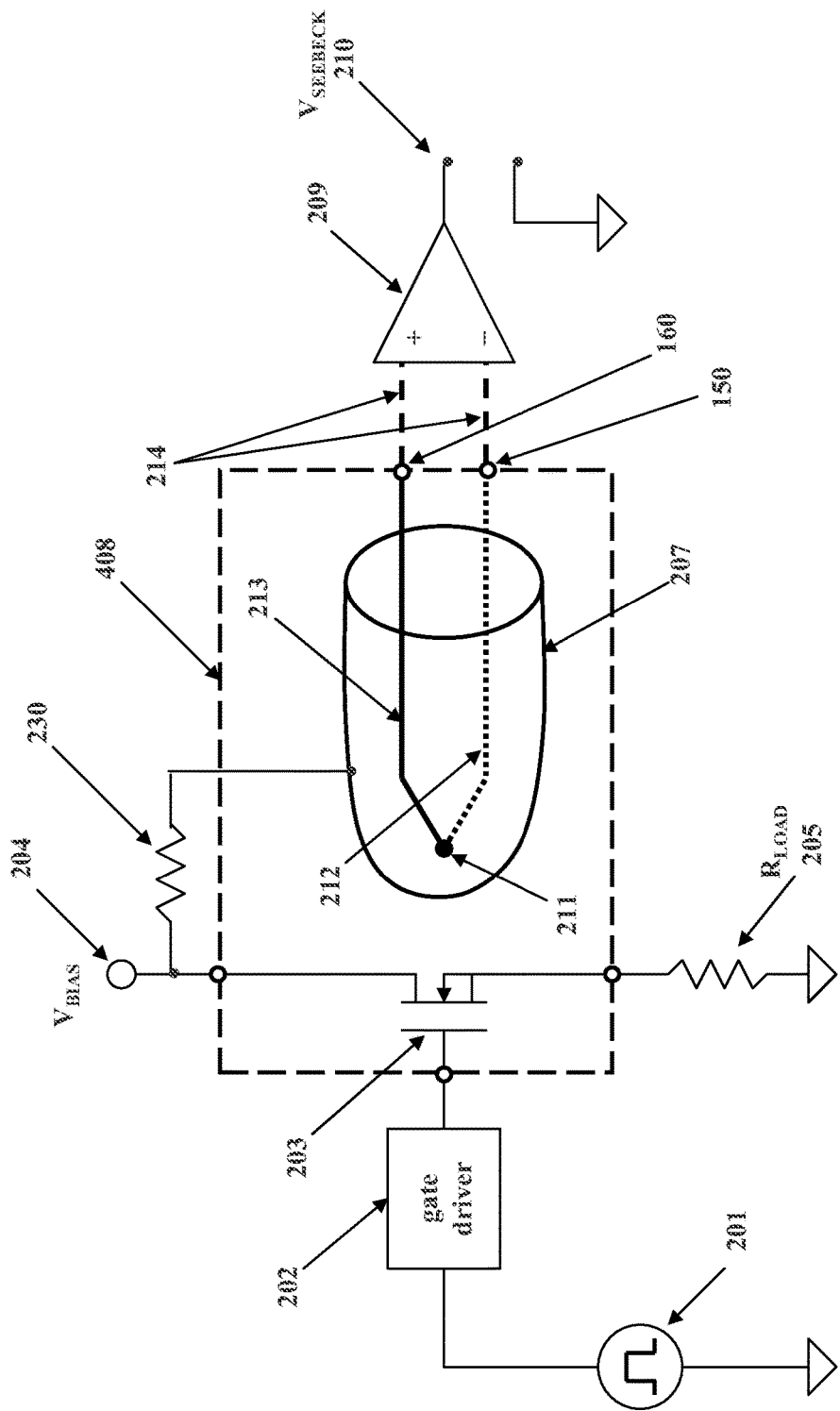

Turning now to FIG. 4, illustrated is a simplified schematic drawing of a shielded Seebeck temperature difference sensor 408 integrated with the power MOSFET 203. The power MOSFET 203 is in a high-side circuit configuration, and the shield 207 of the Seebeck temperature difference sensor 408 may be left floating, i.e., not connected to a local potential. The shield 207 may also be connected to a local potential through a high resistance, such as the resistor 230, to prevent accumulation of charge over time in the shield.

Figure 5:
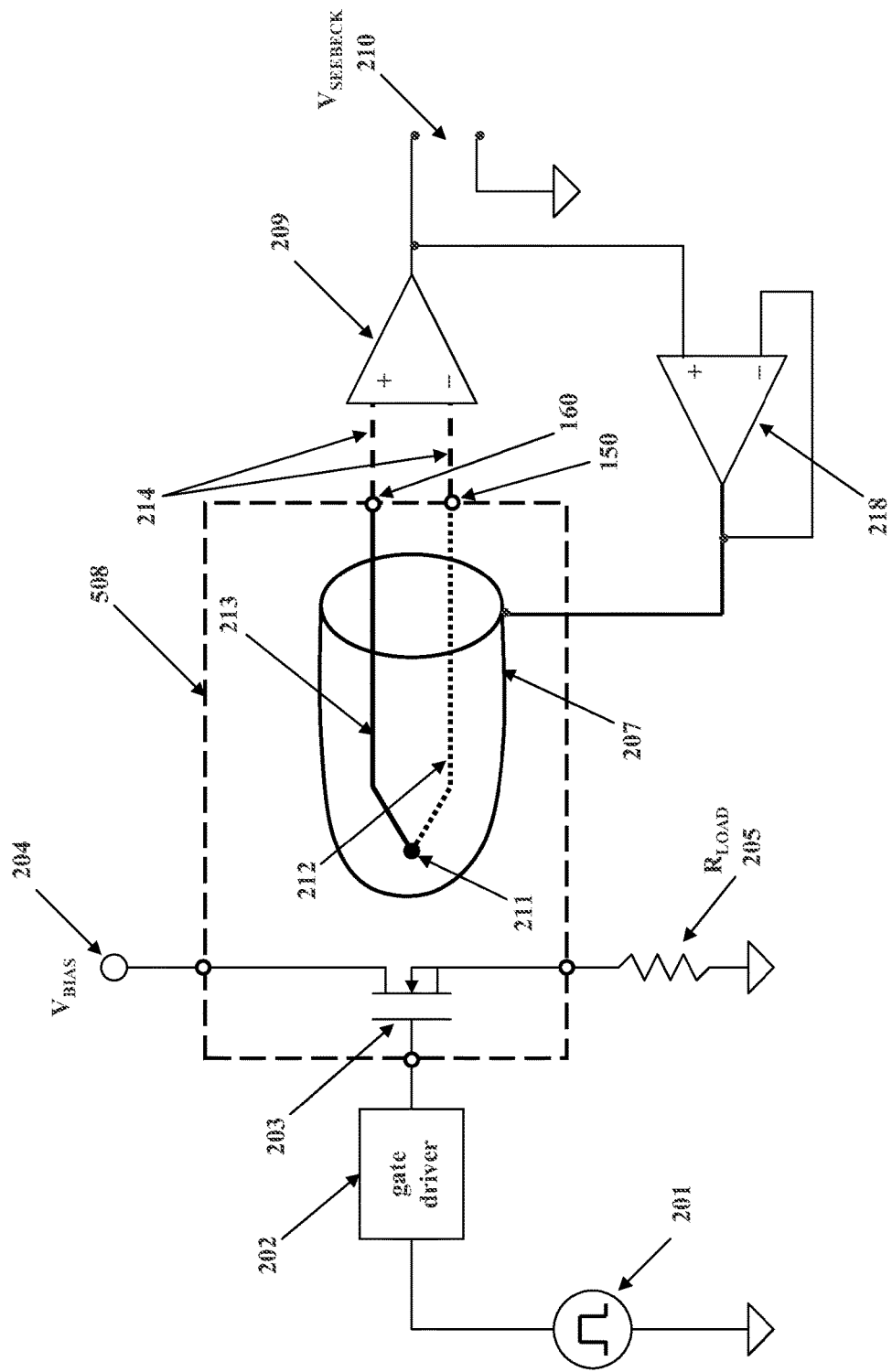

Turning now to FIG. 5, illustrated is a simplified schematic drawing of a shielded Seebeck temperature difference sensor 508 integrated with the power MOSFET 203. The power MOSFET is in a high-side circuit configuration, and the shield 207 of the shielded Seebeck temperature difference sensor 508 is used as a guard ring wherein the shield 207 is coupled to the same potential as the signal 210 of the shielded Seebeck temperature difference sensor. The coupling of the shield 207 to the Seebeck signal 210 is provided by a unity gain voltage follower formed with operational amplifier 218 with its output coupled to its inverting input terminal.

The shielded Seebeck temperature difference sensor in embodiments as described herein can be advantageously integrated with power semiconductor devices at low marginal or incremental costs because the same manufacturing processes can be used for fabrication of the shielded Seebeck temperature difference sensor and for the power semiconductor device. The shielding structure can, for example, be made from doped semiconductor layers, polysilicon traces, and/or metal layers. Because the Seebeck effect is several orders of magnitudes stronger in semiconductors than in metals, it is preferable to use at least one semiconductor material, e.g., n-doped silicon ("n-Si"), p-doped silicon ("p-Si"), n-doped polysilicon ("n-poly-Si") or p-doped polysilicon ("p-poly-Si"), for at least one conductive trace of the sensor.

A shielded Seebeck temperature difference sensor in embodiments as described herein for measuring a temperature difference can be formed in very compact structures and close to the active area of the power semiconductor device. Improved performance of a temperature sensor can be obtained with decreased distance to the active area of the power semiconductor device due to better thermal coupling between power semiconductor device and the hot temperature sensing point of the temperature sensor.

The signal value of a shielded Seebeck temperature difference sensor can be increased by coupling a plurality of Seebeck temperature difference sensors in a series circuit arrangement as illustrated and described with reference to FIG. 2B. A trade-off can be made between signal size and temperature sensor performance. For a small sensor with good thermal coupling, shielding nonetheless improves sensing the Seebeck signal against a noise background, even when employing a plurality of Seebeck sensors.

As illustrated in FIGS. 6A-23, embodiments of shielded Seebeck temperature difference sensors are formed employing ordinary processes used in a manufacturing process to produce an integrated circuit. These shielded sensors are well suited for advanced, smart-power IC (integrated circuit) technologies in which multiple metal and polysilicon layers with fine structure sizes are produced, e.g., 0.35 µm or even 0.13 µm or less.

FIGS. 6A-8 illustrate drawings of a shielded Seebeck temperature difference sensor formed of junctions of an n-Si (n-doped silicon) implant and a first metal layer, e.g., a first metal layer of aluminum or copper, constructed according to an embodiment. The shield may not be illustrated in particular drawings, particularly in the plan-view drawings. Materials of the traces 603 and 604 are the same metal, e.g., aluminum, copper, or tungsten. Using a plurality of junctions of n-Si and metal coupled in series, as illustrated in FIGS. 6B and 7B, a proportionately higher Seebeck voltage $V_{SEEBECK}$ can be obtained compared to a single-junction sensor. However, a larger number of Seebeck junctions increases the size of the sensor and reduces the thermal coupling between the sensor and the hot region of the integrated circuit. The doping concentration of the n-Si implant affects the Seebeck temperature coefficient α ($\alpha = V_{SEEBECK/\Delta T}$), which decreases with increasing doping concentration, and the sensor resistance, which decreases with increasing doping concentration. Thus, a trade-off between a maximum Seebeck temperature coefficient, a minimum sensor resistance, the Seebeck voltage produced, and the thermal coupling between the sensor and the hot region of the integrated circuit can be made for a particular application.

FIG. 6A illustrates a plan-view drawing of the shielded Seebeck temperature difference sensor formed with two Seebeck junctions connected in a series circuit arrangement, such as the hot temperature-sensing Seebeck contact/junction 601 located along the hot temperature-sensing axis A-A, and the cold temperature-sensing the Seebeck contact/junction 605 located along the cold temperature-sensing axis C-C. As indicated previously hereinabove, a contact may be formed for example, and without limitation, of aluminum, copper, tungsten, or highly doped polysilicon. The sensor is coupled to an external circuit with metal traces 604 that may be formed, without limitation, as an aluminum or copper deposit. The Seebeck contact/junction trace 602 is formed of n-doped semiconductor material, and the Seebeck contact/junction trace 603 is formed of the metal. Each of these traces may be deposited in an ordinary integrated circuit manufacturing process.

Figure 6B:
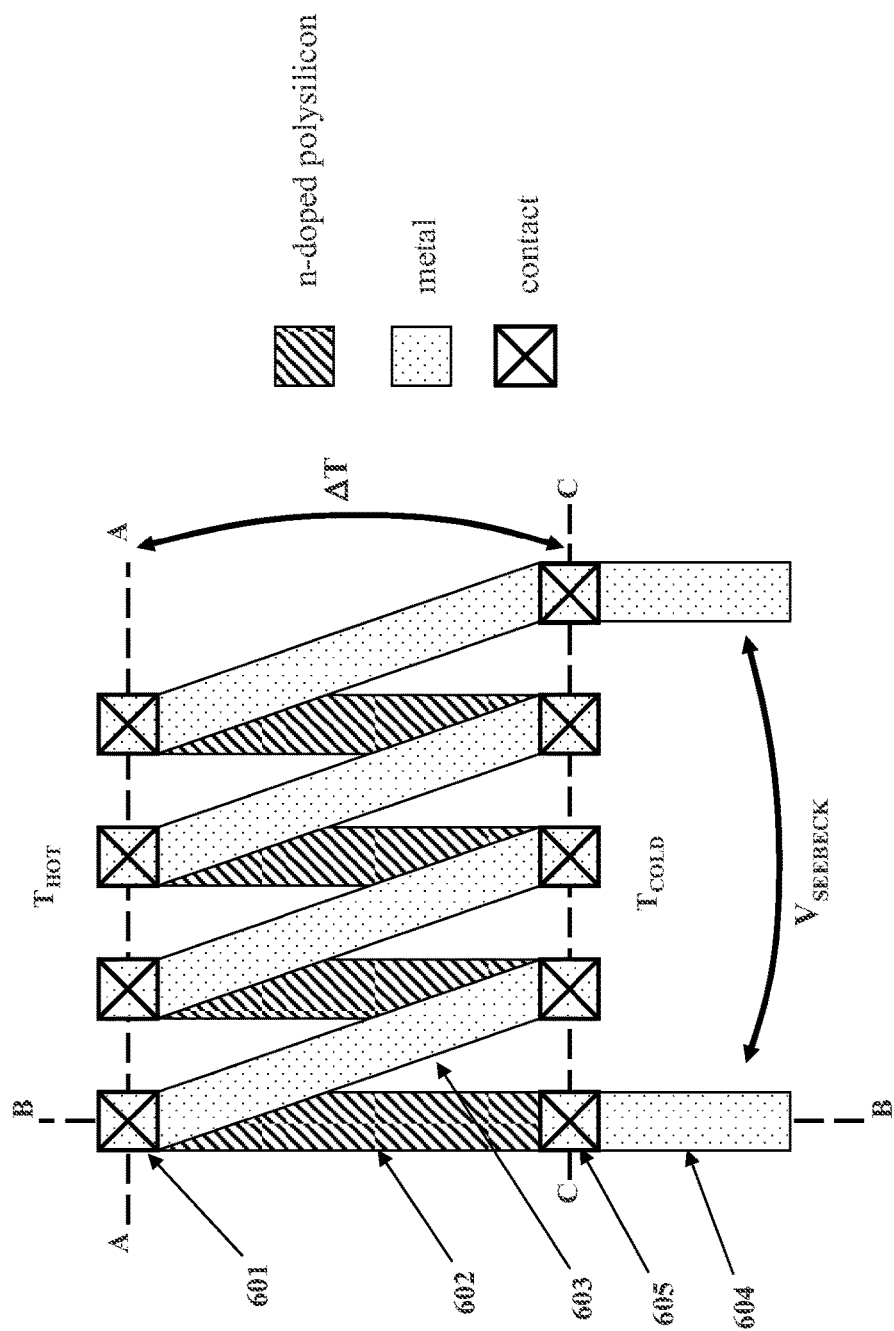
FIGS. 6A through 23 illustrate plan-view and cross-sectional drawings of embodiments of shielded Seebeck temperature difference sensors, each constructed according to an embodiment.

FIG. 6B illustrates a plan-view drawing of a shielded Seebeck temperature difference sensor formed with eight Seebeck contacts/junctions of dissimilar electrically conductive materials connected in a series circuit arrangement. The shielded Seebeck temperature difference sensor illustrated in FIG. 6B is constructed of materials similar to those employed in FIG. 6A.

Figure 7A:
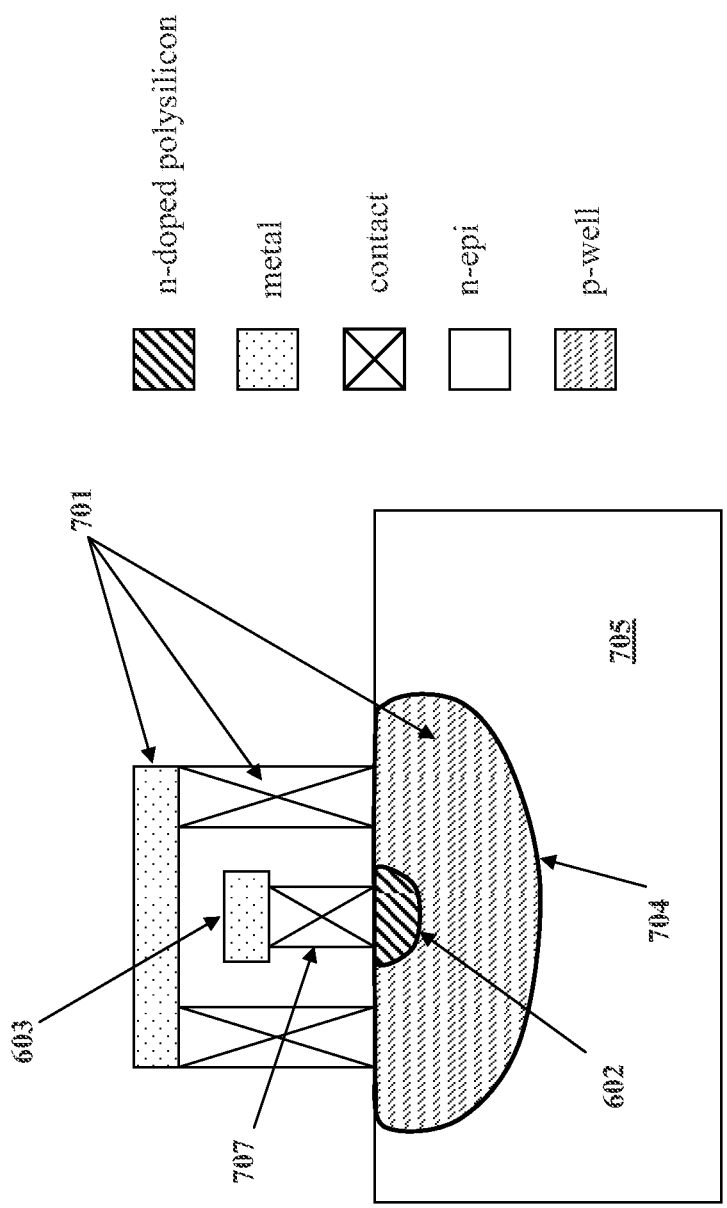
Figure 7B:
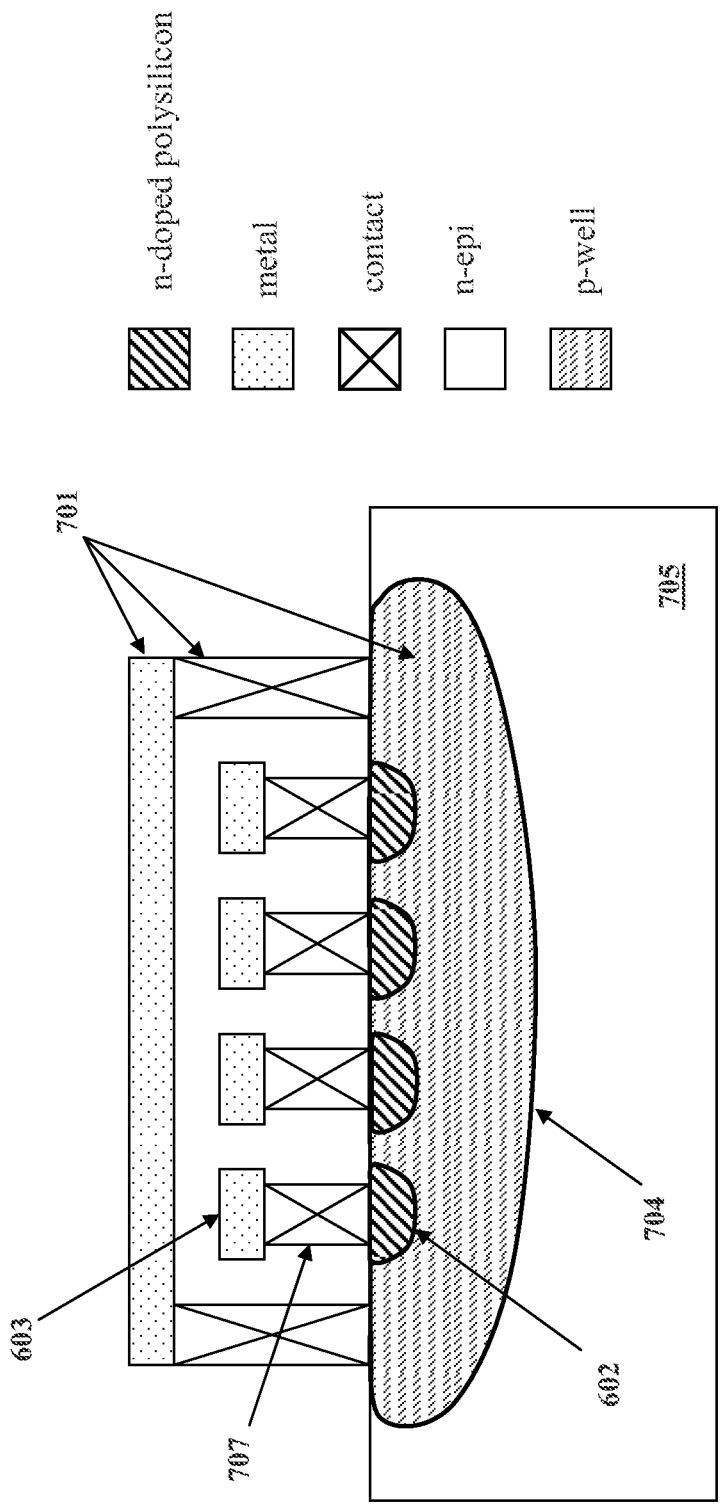
Figure 8:
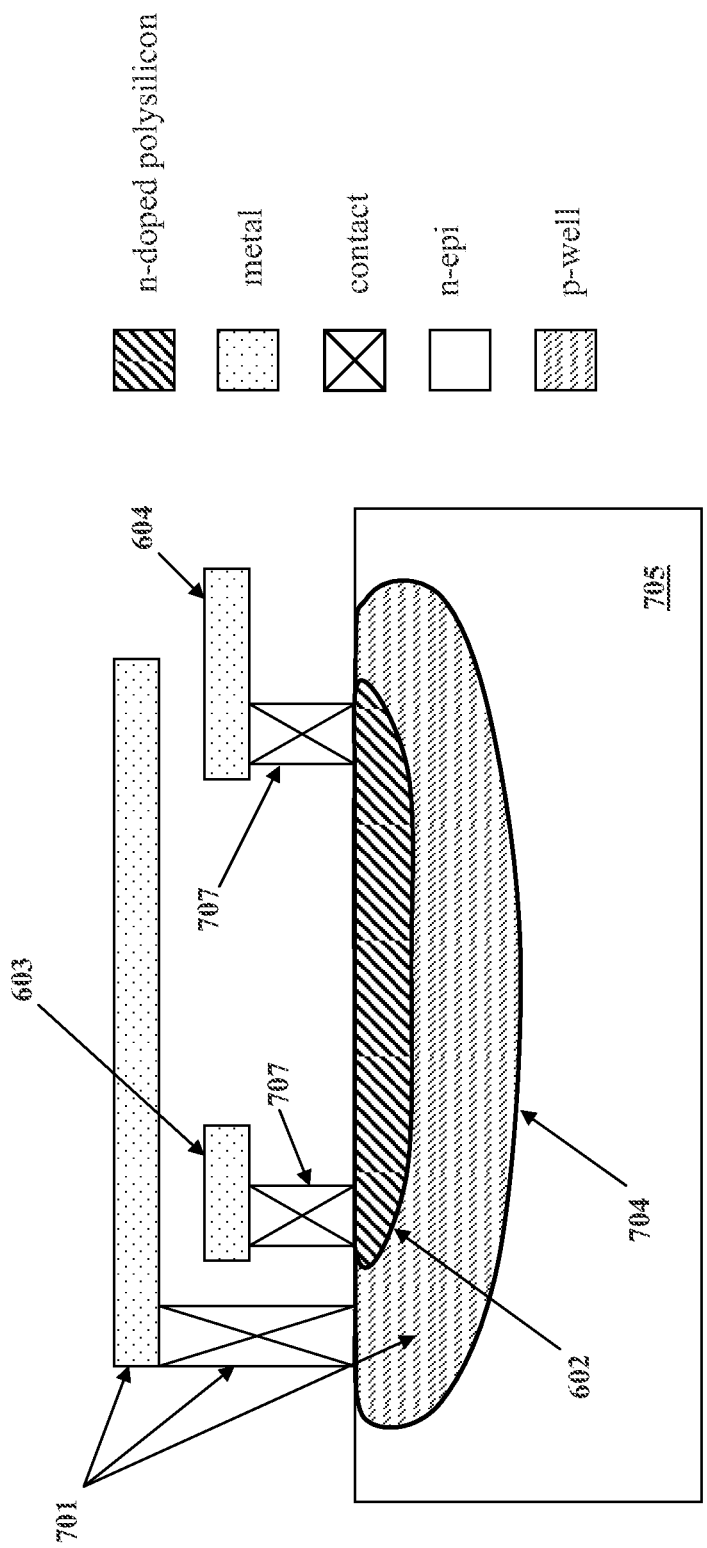

FIGS. 7A and 7B illustrate, respectively, cross-sectional drawings of the shielded Seebeck temperature difference sensors illustrated in FIGS. 6A and 6B along the axis A-A. FIG. 8 illustrates a cross-sectional drawing of the sensors illustrated in FIGS. 6A and 6B along the axis B-B. As illustrated in FIGS. 7 and 8, the sensor is formed on an n-doped, epitaxially deposited layer 705 of a silicon substrate. A p-well 704 is deposited in the epitaxially deposited layer 705. Contacts, such as contact 707, couple the upper sensor traces, such as metal trace 603, with the lower sensor traces, such as n-doped trace 602. Contacts may be formed as implants in a deposited layer such as an epitaxially deposited semiconductor layer. A metallic layer is deposited and patterned over the sensor to form the shield 701. In an alternative embodiment, a doped polysilicon layer can be deposited and patterned over the sensor to form the shield 701. The shield 701 is formed by the p-well 704 with the second metal layer deposited as the upper layer of the shield 701. Metal trace 604 provides a contact to a circuit external to the sensor itself.

Turning now to FIGS. 9A-11, illustrated are drawings of a shielded Seebeck temperature difference sensor formed of junctions of traces 902 of n-Si (n-doped silicon) and traces 903 of p-doped polysilicon, constructed according to an embodiment. The embodiments of the shielded Seebeck temperature difference sensors illustrated in FIGS. 9A-11 are similar to the embodiment described hereinabove with reference to FIGS. 6A-8, except that other materials are used to form the junctions of the sensors. Using p-doped polysilicon instead of the first metal layer as in the embodiment illustrated in FIGS. 6A-8 enables the Seebeck voltage of the sensor to be the sum of the Seebeck voltage of the n-Si implant and the Seebeck voltage of the p-doped polysilicon. This is due to the different signs of the Seebeck voltage in n-Si and p-doped polysilicon.

Figure 9A:
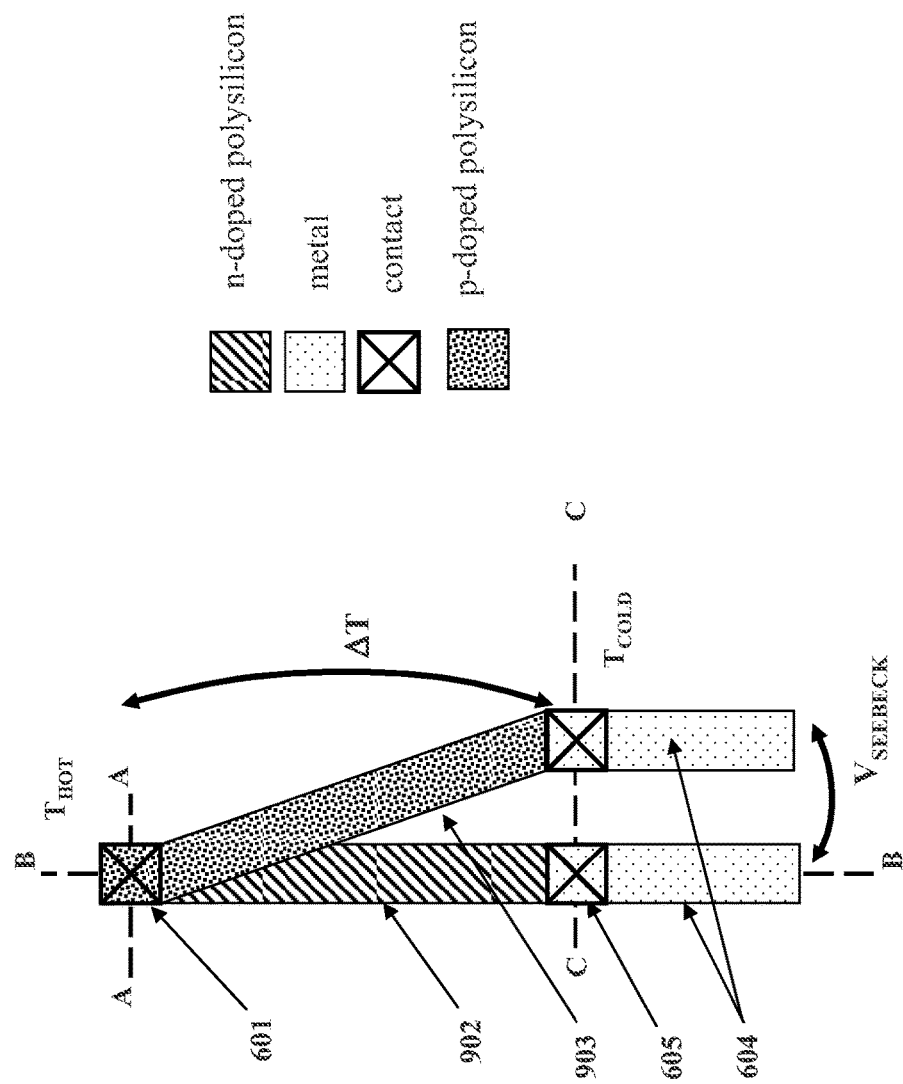

FIG. 9A illustrates a plan-view drawing of the shielded Seebeck temperature difference sensor formed with Seebeck junctions connected in a series circuit arrangement, such as the hot temperature-sensing Seebeck contact 601 located along the hot temperature-sensing axis A-A, and the cold temperature-sensing the Seebeck contact 605 disposed along the cold temperature-sensing axis C-C. The sensor is coupled to an external circuit with metal traces 604 that may be formed, without limitation, as an aluminum or copper deposit. The Seebeck junction trace 902 is formed of an n-doped semiconductor material, and the Seebeck junction trace 903 is formed of p-doped polysilicon. Each of these traces may be deposited in an ordinary integrated circuit manufacturing process.

Figure 9B:
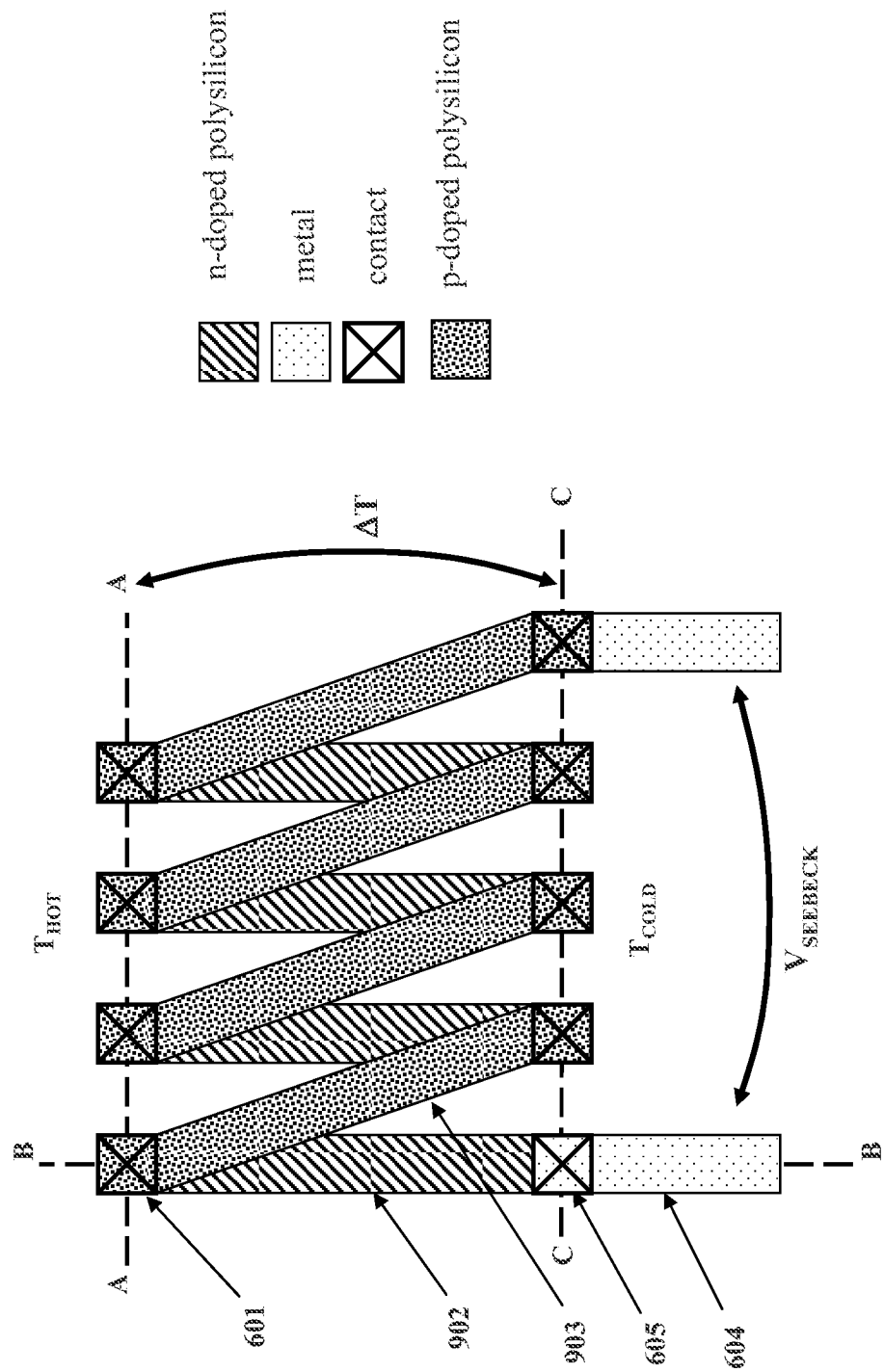

FIG. 9B illustrates a plan-view drawing of a shielded Seebeck temperature difference sensor formed with a plurality of Seebeck junctions connected in a series circuit arrangement. The temperature sensor illustrated in FIG. 9B is constructed of materials similar to those employed in FIG. 9A.

Figure 10:
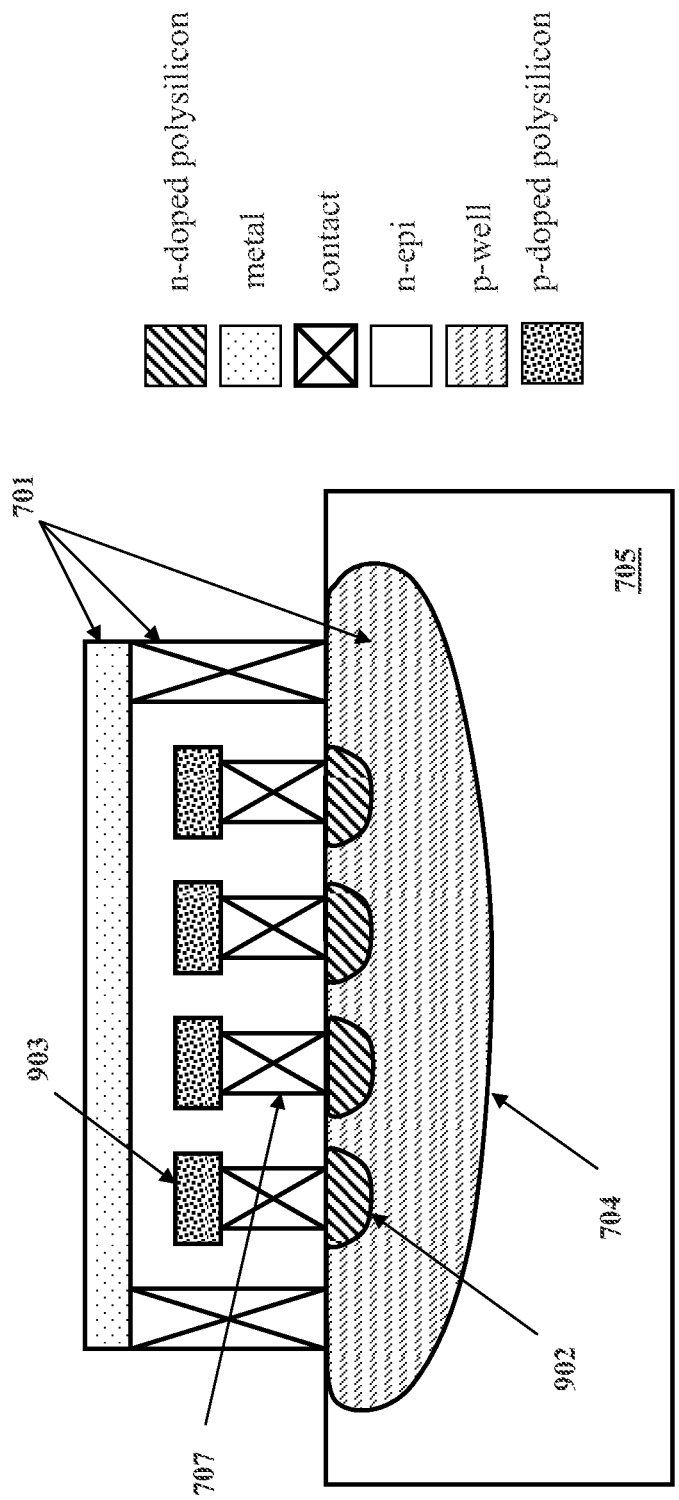
Figure 11:
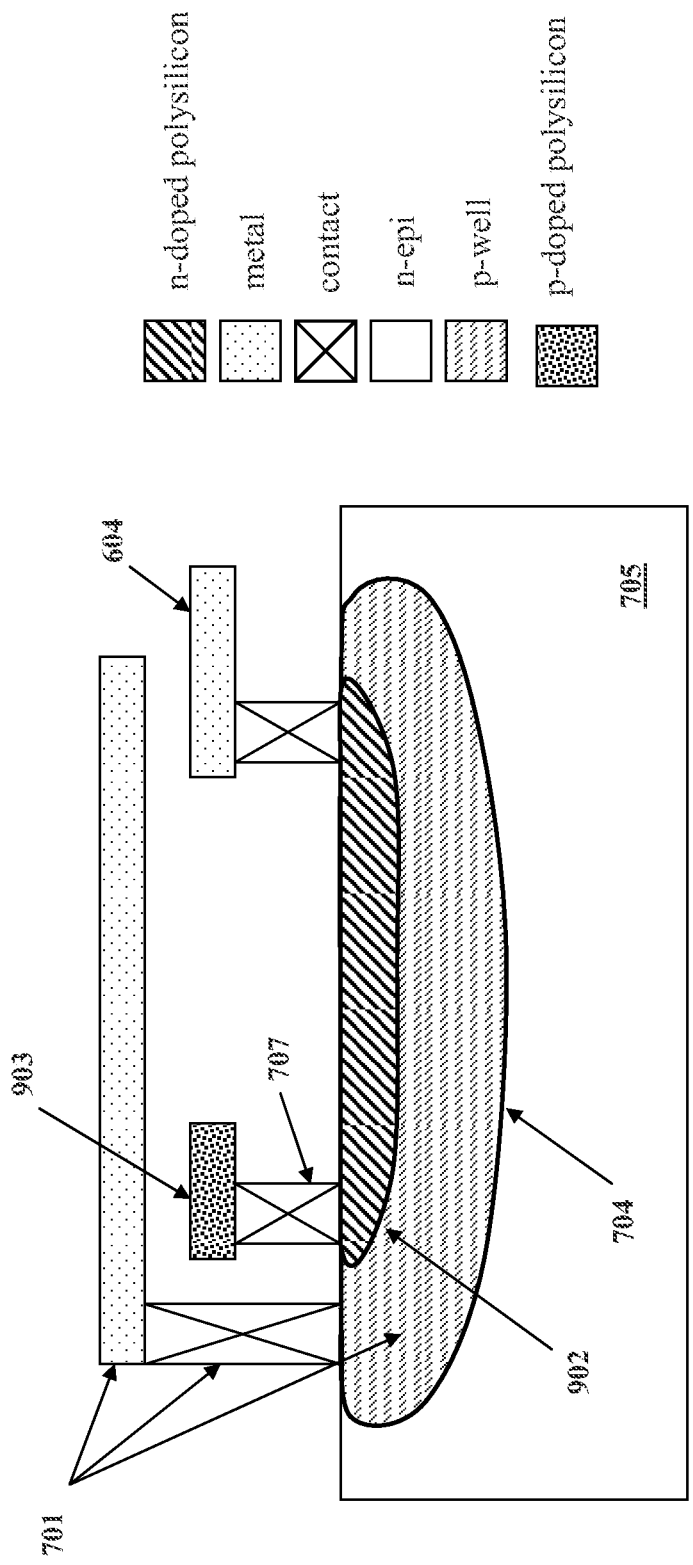

FIGS. 10 and 11 illustrate, respectively, cross-sectional drawings of the shielded Seebeck temperature difference sensors illustrated in FIGS. 9A and 9B along the axes A-A and B-B, respectively. As illustrated in FIGS. 10 and 11, the sensor is formed on an n-doped, epitaxially deposited layer 705 of a silicon substrate. A p-well 704 is deposited in the epitaxially deposited layer 705. Contacts, such as contact 707, couple the p-doped polysilicon traces, such as trace 903, with the n-doped traces, such as trace 902. A metallic layer is deposited over the sensor to form the shield 701. The shield 701 is formed by the p-well 704 with the second metal layer deposited as the upper layer of the shield 701. Metal trace 604 provides a contact to a circuit external to the sensor.

Figure 12:
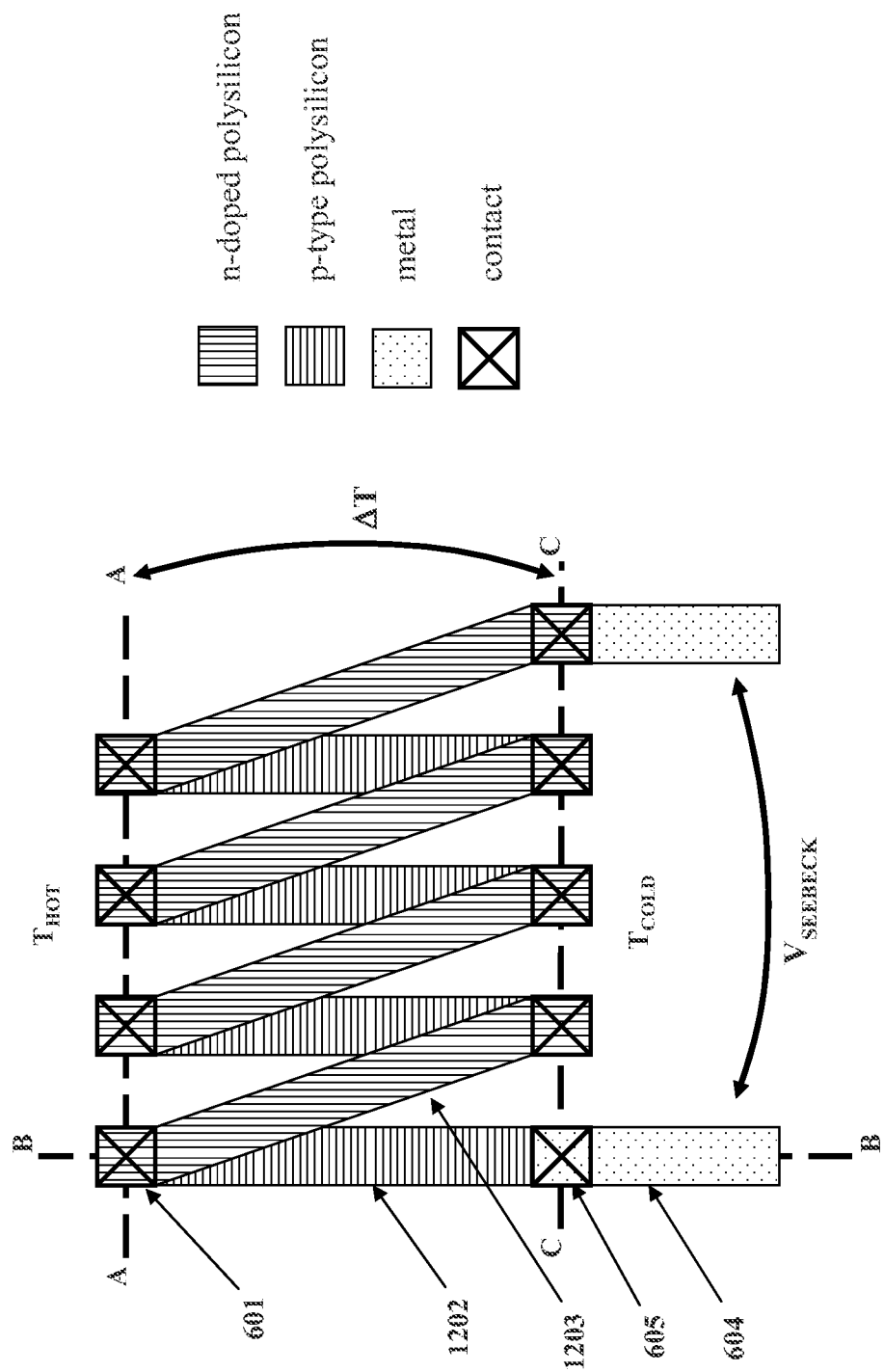
Figure 13:
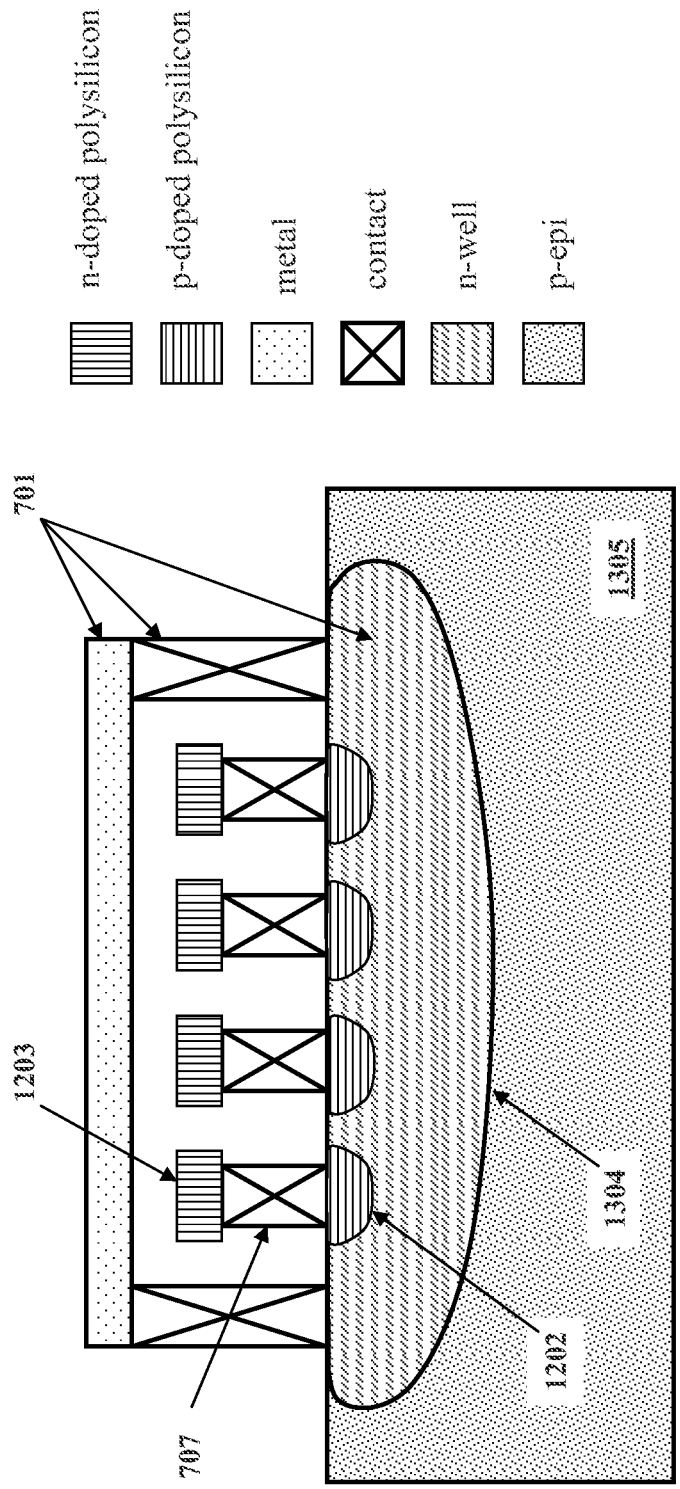
Figure 14:
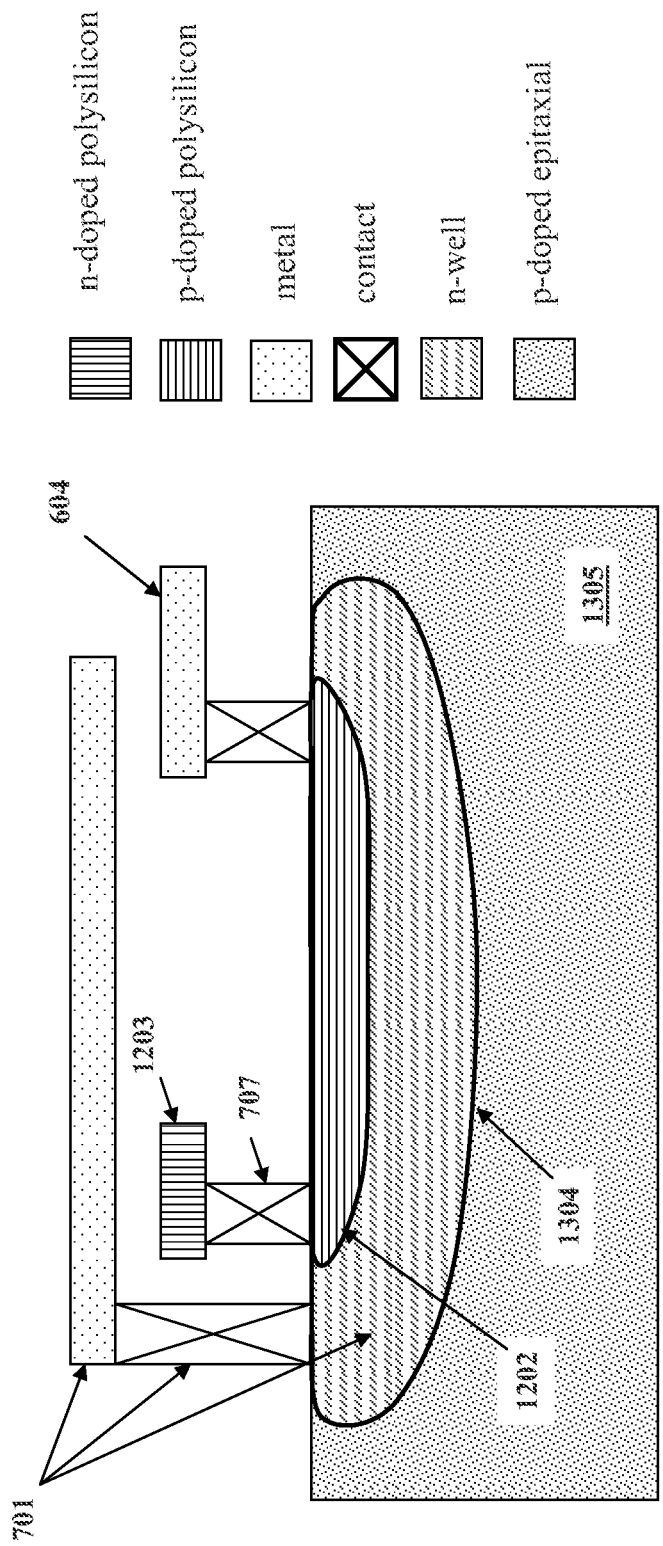

Turning now to FIGS. 12-14, illustrated are drawings of a shielded Seebeck temperature difference sensor formed of junctions of traces, such as trace 1202, of p-doped silicon, and traces, such as trace 1203, of n-doped polysilicon, constructed according to an embodiment. The embodiments of the shielded Seebeck temperature difference sensors illustrated in FIGS. 12-14 are similar to the embodiment described hereinabove with reference to FIGS. 6A-8, except that other materials are used to form the sensor junctions. Using n-doped polysilicon instead of the first metal layer as in the embodiment illustrated in FIGS. 6A-8 enables the Seebeck voltage of the sensor to be the sum of the Seebeck voltage of the n-doped polysilicon and the Seebeck voltage of the p-doped silicon. Contacts, such as contact 707, couple the p-doped silicon traces, such as trace 1202, with the n-doped polysilicon traces, such as trace 1203. The lower layer of the shield 701 is formed in this exemplary sensor by an n-doped well 1304 located in a p-doped epitaxial layer 1305.

Figure 15:
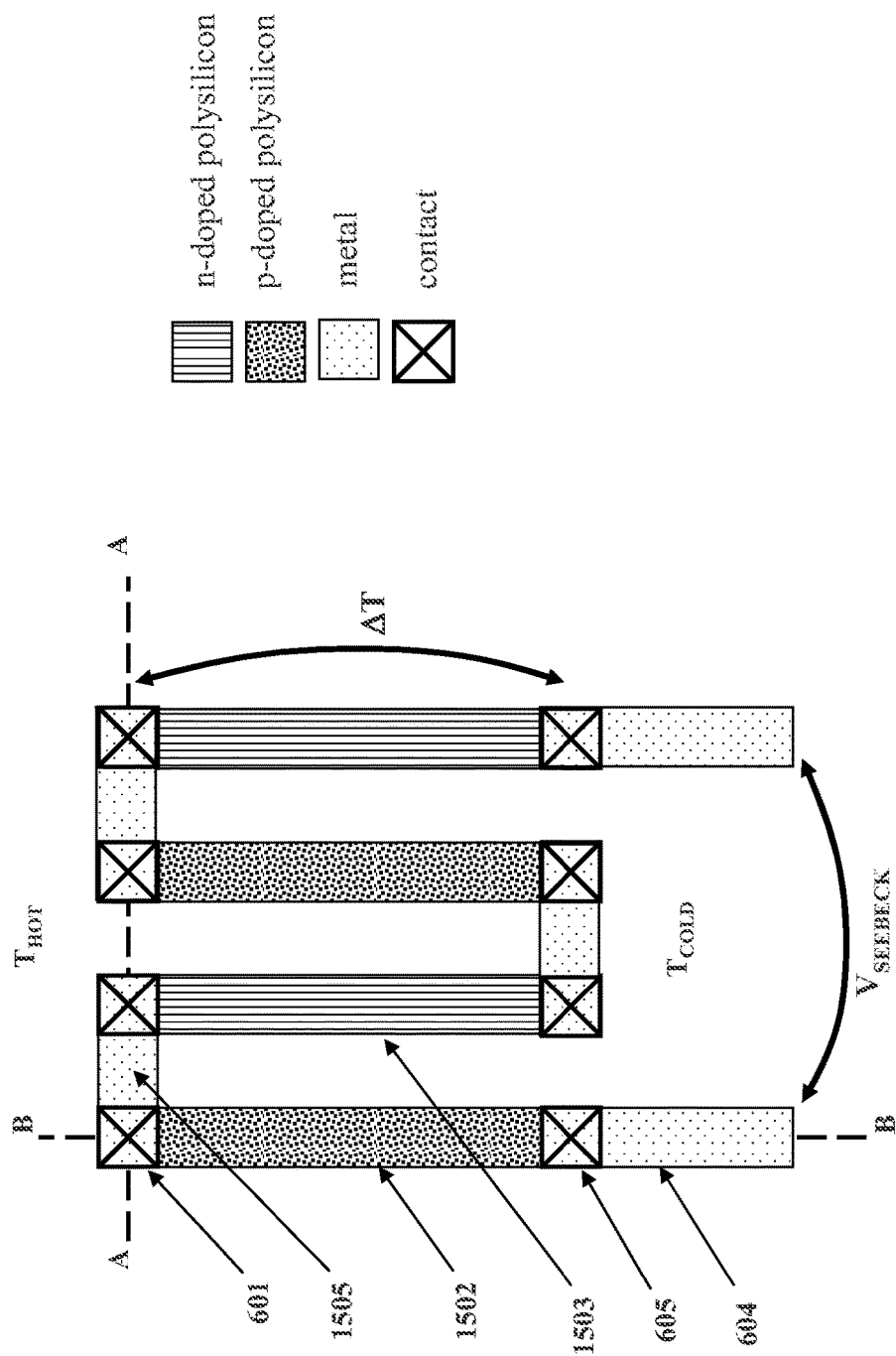
Figure 16:
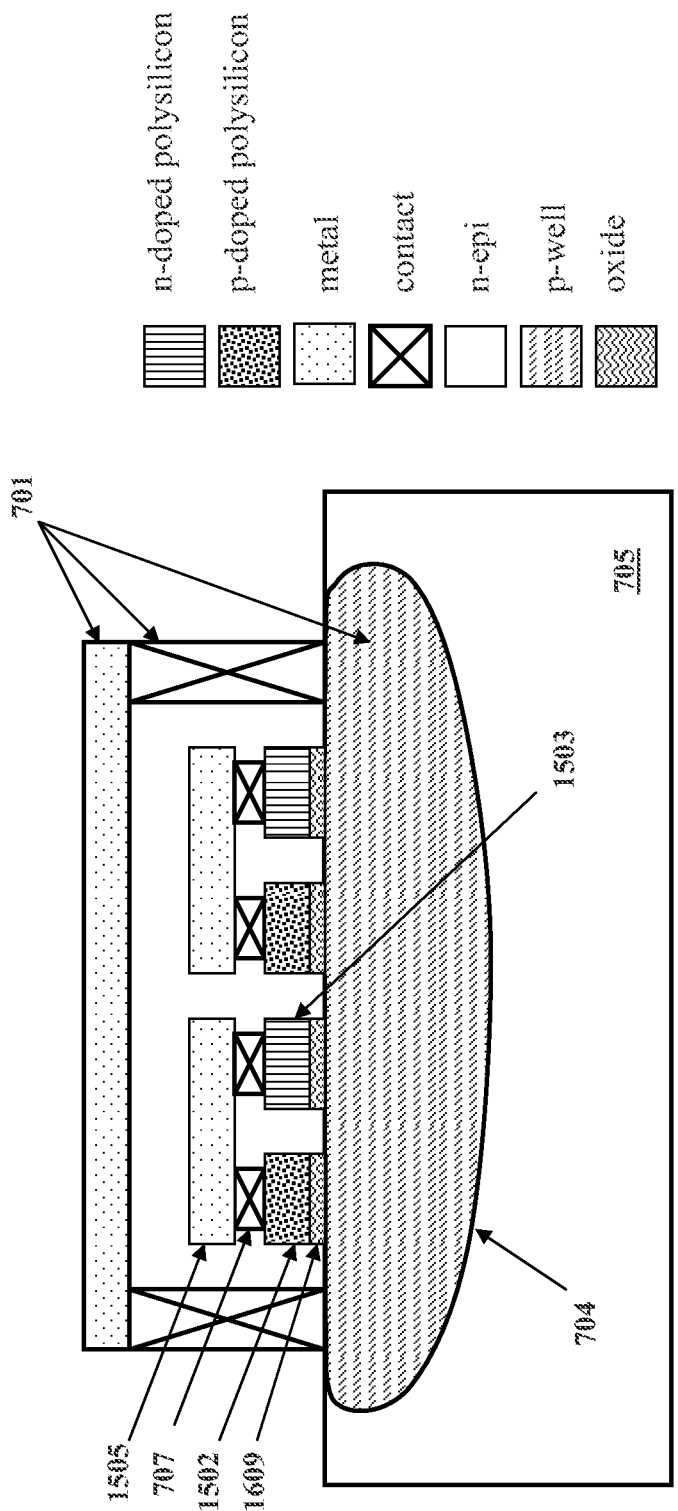
Figure 17:
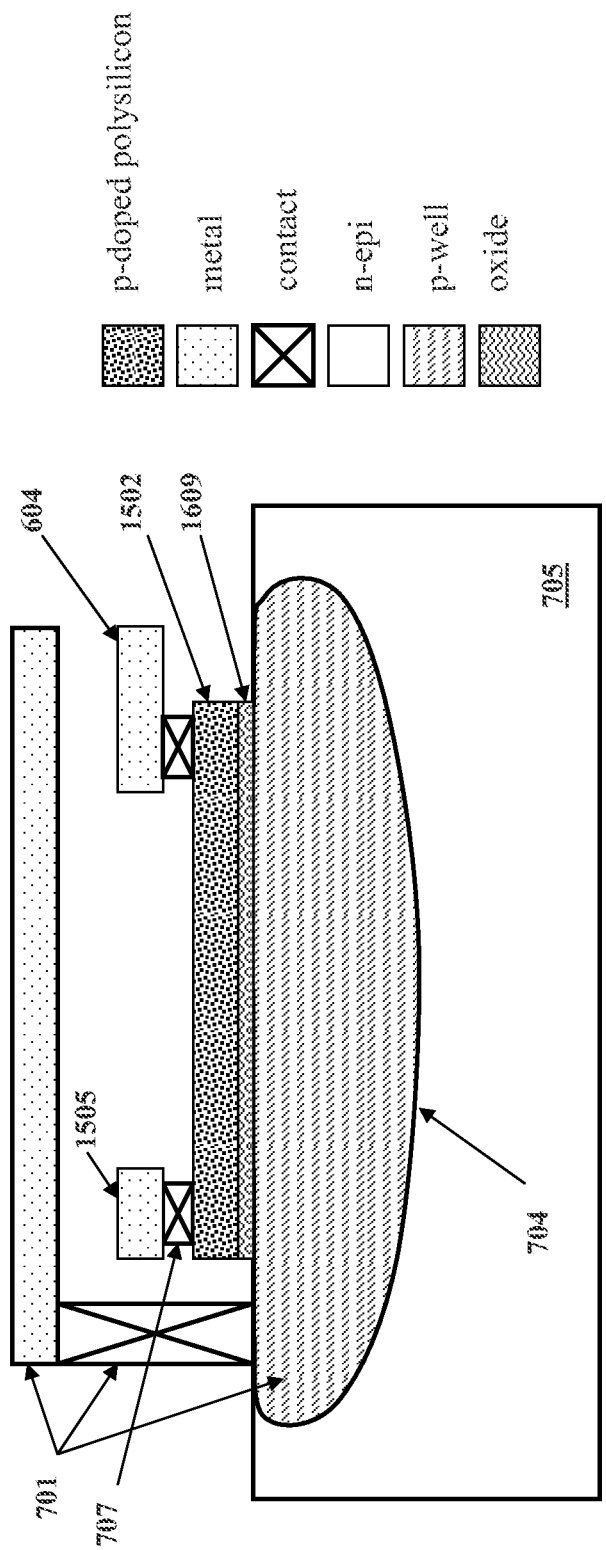

Turning now to FIGS. 15-17, illustrated are drawings of a Seebeck temperature difference sensor formed of junctions of traces, such as trace 1502, of p-doped polysilicon, and traces, such as trace 1503, of n-doped polysilicon, constructed according to an embodiment. The embodiments of the shielded Seebeck temperature difference sensors illustrated in FIGS. 15-17 are similar to the embodiment described hereinabove with reference to FIGS. 6A-8, except that an insulating layer for the sensor is formed by depositing and patterning an oxide layer 1609 over the p-well 704 as illustrated in FIGS. 16 and 17. P-doped polysilicon forms one set of sensor traces, such as sensor trace 1502, and n-doped polysilicon forms the other set of sensor traces, such as sensor trace 1503. These sensor traces of dissimilar materials are joined by contacts, such as contact 707, and metallic couplings, such as metal coupling 1505. A p-doped silicon implant forms the p-well 704. Shielding for the Seebeck temperature difference sensor is formed by the p-well and the metal_2 layer. The p-well is formed, without limitation, in an n-doped silicon substrate. The lower layer of the shield 701 is formed by the implanted p-doped well 704. In an embodiment, traces of opposite doping types may be doped at substantially the same doping levels, or the traces may be substantially differently doped.

Figure 18:
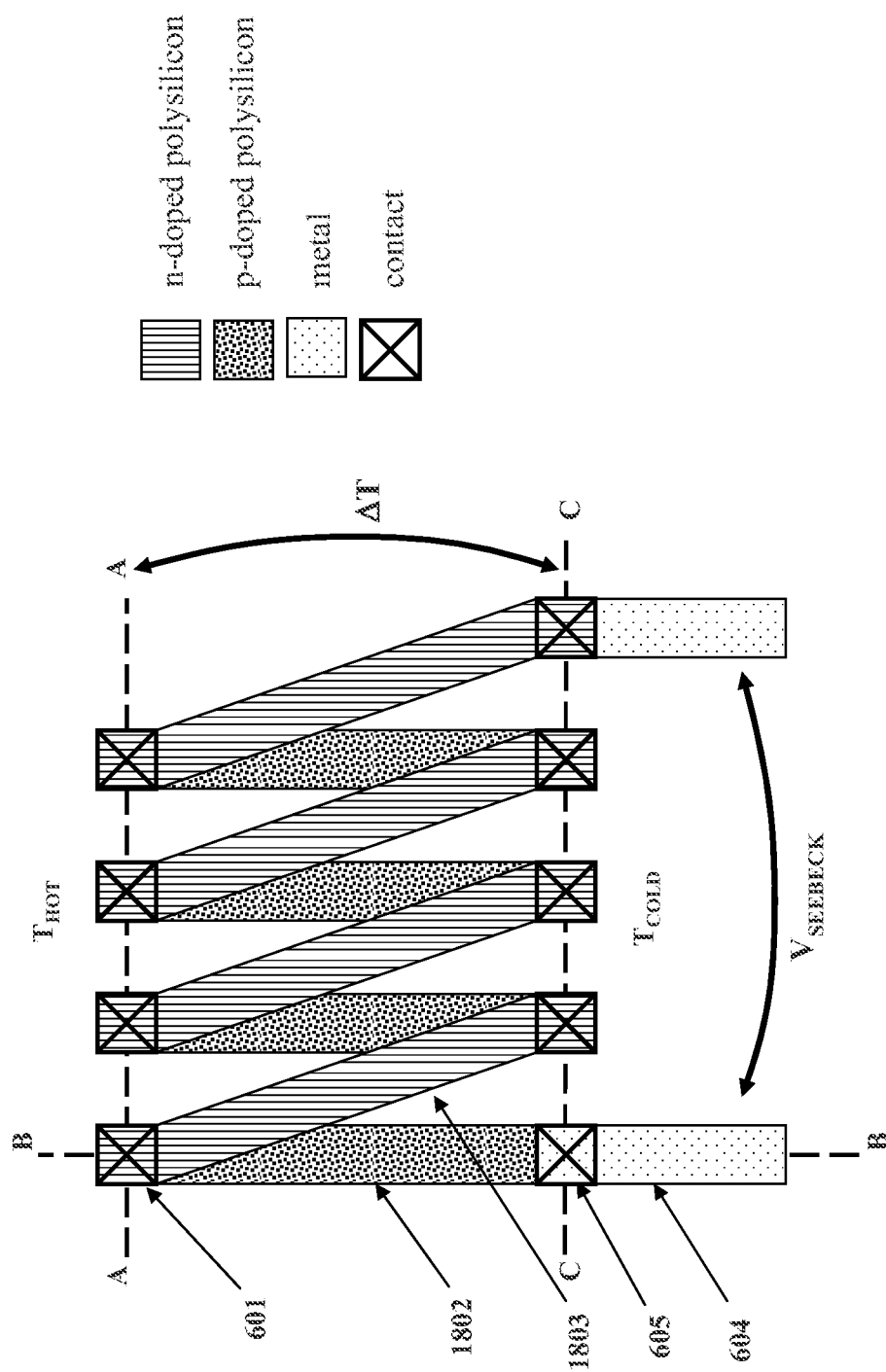
Figure 19:
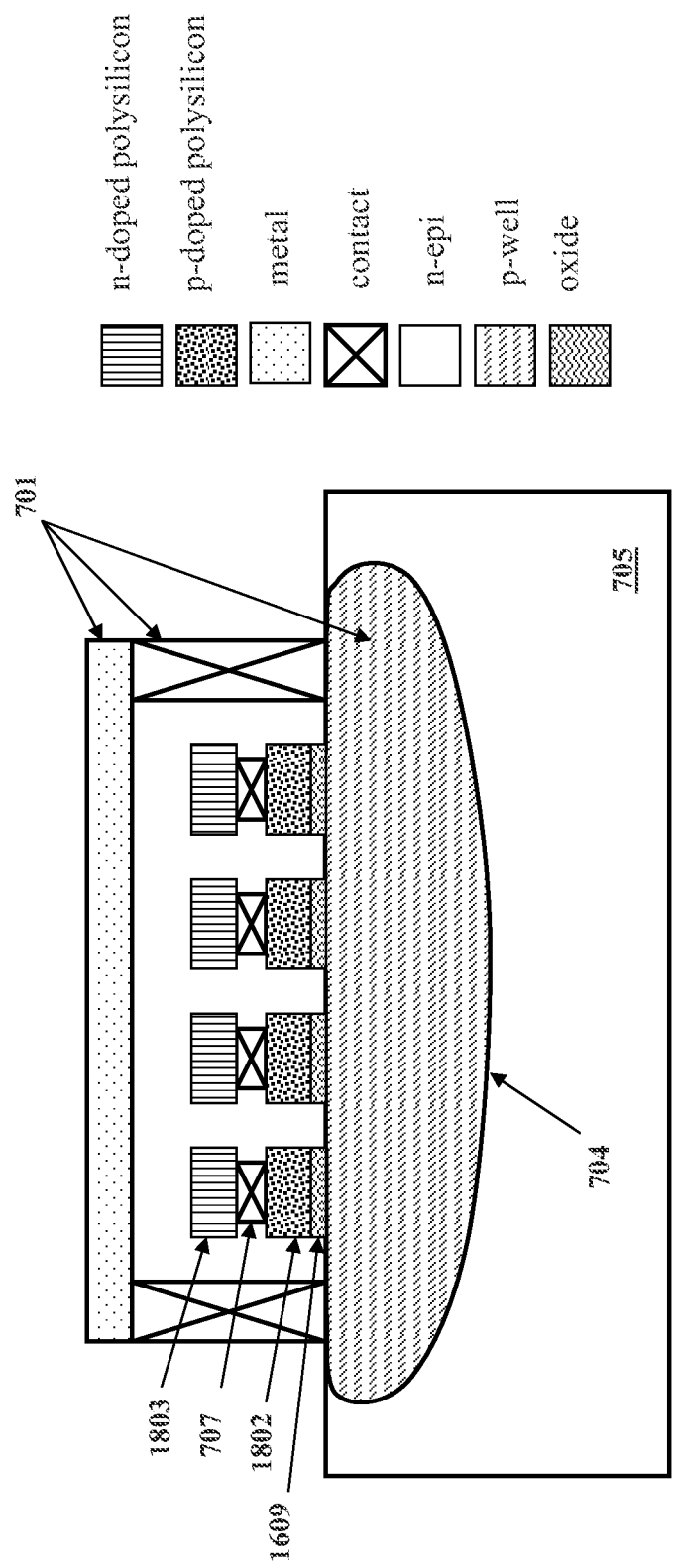
Figure 20:
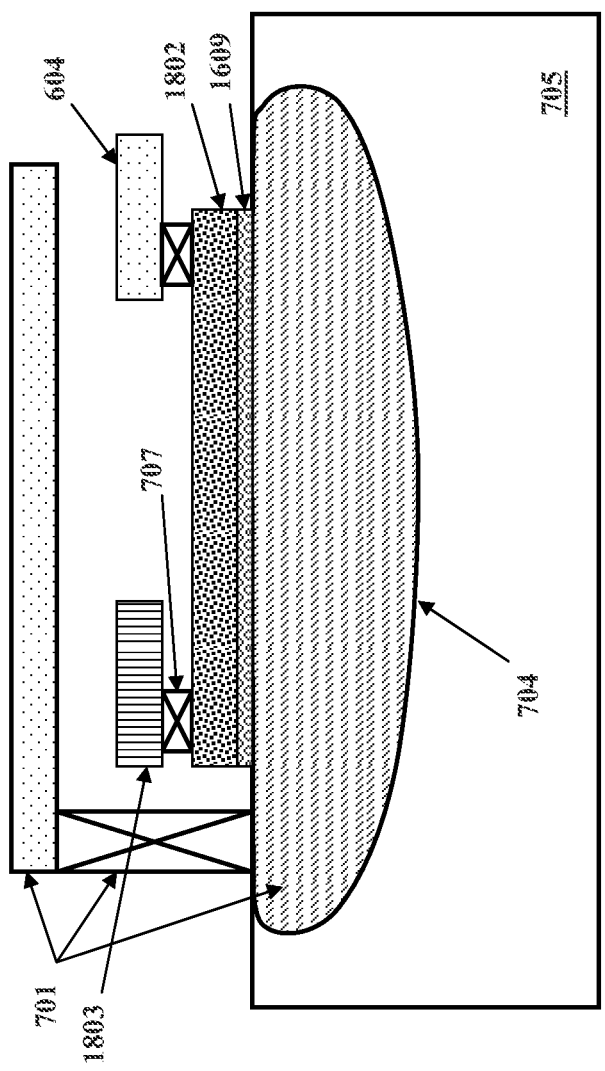

Turning now to FIGS. 18-20, illustrated are drawings of a shielded Seebeck temperature difference sensor formed of junctions of traces, such as trace 1802, of p-doped polysilicon, and traces, such as trace 1803, of n-doped polysilicon, constructed according to an embodiment. As illustrated in FIGS. 19 and 20, an insulating layer for the sensor is formed by depositing and patterning an oxide layer 1609 over the p-well 704. P-doped polysilicon forms one set of sensor traces, such as sensor trace 1802, and n-doped polysilicon forms the other set of sensor traces, such as sensor trace 1803. These sensor traces of dissimilar materials are joined by contacts, such as contact 601. A p-doped silicon implant forms the p-well 704. The shielding for the sensor is formed by the p-well and the second metal layer. The p-well is formed, without limitation, in an n-doped silicon substrate. The lower layer of the shield 701 is formed by the implanted p-doped well 704.

In FIGS. 15-17, the n-doped polysilicon and the p-doped polysilicon are formed on the same plane, whereas in FIGS. 18-20, the n-doped polysilicon and the p-doped polysilicon lie on top of each other.

Figure 21:
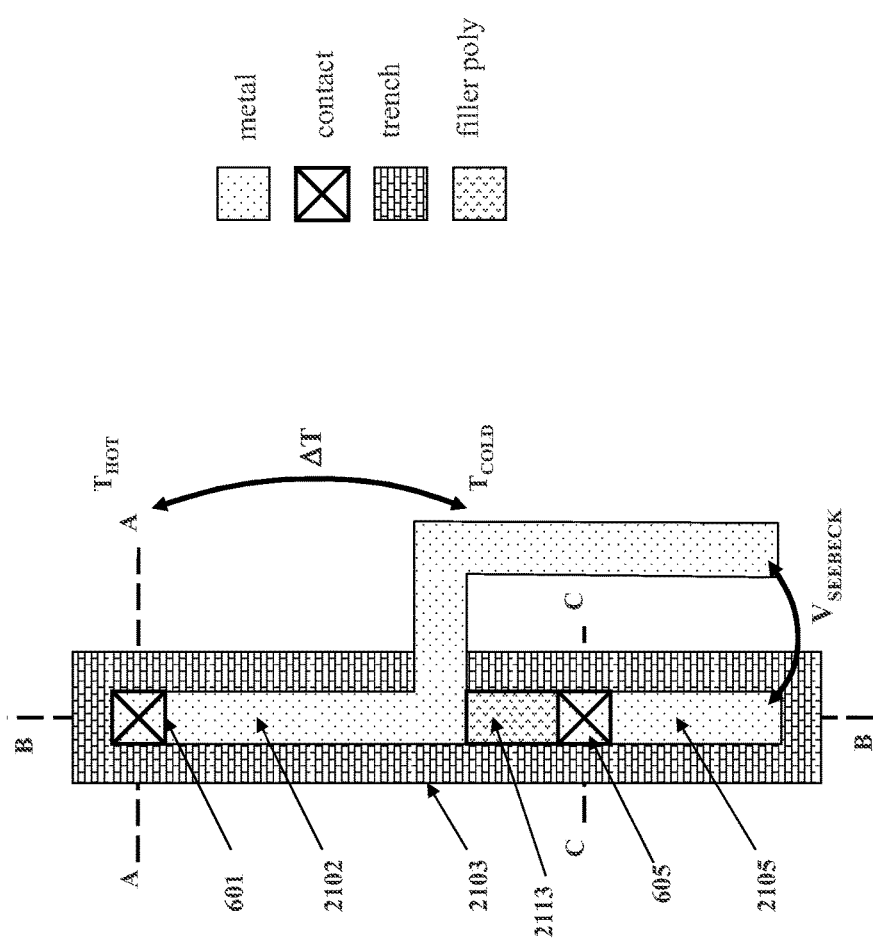
Figure 22:
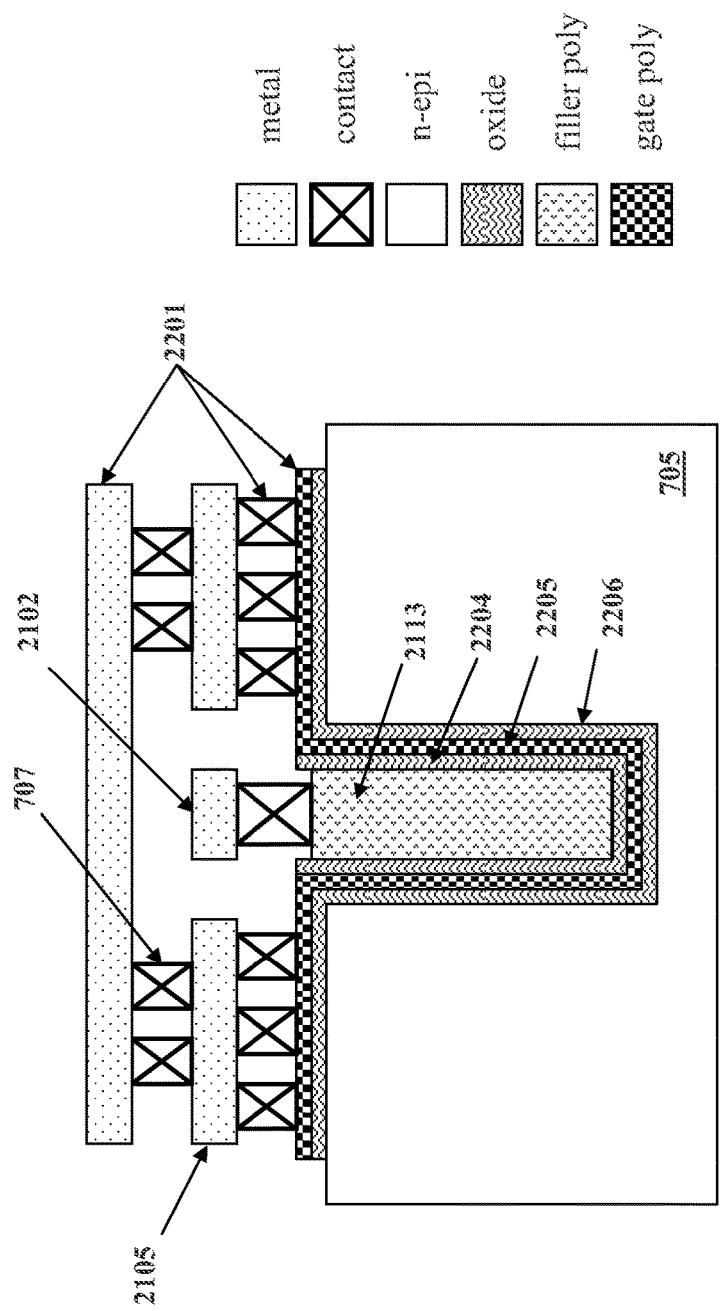
Figure 23:
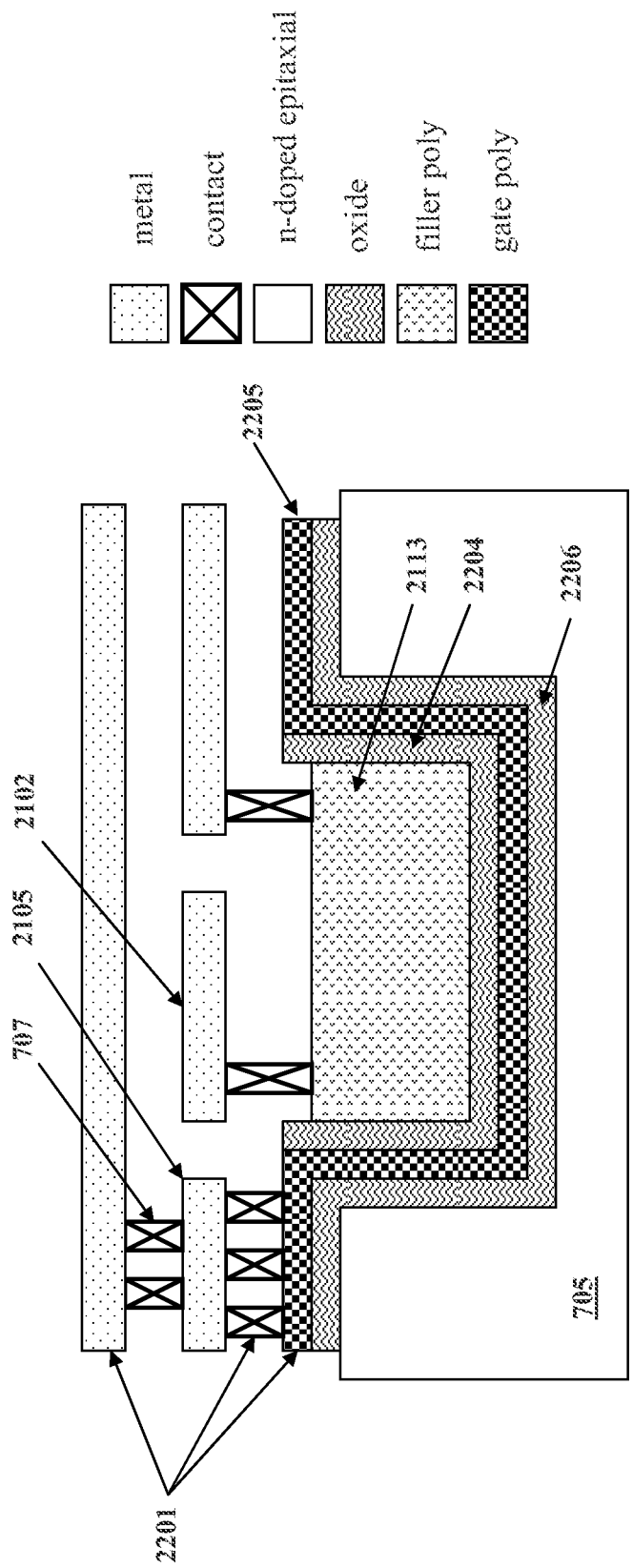

Turning now to FIGS. 21-23, illustrated are embodiments wherein the shielded Seebeck temperature difference sensor is implemented in a low complexity trench power MOSFET technology with two metal layers and two different polysilicon materials (e.g., gate polysilicon and filler polysilicon). The embodiments illustrated in FIGS. 21-23 are best suited for low-complexity technologies which include a trench process, e.g., for a trench power MOSFET.

A trench 2103 in the silicon substrate 705 is formed as a customary manufacturing process in producing the power MOSFET whose temperature will be sensed. The Seebeck temperature difference sensor is formed by the filler polysilicon of the trench process and the first metal layer. The shield for the sensor is formed by the gate polysilicon of the trench process and the second metal layer. As illustrated in FIGS. 21-23, the shielded Seebeck temperature difference sensor is formed by depositing a dielectric isolation oxide layer 2206 in the trench to form an insulating layer for the sensor. The lower layer of the shielding structure is formed by gate polysilicon 2205 deposited over the dielectric isolation oxide layer 2206. A dielectric isolation oxide layer 2204 is then deposited over the gate polysilicon 2205 to form a further insulating layer for the sensor. Filler polysilicon 2113 is deposited over the dielectric isolation oxide layer 2204 to fill the trench and to form a Seebeck sensor trace. The external metal leads of the temperature sensor are 2102 and 2105.

Thus, as introduced herein, a shielded Seebeck temperature difference sensor includes n- and p-type polysilicon traces and an ohmic contact formed therebetween, i.e., a temperature-sensing location. A shielded Seebeck temperature difference sensor may include a doped polysilicon trace and a metal trace and an ohmic contact formed therebetween in a temperature-sensing location. In an embodiment, the sensor is formed in a trench in a semiconductor chip. In an embodiment, the sensor is substantially enclosed in an electrostatic shield in a field of power MOSFET trench cells. Ideally, the general arrangement of a uniform strip of power MOSFET trench cells is not disturbed by the addition of the Seebeck temperature difference sensor.

Directly embedding a Seebeck temperature difference sensor into a field of power MOSFET cells enables detection of a local heat source in the die with a fast time response because the distance from the temperature-sensing point of contact of the polysilicon traces to the heat source may only be just a few microns.

The sensor may not include an active transistor, and the sensor trace contacts may be located at the die edge. The sensor traces may be coupled to die termination pads at the periphery of the die.

Such a structure enabling close separation between the temperature-sensing point of contact and active transistor cells may introduce only minimal alteration of transistor characteristics. This may accommodate a higher level of power dissipation in the die, and a slightly warmer local area that may be sustained in an end product. The small separation distance between the Seebeck temperature difference sensor and the heat source may enable a thermal protection circuit to react quickly to an overheating condition.

A shielded Seebeck temperature difference sensor may be integrated on the same die as a trench MOSFET, and the die including both the Seebeck sensor and the trench MOSFET may be produced with a compatible or only slightly modified production process.

Figure 24:
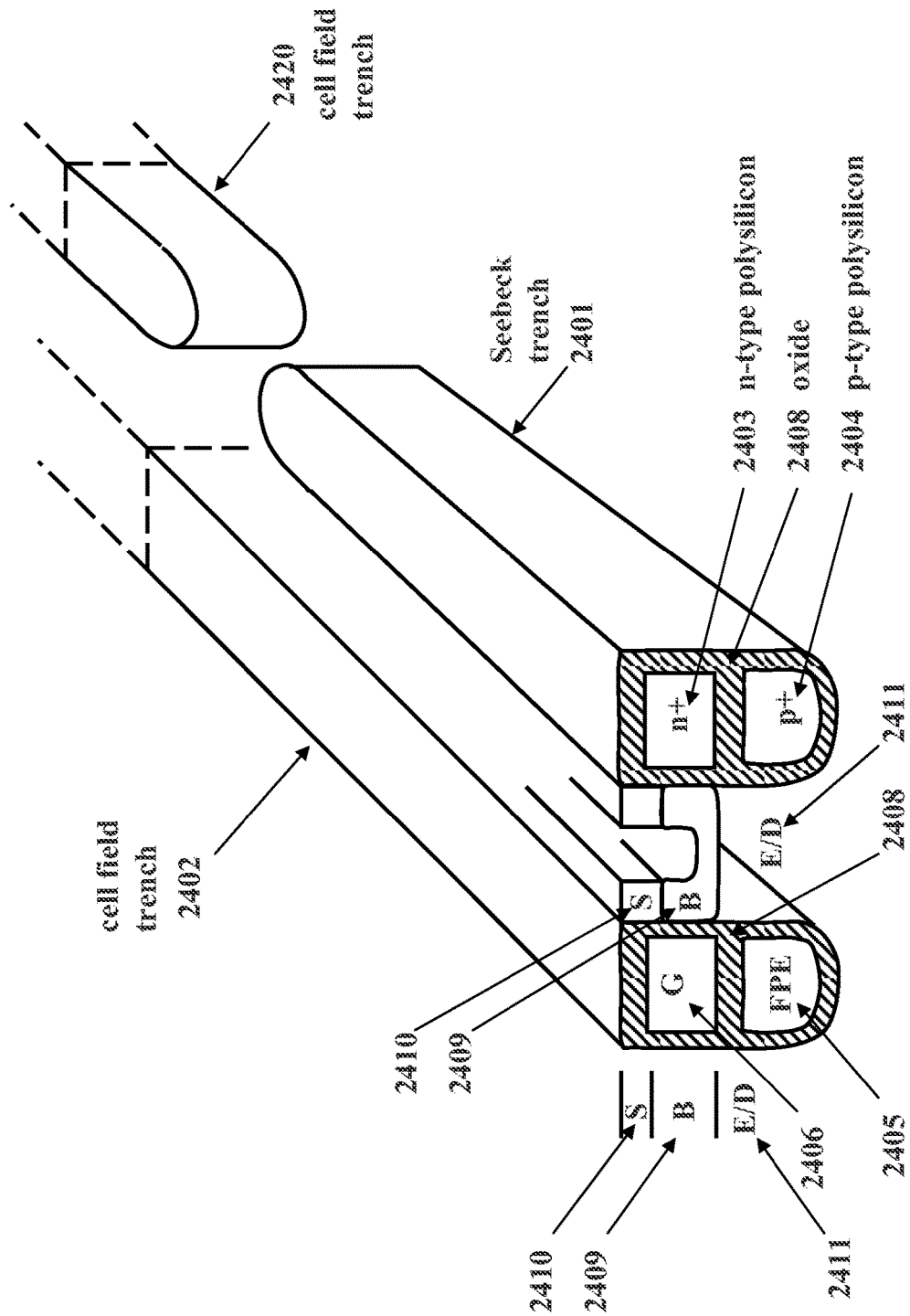
FIGS. 24 and 25 illustrate perspective drawings of a semiconductor device including a field of trench cells formed in a semiconductor chip and a Seebeck temperature difference sensor embedded in the field of trench cells, constructed according to an embodiment.

Turning now to FIG. 24, illustrated is a perspective drawing of a semiconductor device including a field of trench cells formed in a semiconductor chip and a Seebeck temperature difference sensor embedded in the field of trench cells, constructed according to an embodiment. The Seebeck temperature difference sensor is embedded in trench 2401, and a MOSFET cell is embedded in trench 2402. A further cell trench 2420 that may optionally contain another Seebeck temperature difference sensor or another MOSFET cell is also illustrated in FIG. 24.

The field of trench cells may be formed in an n-type polysilicon region or, alternatively, in a p-type polysilicon region. The MOSFET gate electrode 2406 is illustrated in FIG. 24 as the electrode "G." The other electrode "FPE," 2405, may be formed as a so-called field plate electrode. The latter may be coupled to a local potential, typically to a MOSFET source potential. The source region "S," 2410, body region "B," 2409, and epitaxial/drain region "E/D," 2411, of the MOSFET device are also illustrated in this and following figures. The source and epitaxial/drain regions may be n-doped polysilicon regions, and the body region may be formed of p-doped polysilicon, and each region may be highly doped. Typical variations of doping levels in the underlying epitaxial layer, n−, 2930, and n+, 2040, is illustrated in the figure.

In the Seebeck temperature difference sensor trench, polysilicon traces are electrically insulated from each other by an intervening oxide layer, such as oxide layer 2408. The upper polysilicon sensor trace 2403 is illustrated as an n-type trace, and the lower polysilicon sensor trace 2404 is illustrated as a p-type trace. The trench cells may also include more than the two polysilicon regions that form the sensor traces, for example, a third insulating polysilicon region 2408 for isolation of a polysilicon gate electrode.

Figure 25:
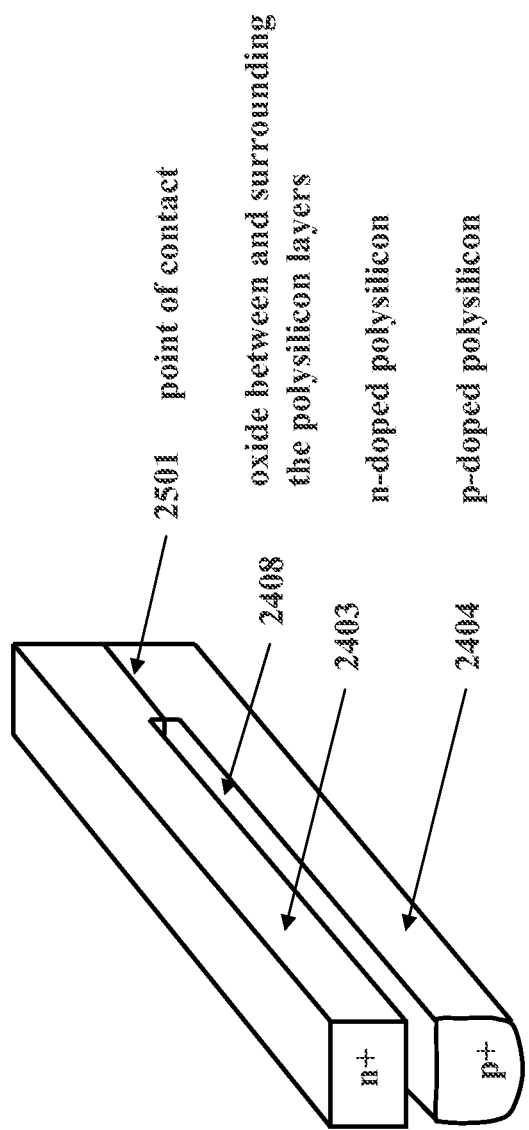

The Seebeck trench 2401 illustrated in FIG. 24 is shown in a simple representative form, including the two complementary-doped polysilicon sensor traces 2403 and 2404. Further structure of the polysilicon sensor traces constructed according to an embodiment is illustrated in the perspective drawing shown in FIG. 25, to which reference is now made. A Seebeck sensor ohmic contact, illustrated in FIG. 25 as the contact 2501, is formed between the n-type and p-type polysilicon traces 2403 and 2404, with the intervening oxide layer 2408 separating and surrounding the n-type and p-type traces. The intervening oxide layer 2408 is not present at the point of contact 2501 of the polysilicon traces, as illustrated in the perspective drawing in FIG. 25 of the polysilicon traces.

Figure 26:
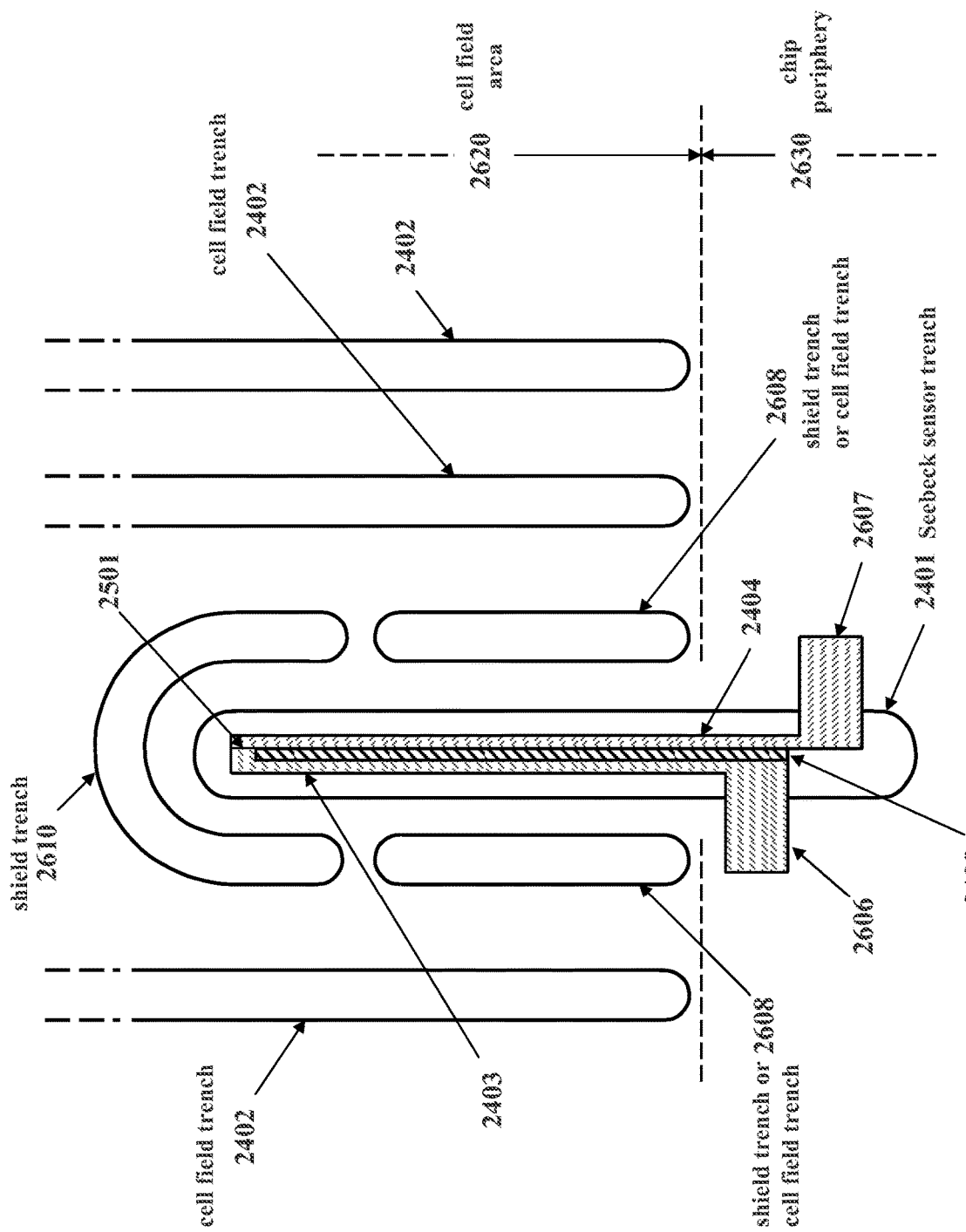
FIG. 26 illustrates a plan view of a semiconductor device including a Seebeck temperature difference sensor formed in a cell trench, and illustrating a plurality of further cell trenches, constructed according to an embodiment.

Turning now to FIG. 26, illustrated is a plan view of the semiconductor device including a Seebeck temperature difference sensor formed in a cell trench 2401, and a plurality of further cell trenches, such as the cell trenches 2402, 2608, and 2610, constructed according to an embodiment. The semiconductor device is illustrated as a cell field region 2620 and a die periphery region 2630. The trenches 2402 may be formed to contain cells of a power-switching device such as a power MOSFET, and the trenches may be formed to contain optionally a sensor or a MOSFET cell. An adjacent U-shaped sensor shield trench 2610 containing a conductive polysilicon layer substantially surrounds at least a portion of the Seebeck temperature difference sensor. Further trenches, such as trench 2608, formed adjacent to the temperature difference sensor and optionally containing a conductive polysilicon layer may be used to form further sensor-shielding structures, or may be employed to contain further cells of the MOSFET power-switching device.

The Seebeck temperature difference sensor is formed with the two oppositely doped polysilicon traces, 2403, 2404, separated from the trench and separated from each other by the oxide layer 2408 except at the ohmic point of contact 2501. The two oppositely doped polysilicon traces 2403, 2404 are coupled at the periphery of the semiconductor device to contact pads, 2606, 2607, such as metallic pads formed on the surface of the semiconductor device to enable connections to an external circuit.

Figure 27:
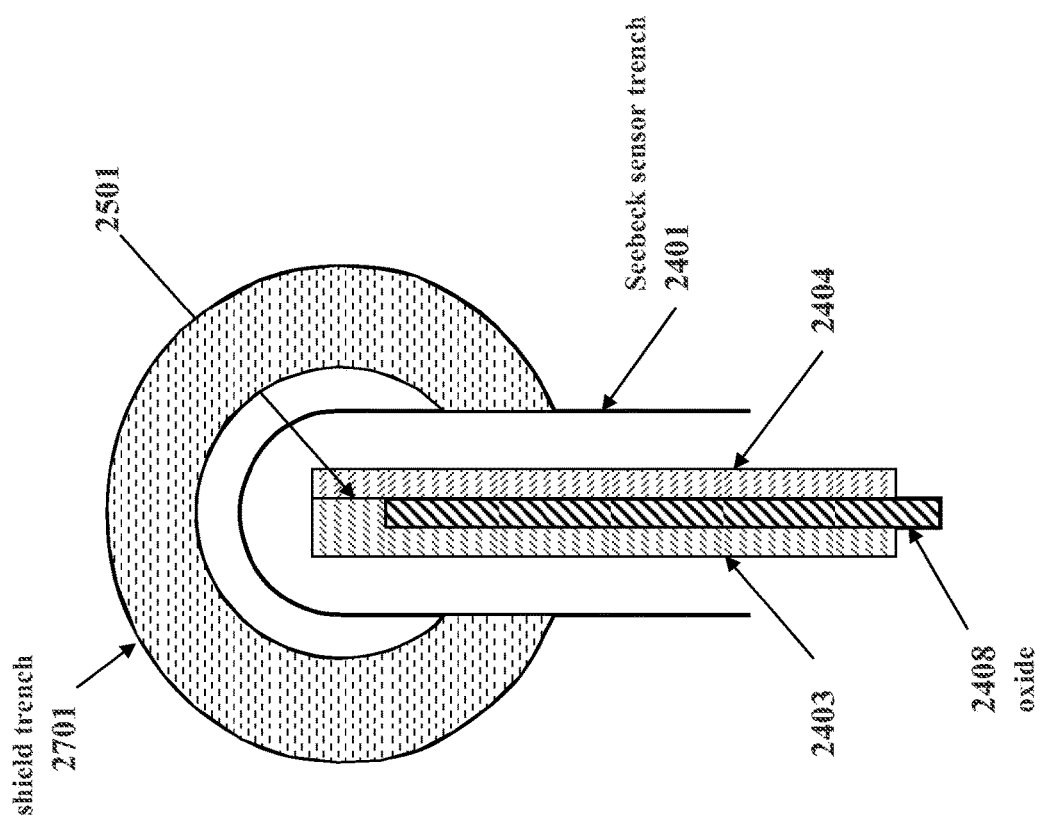
FIG. 27 illustrates a plan view of a Seebeck temperature difference sensor with an electrostatic shield formed in an adjacent ring-shaped shielding trench containing a conductive polysilicon layer, constructed according to an embodiment.

Turning now to FIG. 27, illustrated is a plan view of a Seebeck temperature difference sensor with an electrostatic shield formed in an adjacent ring-shaped shielding trench, 2701, containing a conductive polysilicon layer, constructed according to an embodiment.

A shielding trench such as the trench 2701 illustrated in FIG. 27, or the trenches 2610 and 2608 illustrated in FIG. 26, may be formed deeper and/or wider than the Seebeck trench itself and/or the trenches containing MOSFET cells. The Seebeck trenches and the field cell trenches may vary in depth and width in cross-sectional area depending on their differing needs and internal structures. A trench containing a Seebeck temperature difference sensor will typically be larger than a MOSFET cell trench to accommodate the larger elements of a Seebeck temperature difference sensor that may be required therein, such as the conductive, oppositely doped polysilicon traces.

A combination of thin and thick oxide layers may be employed in forming the Seebeck trench areas. Gate oxides, which are typically thin, provide a high level of heat conduction, whereas field oxides, which are thicker, accommodate high neighboring potentials that may need to be isolated. If different recess heights for the polysilicon layers are employed, the gate oxides and field oxides can be varied. Gate oxides may be deposited on deeper recess surfaces than polysilicon recess surfaces supporting field oxides. In the die peripheral areas in which external contacts are located, the trench width can be enlarged to provide sufficient space for a contact hole.

To provide shielding for the two polysilicon traces forming the Seebeck temperature difference sensor, a third polysilicon layer conforming to the trench may be deposited, and an overlying metallic flash applied thereto. Alternatively, a metallic layer may be deposited in trenches to provide lateral shielding for a Seebeck sensor.

A process flow to construct a shielded Seebeck temperature difference sensor in a semiconductor device including a power-switching device such as a MOSFET may be described according to an embodiment with the following steps. Processing details to perform the individual steps such as application and patterning of a photoresist followed by an etching step are generally well known in the art and will not be described.

Step 1) Trench etching to form Seebeck sensor, sensor shielding, and MOSFET cell trenches. A typical device cell such as a MOSFET cell may be formed in a narrow trench. A cell including a Seebeck temperature difference sensor may be formed wider than a MOSFET cell, depending on process characteristics.

Step 2) Field oxidation to provide an isolation layer on the walls of the trenches.

Deposition of n+ and p+ traces with separation by an intervening polysilicon layer is generally performed in later steps. Cells may be formed with a field sacrificial electrode or with polysilicon. The Seebeck temperature difference sensor may be formed with an adjacent shielding electrode.

Step 3). Deposition of a conductive polysilicon layer in the shielding and sensor trenches.

Step 4) Polysilicon oxidation to form an insulating layer on the conductive polysilicon layer formed in step 3 in the sensor trenches.

Step 5) Patterning, employing a photoresist, to selectively remove polysilicon and oxide layers from the top surface of the chip.

Step 6) Further device processing. The cell field trenches and the sensor trenches are now open with substantially the same width, so that standard MOSFET processes can be employed to form MOSFET structures.

After Step 6, the open widths of the Seebeck cells and field trench cells are substantially the same, which is often necessary for further parallel processing for deposition of polysilicon traces in the trenches.

Step 7) Deposition of a polysilicon layer, e.g., a p-type layer, in a trench recess to form the lower polysilicon trace in the temperature difference sensor trenches and the field plate electrode in the MOSFET cell trenches.

Step 8) Deposition of field oxides and gate oxide employing photoresist techniques to form an overlying insulating layer. The MOSFET cells are now open and the Seebeck sensor is closed.

Step 9) Etching of the field oxide.

Step 10) Simultaneously etching of the gate oxide and the field oxide.

Step 11) Forming the sensor external contacts which may employ a photoresist-based process. The Seebeck trench region will contain the two oppositely doped polysilicon traces, ends of which form the sensor contacts.

Step 12) Depositing gate polysilicon, e.g., n-type, in the MOSFET cell trenches and the upper polysilicon sensor trace in the temperature difference sensor trenches.

Figure 29:
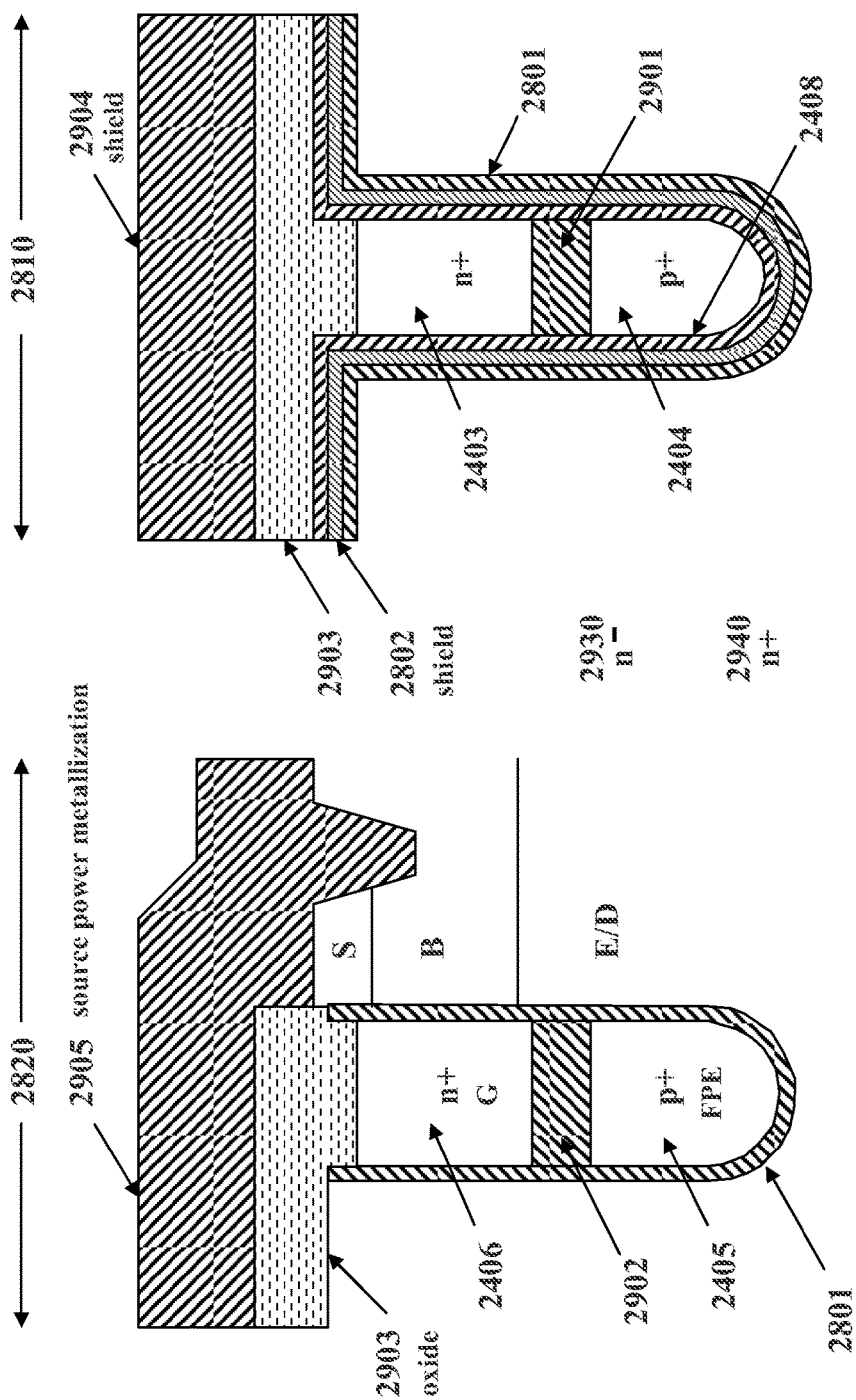
FIG. 29 illustrates a cross-sectional drawing of the Seebeck temperature difference sensor trench and the MOSFET cell trench after further processing, constructed according to an embodiment.

Step 13) Forming a polysilicon recess, and then forming an oxide layer across the top of trenches, such as the oxide layer 2903 illustrated in FIG. 29.

Step 14) Formation of contacts employing normal silicon processing techniques. This includes deposition of an overlying metallization, such as the metallization layer 2904, 2905 illustrated in FIG. 29, which may be employed to form the external contacts for the polysilicon sensor traces, such as the contacts 2606 and 2607 illustrated in FIG. 26.

Figure 28:
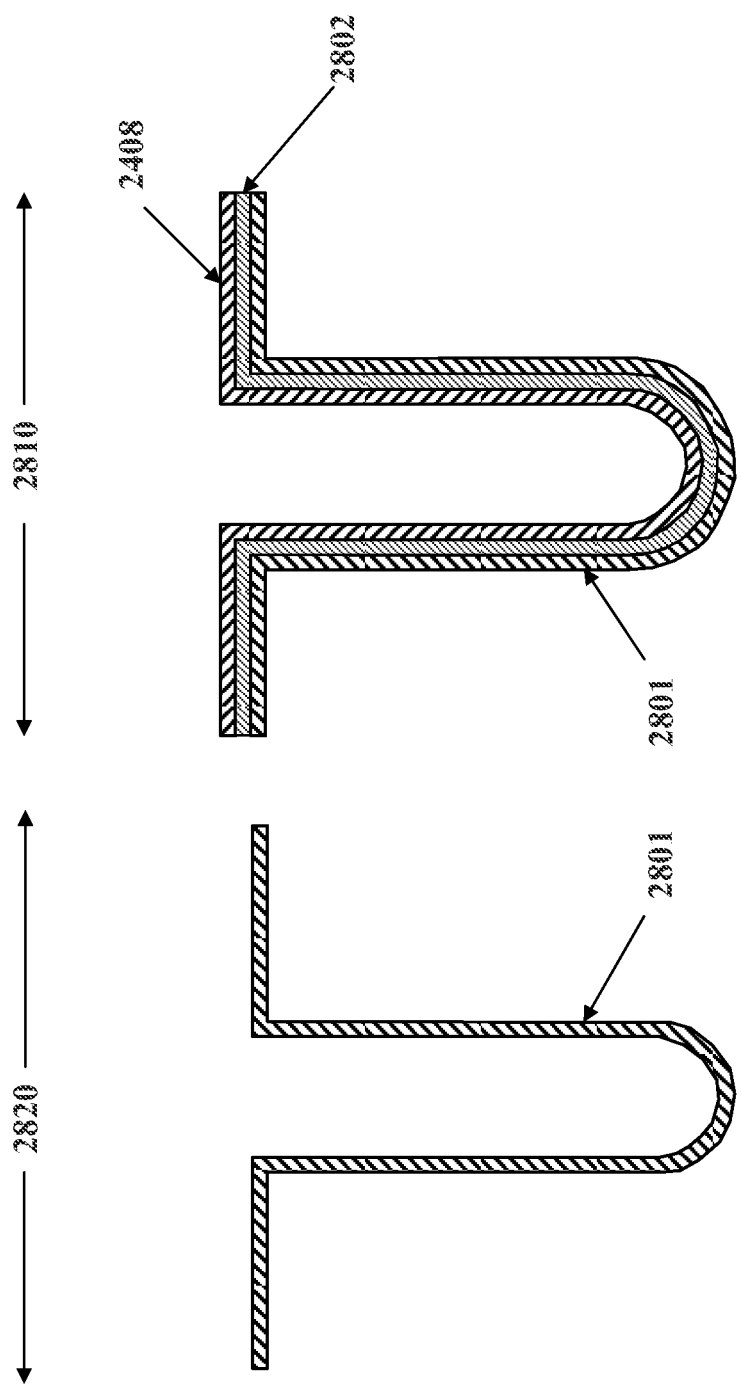
FIG. 28 illustrates a cross-sectional drawing of a partially processed Seebeck temperature difference sensor trench and a MOSFET cell trench, constructed according to an embodiment.

Turning now to FIG. 28, illustrated is a cross-sectional drawing of a partially processed Seebeck temperature difference sensor trench 2810 and a MOSFET cell trench 2820 according to an embodiment. After formation of the trenches, oxide layer 2801 is deposited on the walls thereof and on the adjacent top surface of the chip. Next a conductive polysilicon shield 2802 is deposited in the trench in which the Seebeck sensor will be formed. Then a second oxide layer 2408 is deposited on the conductive polysilicon shield 2802. The second oxide layer may be formed as a different oxide process than the first oxide layer 2801. Another thermal oxidation process may be employed for the second oxide, or an oxide deposition may be performed.

Turning now to FIG. 29, illustrated is a cross-sectional drawing of the Seebeck temperature difference sensor trench 2810 and the MOSFET cell trench 2820 after further processing according to an embodiment. The further processing can be described as follows. After formation of the oxide layer 2801 on the walls of the trenches, a conductive polysilicon layer 2802 is deposited in the Seebeck sensor trench and on the upper surface of the chip to form the electrostatic sensor shield. Then the oxide layer 2408 is deposited for isolation on the conductive polysilicon layer 2802. Next, p-doped polysilicon traces are deposited to form the field plate electrode 2405 of the MOSFET and the lower polysilicon trace 2404 of the Seebeck temperature difference sensor. An oxide layer is then deposited to form the respective oxide structures 2901, 2902 of the Seebeck sensor and the MOSFET, a portion of which is opened to form the contact between the two polysilicon layers traces forming the Seebeck sensor. Then n-doped polysilicon traces are deposited to form the upper polysilicon trace 2403 of the sensor and the gate 2406 of the MOSFET. An oxide layer 2903 is deposited over both the Seebeck sensor and the MOSFET, and a metallization layer is deposited over this oxide layer to form a portion of the shield 2904 for the Seebeck sensor, and for the power metallization for the source of the MOSFET.

In an alternative to the process described above, the contact between the oppositely doped polysilicon traces forming the Seebeck temperature difference sensor can also be made with a metal bridge. Formation with a metal bridge has the advantage of avoiding opening an oxide layer. A metal bridge may be advantageous if the metal deposition is sufficiently finely structured.

Thus, an integrated, shielded Seebeck temperature difference sensor capable of sensing a temperature difference between the junction of two polysilicon traces and a point of contact with metallized pads may be formed on the same die as a power semiconductor device has been described. The metallized pads may be located on the periphery of the die.

A temperature sensor may be of any of various types, such as a temperature sensor for an absolute temperature measurement. In this latter case, a control device senses the temperature at the die periphery as well as the temperature difference between the die periphery and the junction of the two polysilicon traces to determine an absolute temperature at the ohmic contact of the two polysilicon traces.

An arrangement of a Seebeck temperature difference sensor may also include an absolute temperature sensor to enable the simultaneous measurement of a temperature difference between a hot region and a cold region of a power semiconductor device such as a MOSFET and a measurement of the absolute temperature at the hot and cold region of the power semiconductor device. A Seebeck temperature difference sensor and an absolute temperature sensor may be formed wherein both temperature sensors have the same temperature coefficient to enable the simultaneous measurement of a difference temperature value and an absolute temperature value in a simple manner. A second absolute temperature, such as a temperature of a hot region of the power semiconductor device may be produced by adding the temperature difference measured by the Seebeck temperature difference sensor and the absolute temperature measured by the absolute temperature sensor. The measured and calculated temperature values may be evaluated by a temperature difference protection circuit or by an over-temperature protection circuit.

Figure 30:
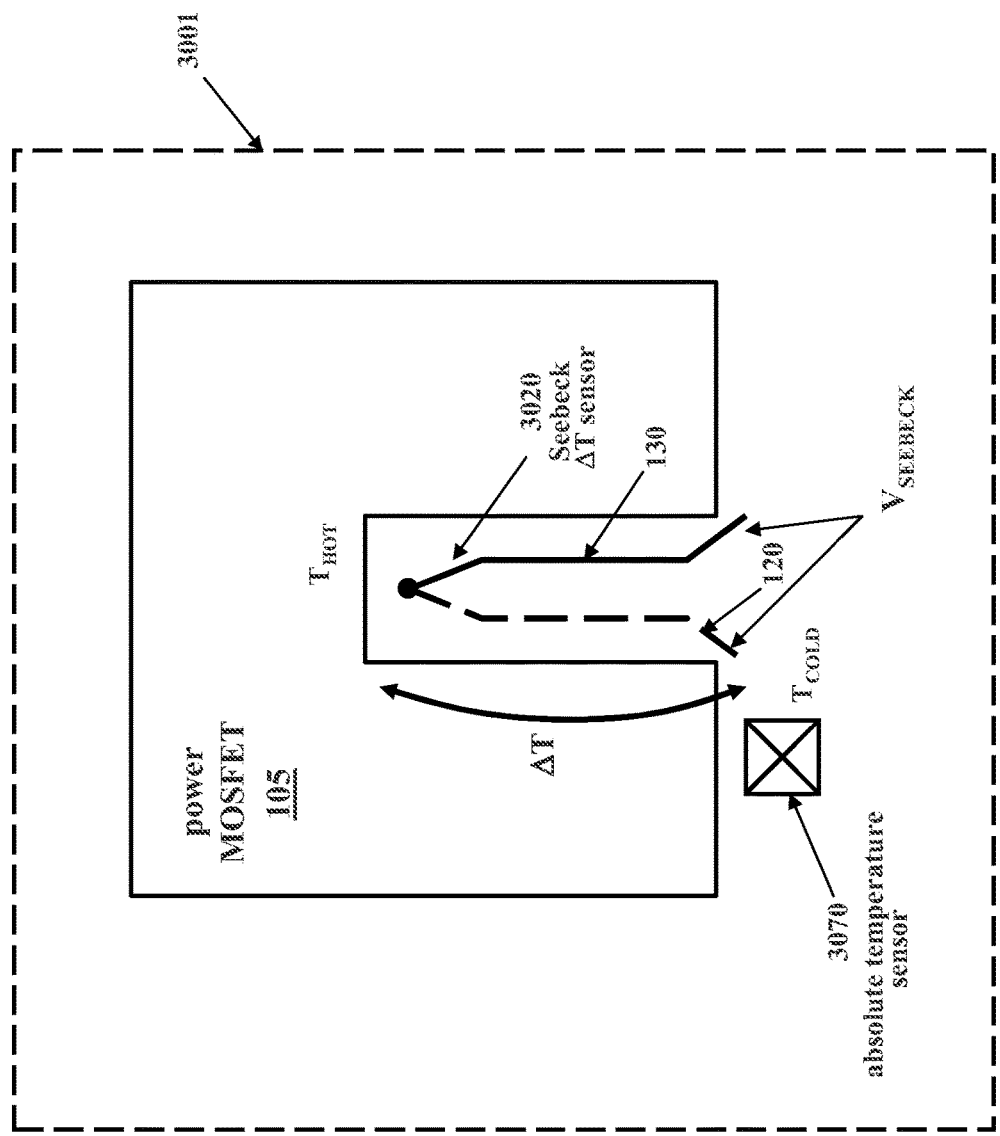
FIG. 30 illustrates a power MOSFET formed with an embedded Seebeck temperature difference sensor including an absolute temperature sensor embedded in an integrated circuit, constructed according to an embodiment.

Turning now to FIG. 30, illustrated is an embodiment of a power MOSFET 105 formed with an embedded Seebeck temperature difference sensor 3020 including an absolute temperature sensor 3070 embedded in an integrated circuit 3001. In this particular example, the Seebeck temperature difference sensor is located substantially in the power MOSFET, and the absolute temperature sensor is located at a distance away from the power MOSFET. The Seebeck temperature difference sensor, as described previously hereinabove, measures the temperature difference ΔT between hot and the cold regions of the power MOSFET. The absolute temperature sensor measures a temperature $T_{cold}$ in a cold region of the power MOSFET. For the absolute temperature sensor, for example, a forward biased pn-diode or a resistor can be used to sense an absolute temperature. The absolute temperature $T_{hot}$ in a hot region of the power MOSFET can be derived by adding the temperature difference value measured by the Seebeck sensor to the $T_{cold}$ value measured by the absolute temperature sensor. To enable calculation of the hot temperature value, the temperature coefficient of the absolute temperature sensor and the coefficient of the Seebeck temperature difference sensor may be formed to be the same.

Figure 31:
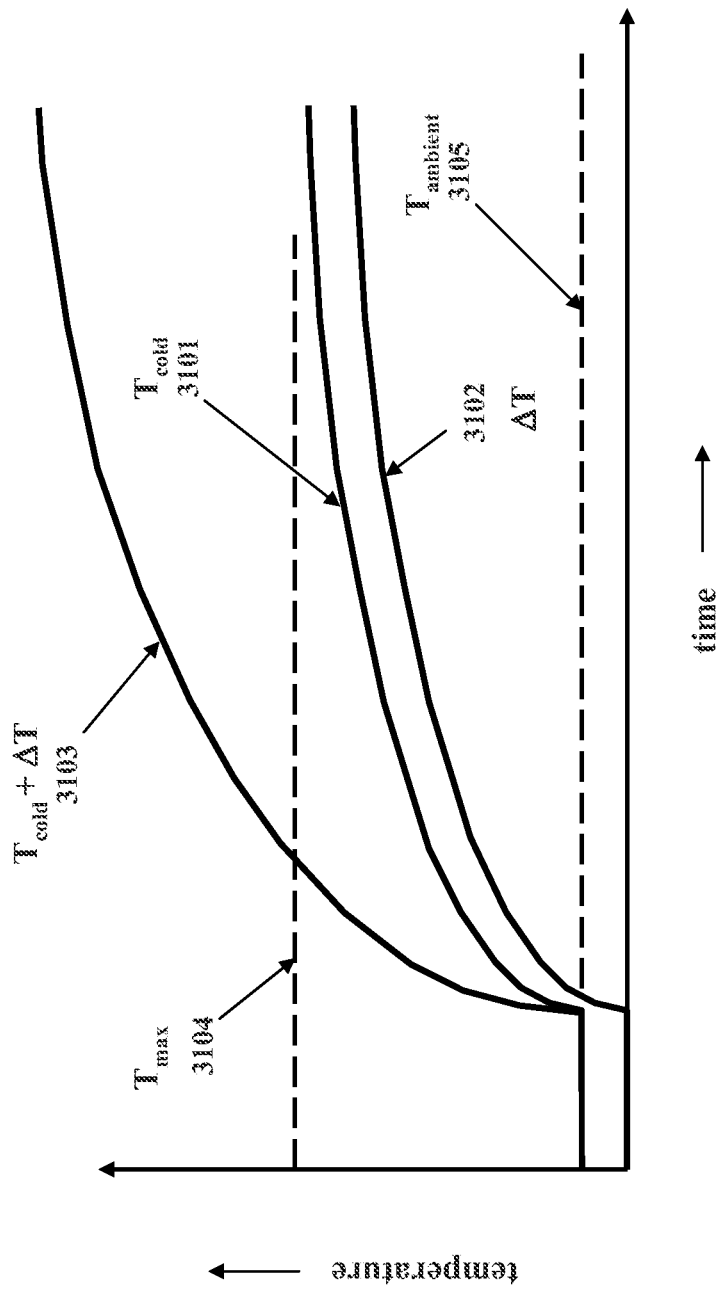
FIG. 31 illustrates a graphical drawing showing generic temperature signals on the vertical axis of the figure in an integrated circuit measured against time on the horizontal axis produced by the temperature sensors illustrated in FIG. 30.

Turning now to FIG. 31, illustrated is a graphical drawing showing generic temperature signals on the vertical axis of the figure in an integrated circuit measured against time on the horizontal axis by the temperature sensors illustrated in FIG. 30. Power dissipated in the power MOSFET produces heat and a temperature gradient between the hot (central) and cold (edge) regions of the power MOSFET. The temperature 3105, $T_{ambient}$, illustrated in FIG. 31 is the ambient temperature when no power is dissipated in the power MOSFET. An absolute temperature sensor senses the absolute temperature 3101, $T_{cold}$. The Seebeck temperature difference sensor senses the temperature difference ΔT, 3102. The sum of the absolute temperature 3101 and the temperature difference 3102 is the temperature at a point in the hot region of the power MOSFET.

Figure 32:
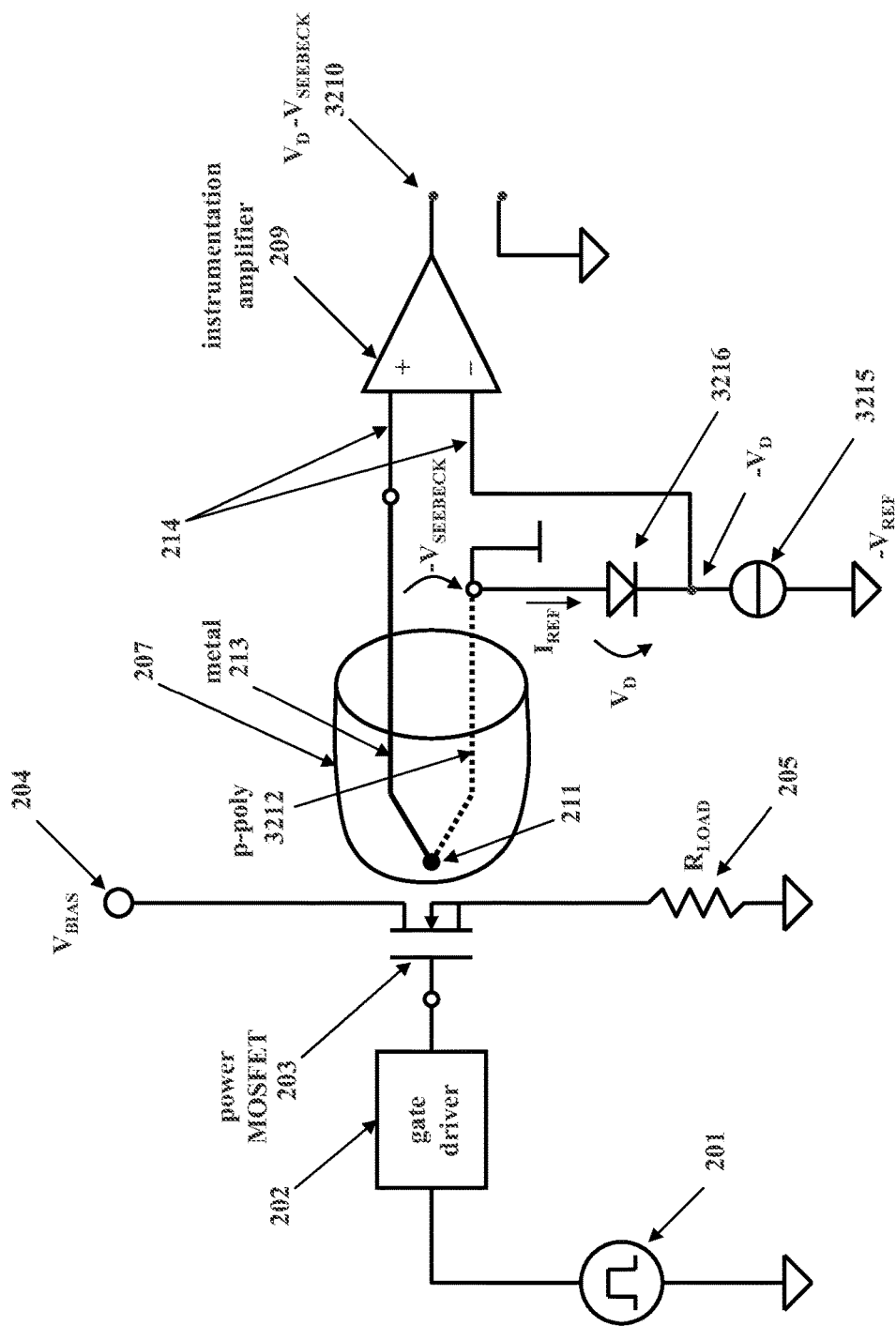
FIGS. 32 and 33 illustrate a circuit arrangement of a Seebeck temperature difference sensor with an optional shield and a pn-diode absolute temperature sensor configured to measure an absolute temperature in a hot region of a power MOSFET or other semiconductor device, constructed according to an embodiment.

Turning now to FIG. 32, illustrated is a circuit arrangement of a Seebeck temperature difference sensor and a pn-diode absolute temperature sensor configured to measure an absolute temperature in a hot region of a power MOSFET or other semiconductor device, constructed according to an embodiment. In the embodiment illustrated in FIG. 32, a forward-biased pn-diode 3216 conducting a current $I_{REF}$ produced by current source 3215 is employed to measure an absolute temperature $T_{cold}$ in the cold region of the power MOSFET as indicated by forward diode voltage $V_D$. The Seebeck sensor is formed by a metal and a p-doped polysilicon trace. The instrumentation amplifier derives the temperature $T_{hot}$ at the hot region of the power MOSFET from the $\Delta T$ and $T_{cold}$ temperature value to produce the signal 3210, $V_D$–$V_{SEEBECK}$, representative of the temperature $T_{hot}$. A doped polysilicon trace of the Seebeck sensor may be employed for the anode or the cathode of the pn-diode, with appropriate doping type for each of the pn-diode elements. Other elements of the circuit may be rearranged from that illustrated in FIG. 32 to accommodate a resulting voltage polarity change from a substitution of a different doping type to sense a temperature difference. The circuit arrangement illustrated in FIG. 32 may optionally include shield 207, as described previously hereinabove. The shield 207 may be omitted for an application in an environment with a sufficiently low level of electromagnetic interference to permit such operation without a shield. The shield 207 may be left floating, as indicated in FIG. 32 or may be coupled to a local potential.

Figure 33:
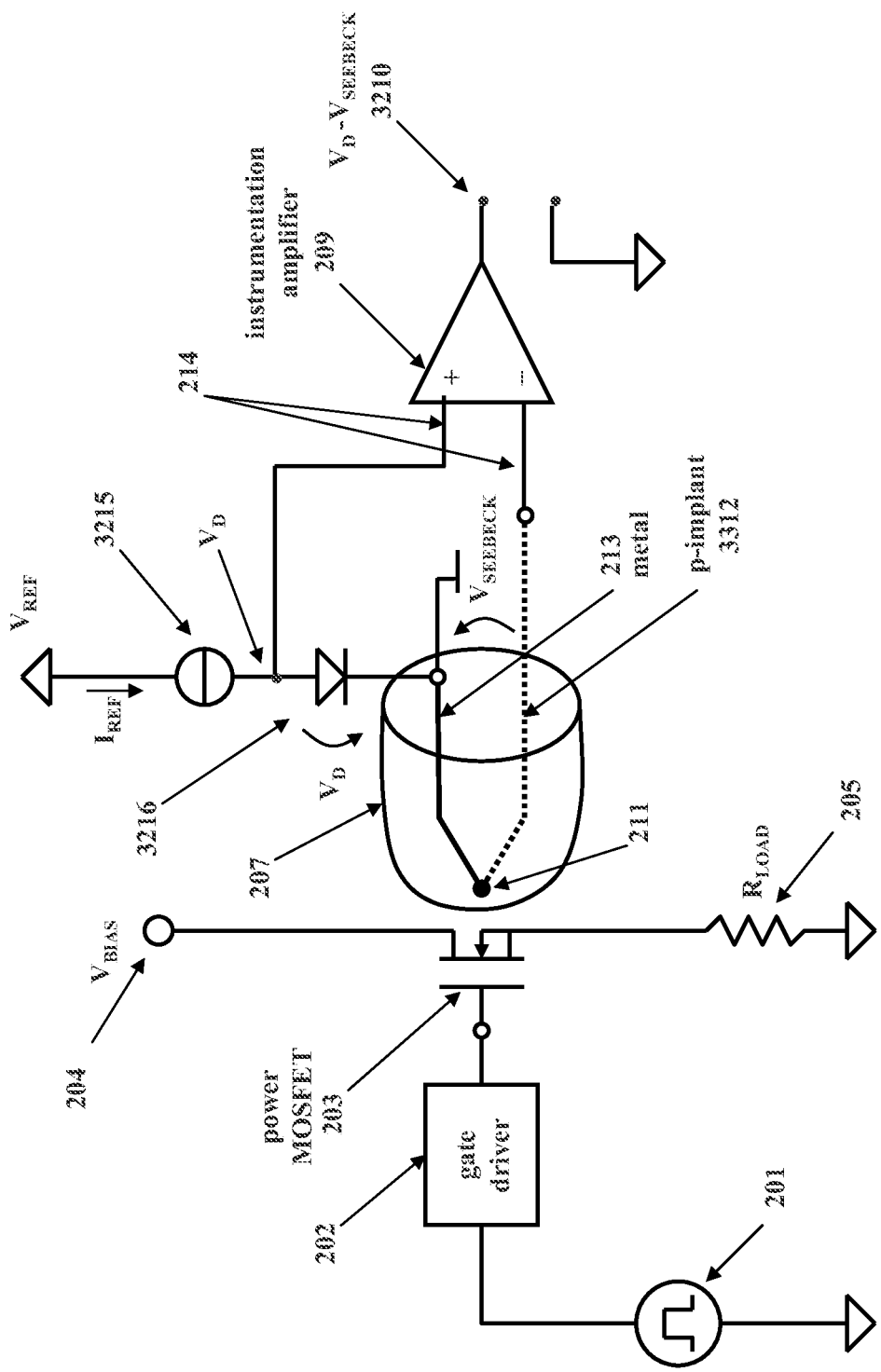

Turning now to FIG. 33, illustrated is a circuit arrangement of a metal and a p-implanted polysilicon trace in place of the p-doped polysilicon trace described with reference to FIG. 32 to form a Seebeck sensor coupled to an absolute temperature sensing diode, constructed according to an embodiment. The circuit may be readily rearranged to accommodate an n-type implanted polysilicon trace.

Figure 34:
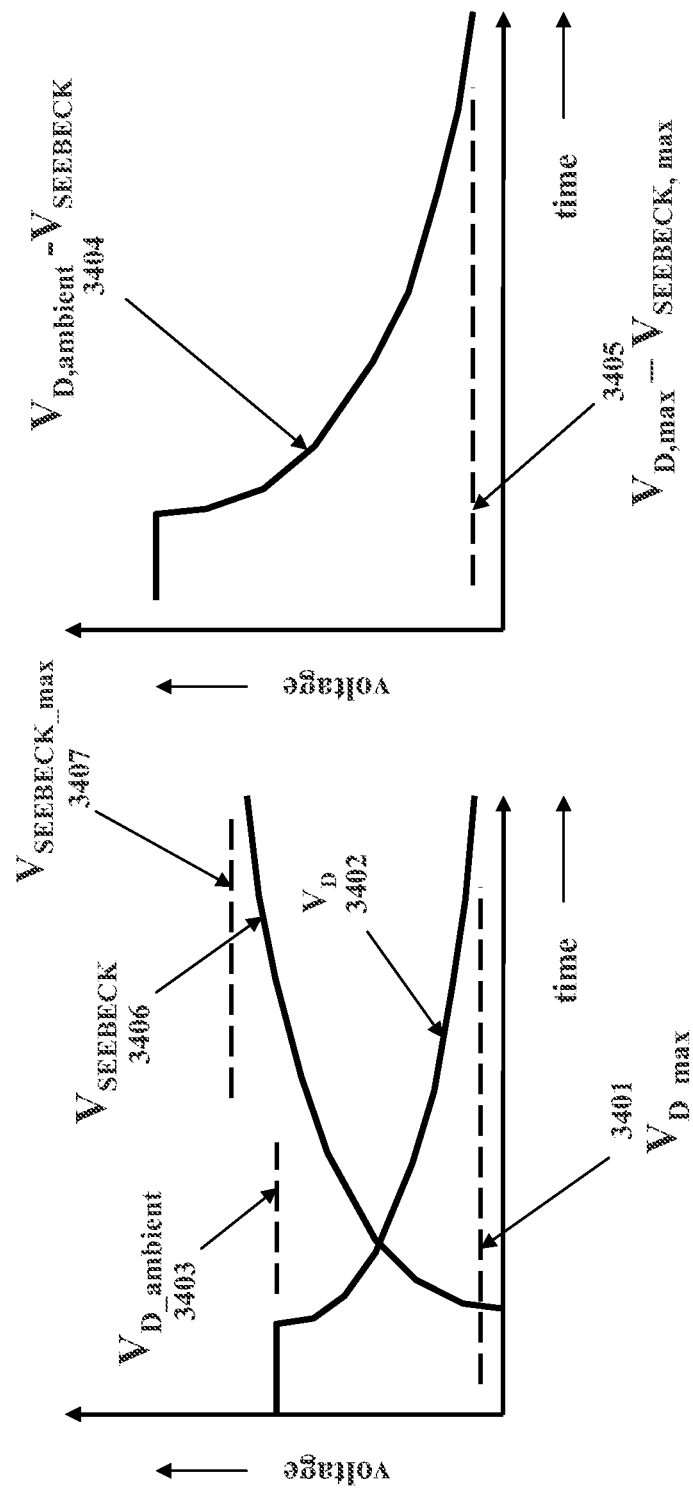
FIGS. 34A and 34B illustrate graphical drawings of voltage signals plotted against time produced by the circuits illustrated in FIGS. 32 and 33.

Turning now to FIGS. 34A and 34B, illustrated are graphical drawings of voltage signals plotted against time produced by the circuits illustrated in FIGS. 32 and 33. In FIG. 34A, 3402 is an example of a voltage produced by a diode sensing an absolute temperature. The voltage $V_{D\_max}$, 3401, is the voltage between anode and cathode of the pn-diode, after a specific time when a certain amount of power is dissipated in the power MOSFET. The voltage between anode and cathode of the pn-diode when no power is dissipated in the power MOSFET is represented by the dashed line $V_{D\_ambient}$, 3403. A voltage corresponding to an ambient temperature sensed by the diode when the integrated circuit is not powered is represented by the dashed line 3403. The curve 3406 represents a voltage produced by a Seebeck temperature difference sensor. The dashed line $V_{SEEBECK\_max}$, 3407, is the output voltage of the Seebeck temperature difference sensor after a specific time when a certain amount of power is dissipated in the power MOSFET.

The curve 3404 in FIG. 34B represents a voltage produced by a voltage difference between the diode and the Seebeck temperature difference sensor. The dashed line 3405 represents a minimum allowable value for this voltage.

Figure 35:
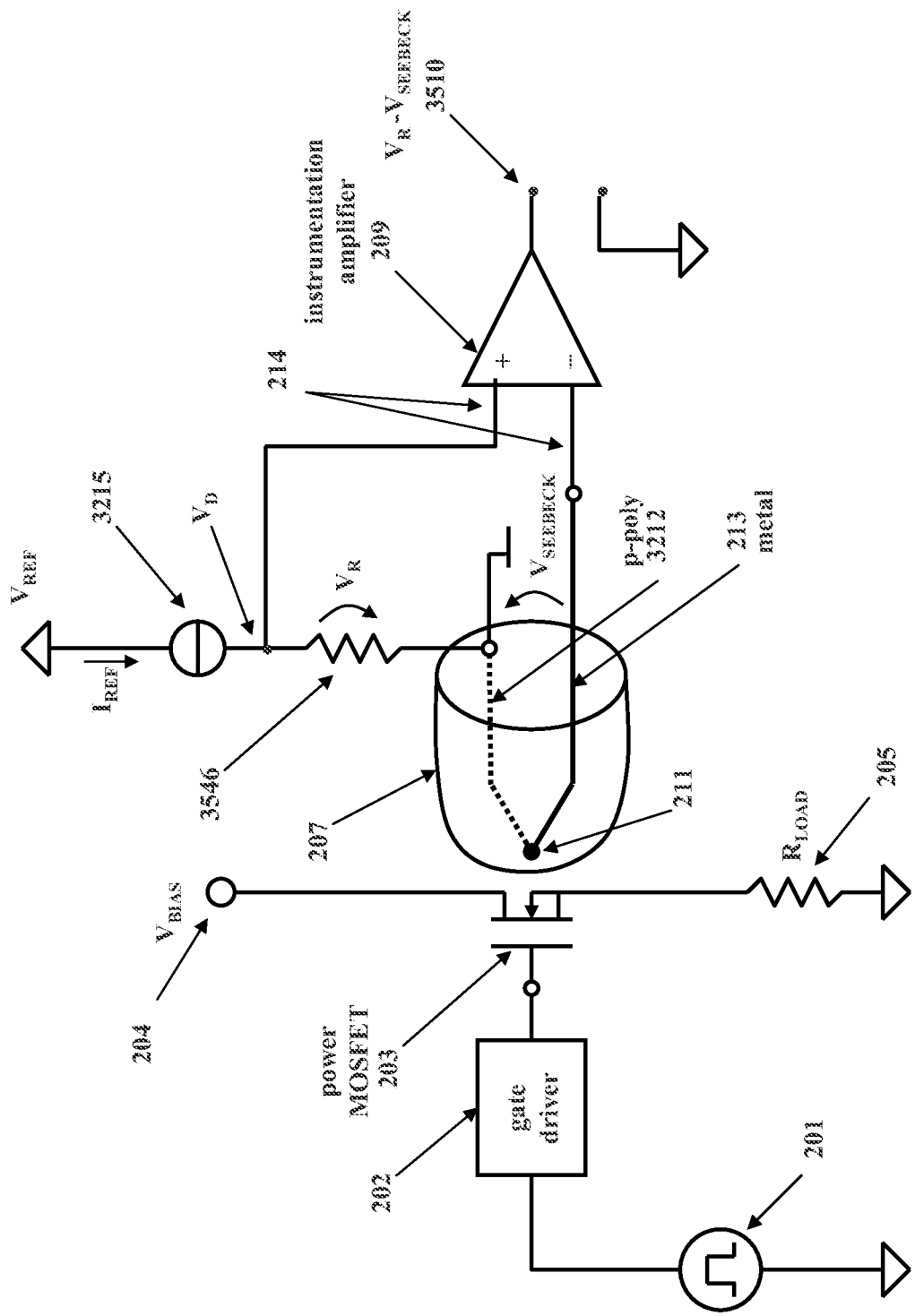
FIGS. 35 and 36 illustrate schematic drawings showing a Seebeck temperature difference sensor coupled to a resistor to sense an absolute temperature $T_{cold}$ in a cold region of a semiconductor device, constructed according to an embodiment.
Figure 36:
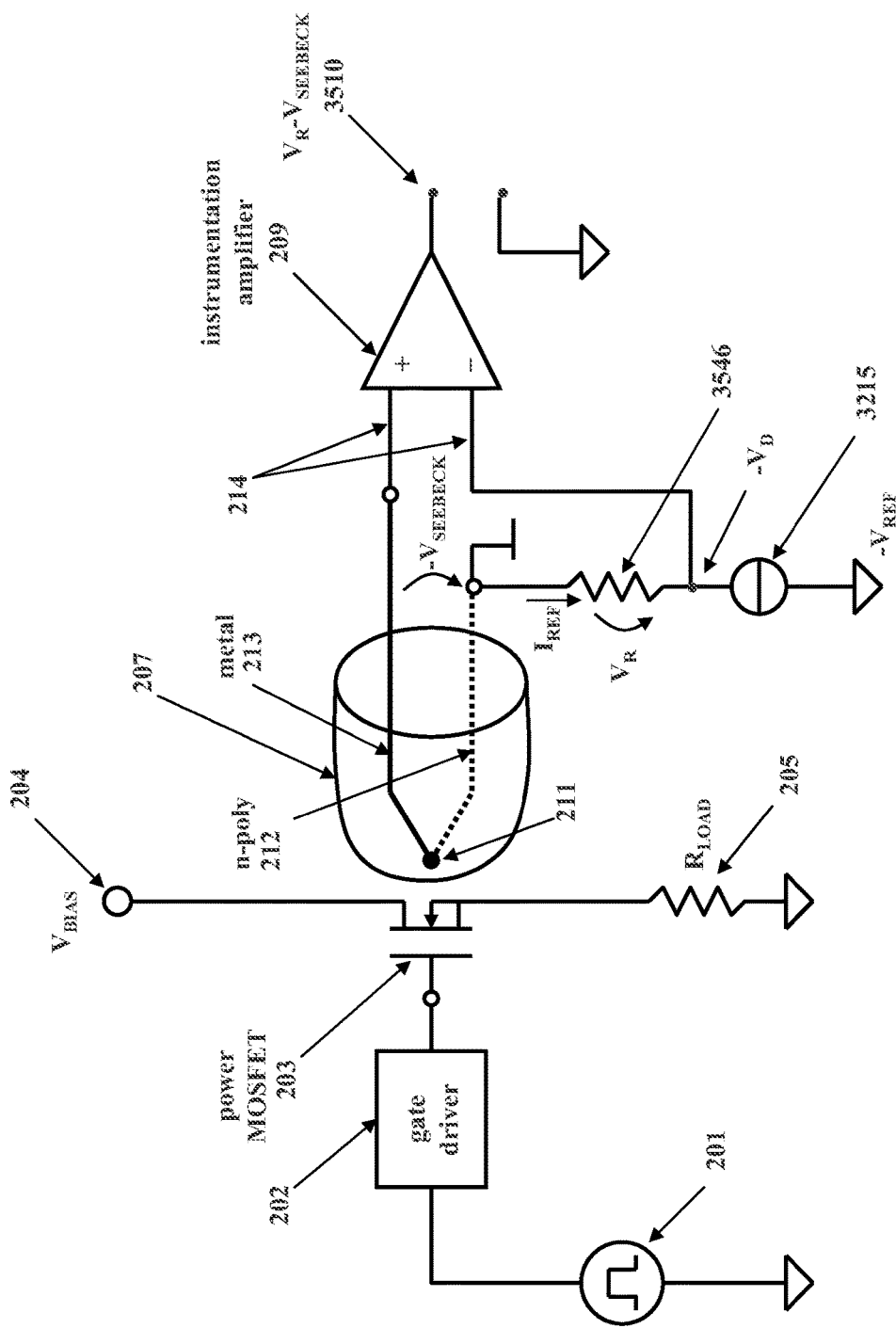

Turning now to FIGS. 35 and 36, illustrated are schematic drawings illustrating two embodiments employing a Seebeck temperature difference sensor coupled to a resistor to sense an absolute temperature $T_{old}$ in a cold region of a power MOSFET or other semiconductor device. The optionally shielded Seebeck sensor is formed by a metal and a p-doped polysilicon trace as illustrated in FIG. 35, or by a metal and n-doped polysilicon trace, as illustrated in FIG. 36. In an embodiment the Seebeck sensor may be formed by a metal and an implanted polysilicon trace. The instrumentation amplifier produces a signal 3510 representing a temperature $T_{hot}$ in a hot region of the power MOSFET from the temperature difference (Seebeck voltage) and a $T_{cold}$ value. The voltage $V_R$ is produced across the resistor 3546 to represent an absolute temperature.

The temperature coefficient of the absolute pn-diode temperature sensor can be changed by changing the reference current $I_{REF}$ or the active area of the pn-junction. In a case of a resistor temperature sensor, the temperature coefficient of the resistor sensing an absolute temperature can be changed by changing the reference current $I_{REF}$, the value of resistance, or the doping concentration of the resistor. The Seebeck coefficient of the Seebeck sensor can be changed by changing the doping concentration of the semiconductor material used to form the Seebeck temperature difference sensor, or by connecting multiple Seebeck sensors in series.

Figure 37:
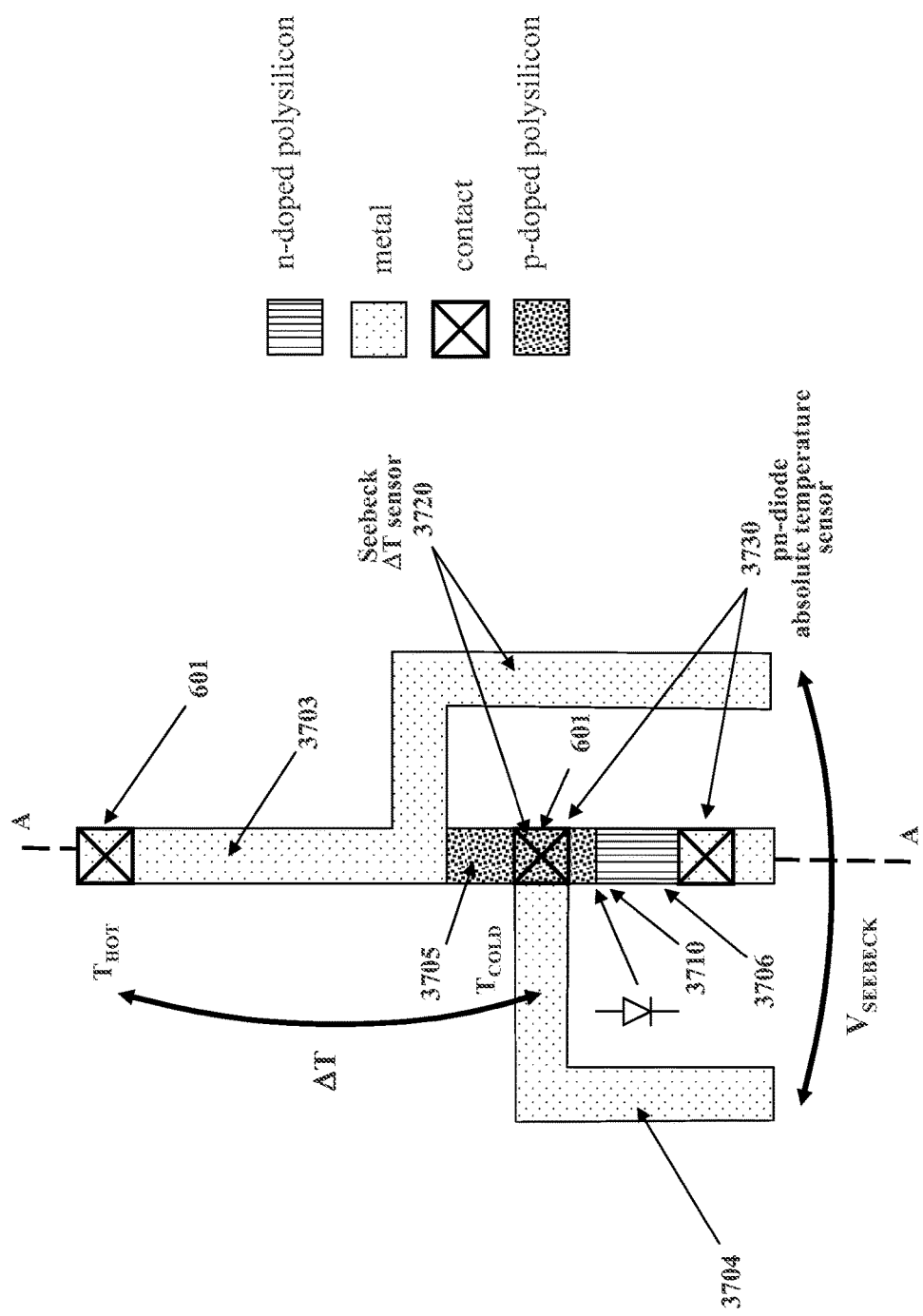
FIGS. 37 and 38 illustrate plan-view drawings of a Seebeck temperature difference sensor coupled to a pn-diode absolute temperature sensor to form an absolute temperature sensor, constructed according to an embodiment.
Figure 38:
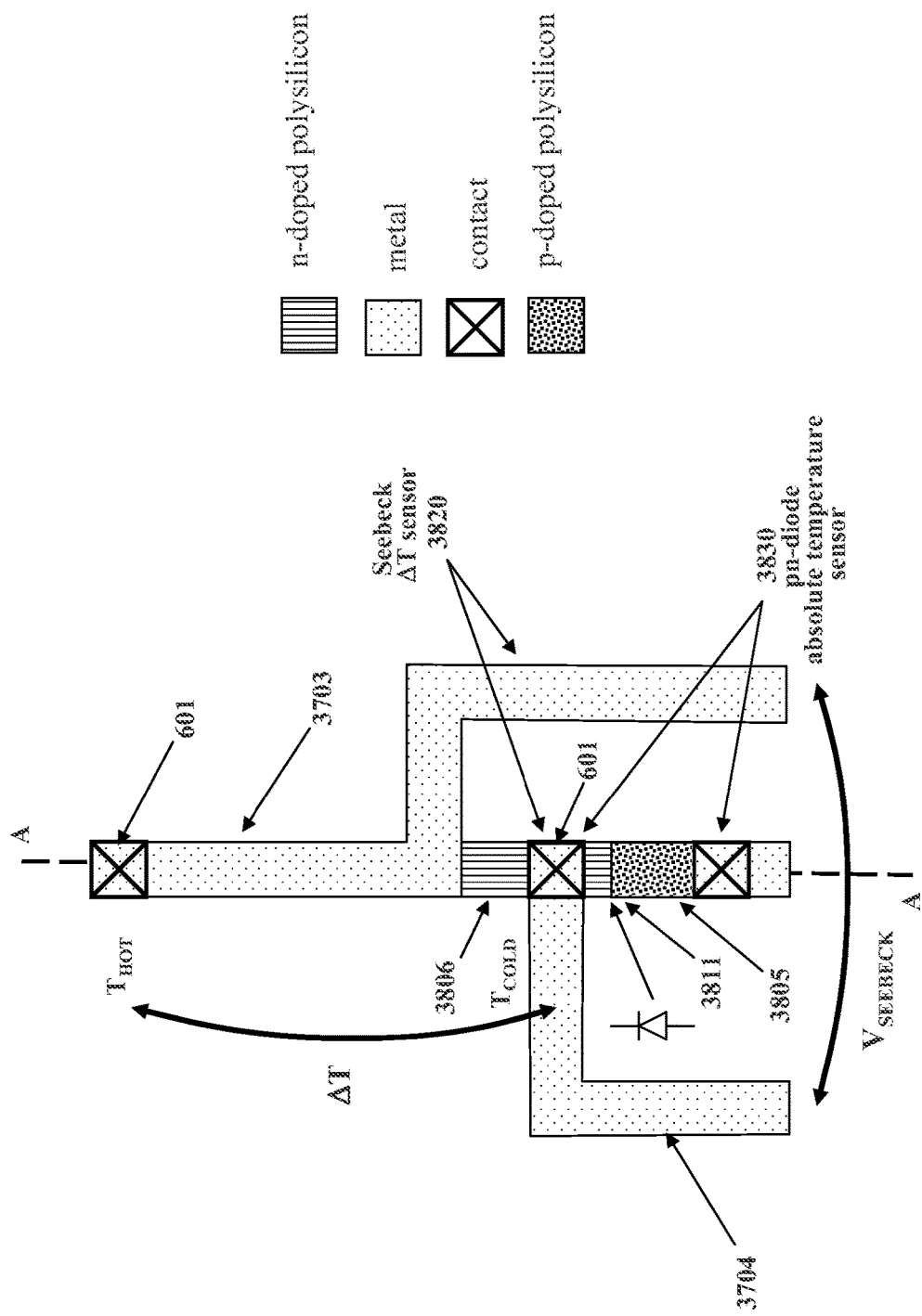

Turning now to FIGS. 37 and 38, illustrated are plan-view drawings of a Seebeck temperature difference sensor 3720 coupled to a pn-diode absolute temperature sensor, 3730, to form an absolute temperature sensor, constructed according to an embodiment. As illustrated in FIG. 37, the Seebeck sensor is formed employing p-type polysilicon trace 3705 and metal trace 3703. As illustrated in FIG. 38, the Seebeck sensor 3820 is formed employing n-type polysilicon trace 3806 and metal trace 3703. The absolute temperature sensor in both cases is formed as pn-diode 3710 formed at the semiconductor junction of n-type polysilicon trace 3706 and p-type polysilicon trace 3705. In FIG. 38, the doping types of traces 3805 and 3806 to form diode 3811 are reversed from those illustrated in FIG. 37 to form pn-diode absolute temperature sensor 3830. In an embodiment, traces may be formed as implants or as depositions.

Figure 39:
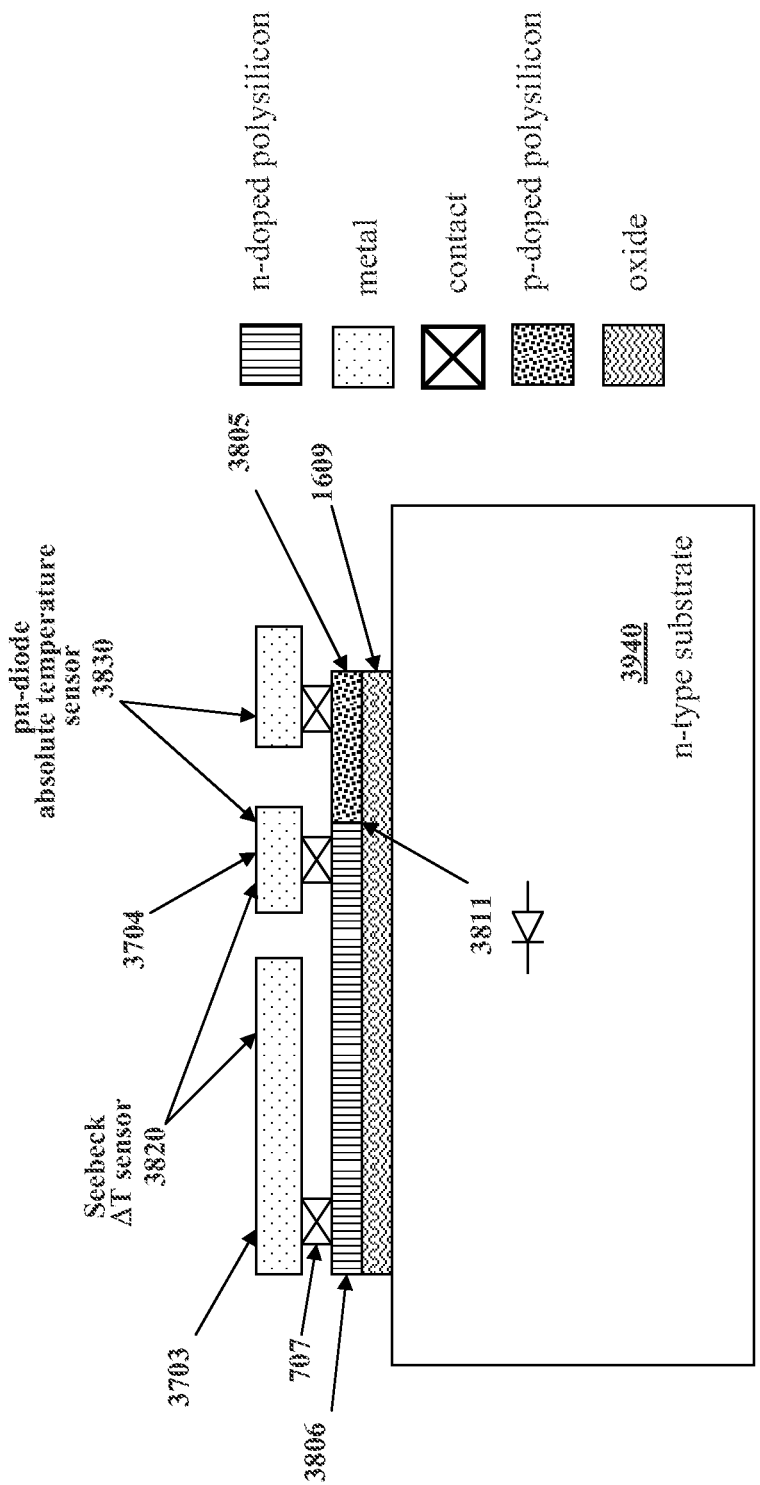
FIG. 39 illustrates a cross-sectional drawing along the axis A-A illustrated in FIG. 38 of a semiconductor device including an absolute temperature sensor.

Turning now to FIG. 39, illustrated is a cross-sectional drawing along the axis A-A illustrated in FIG. 38 of a semiconductor device including an absolute temperature sensor. As illustrated in FIG. 39, the semiconductor temperature-sensing device is formed on an n-type substrate 3940. Of course, the device may be formed on a p-type substrate with appropriate doping changes made to other elements of the device within the broad scope of the invention, as well as with other compatible reversals of doping types. Oxide layer 1609 is deposited on substrate 3940. Above oxide layer 1609, n-type polysilicon trace 3806 and p-type polysilicon trace 3805 are patterned and formed. Semiconductor junction 3811 between these traces forms a pn-diode that is employed to form the pn-diode absolute temperature sensing device 3830. Metallic traces 3703 and 3704 in conjunction with a contact, such as contact 707, form Seebeck temperature difference sensor 3820. Thus, an absolute temperature sensor is formed by a series circuit arrangement of a Seebeck temperature difference sensor and a diode absolute temperature sensor on an integrated circuit that may contain a power semiconductor such as a MOSFET.

Figure 40:
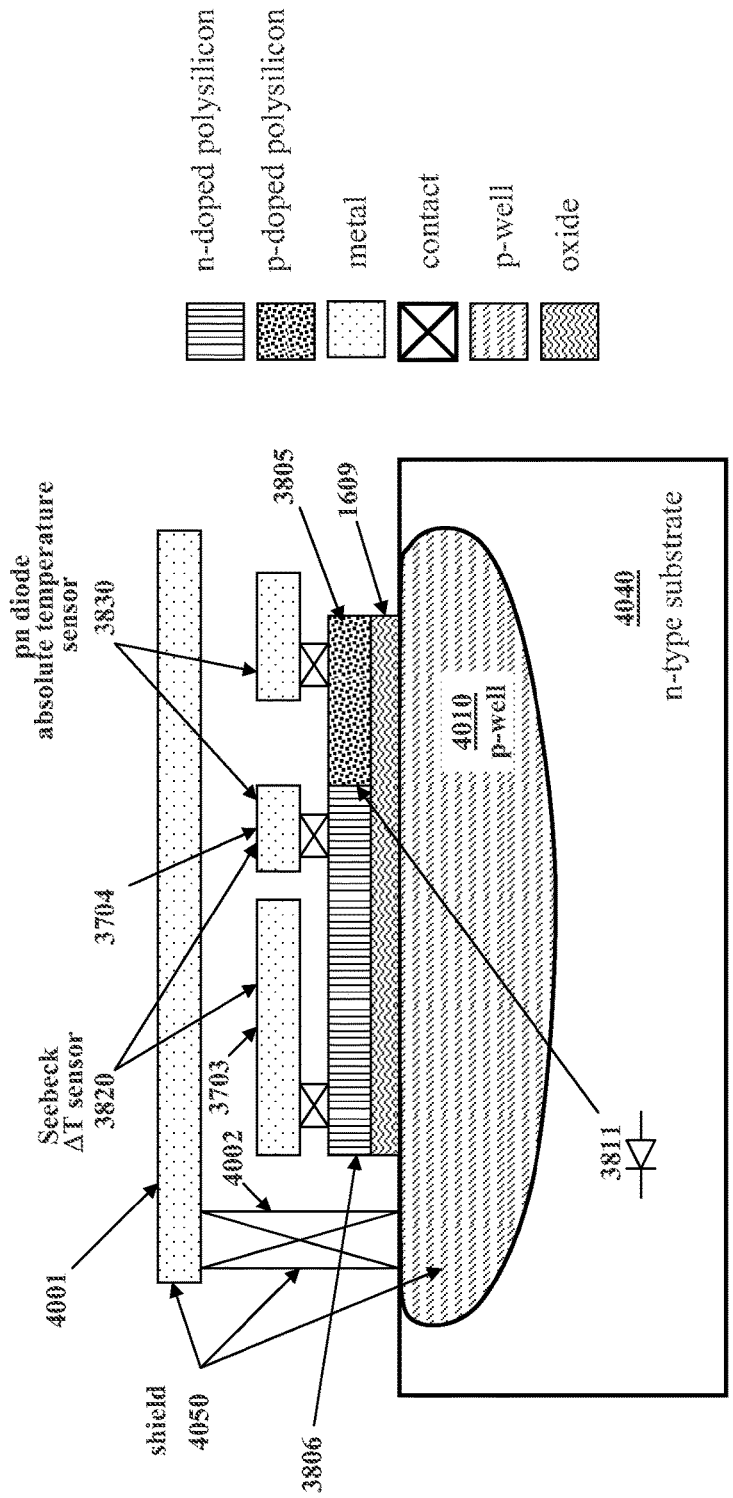
FIG. 40 illustrates a cross-sectional drawing of a portion of a semiconductor integrated circuit including a shielded absolute temperature difference sensor, constructed according to an embodiment.

Turning now to FIG. 40, illustrated is a cross-sectional drawing of a portion of a semiconductor integrated circuit including a shielded absolute temperature difference sensor, constructed according to an embodiment. The semiconductor device illustrated and described with reference to FIG. 39 includes shield 4050 for temperature-sensing elements of the integrated circuit. Shield 4050 is formed with metallic layer 4001, contact 4002, and p-well 4010. The p-well 4010 formed as an implant forms a lower portion of shield 4050. The upper portion of shield 4050 is formed with metallic layer of 4001 coupled to the p-well 4010 (which may be formed as an implant) through contact 4002. As described previously hereinabove, the shield 4050 may be coupled to a local potential or may be left floating. Other elements illustrated in FIG. 40 are similar to those illustrated and described with reference to FIG. 39 and will not be redescribed in the interest of brevity. The doping types of polysilicon traces 3805 and 3806 illustrated in FIG. 40 may be reversed in another embodiment, as well as that of other semiconductor elements in a compatible manner.

Figure 41:
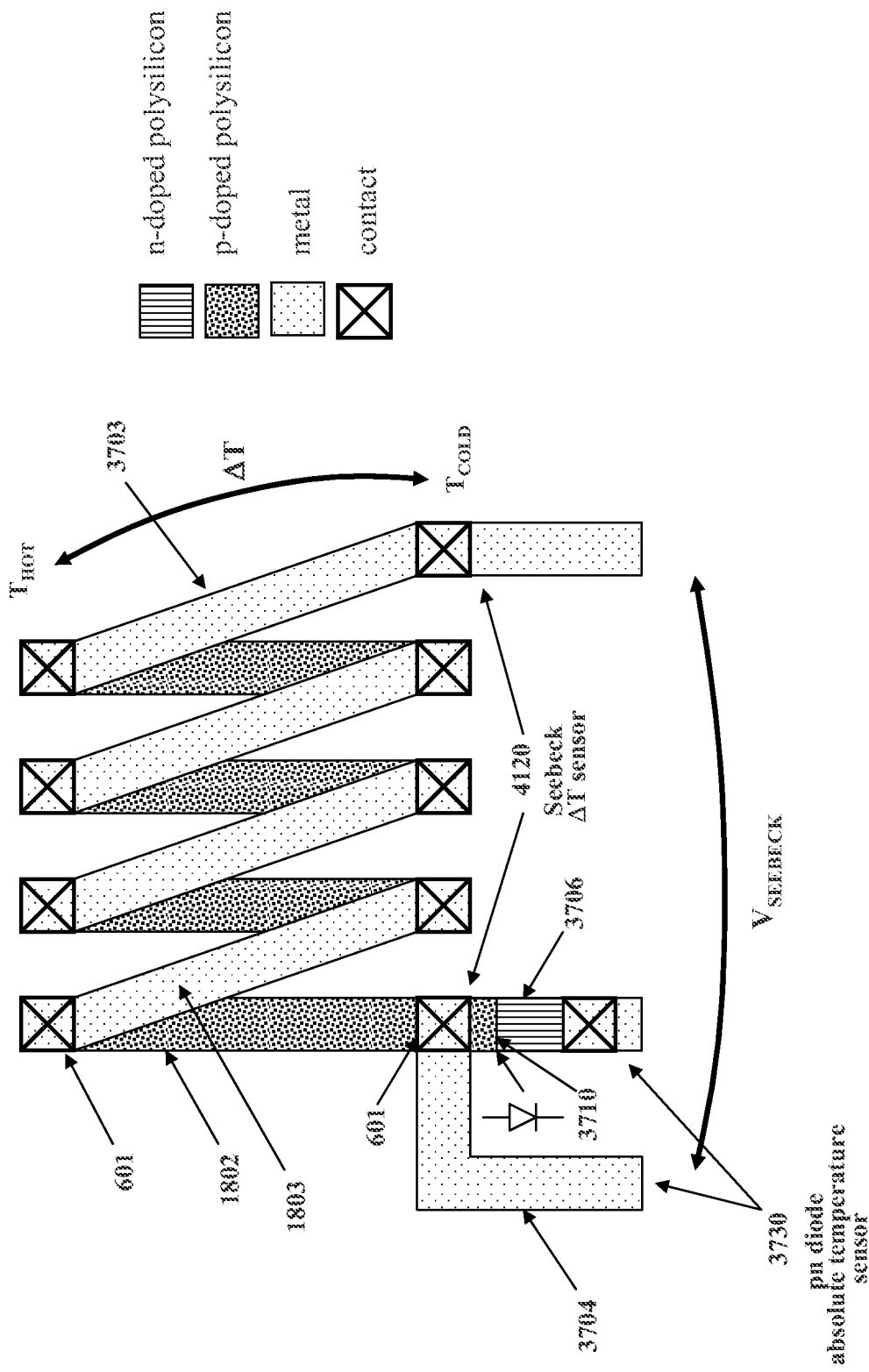
FIG. 41 illustrates a plan-view drawing of a portion of an integrated circuit including a series circuit arrangement of multiple traces to form a Seebeck temperature difference sensor, constructed according to an embodiment.

Turning now to FIG. 41, illustrated is a plan-view drawing of a portion of an integrated circuit including a series circuit arrangement of multiple traces to form a Seebeck temperature difference sensor 4120 to produce a higher sensed voltage for a given sensed temperature difference, constructed according to an embodiment. The Seebeck sensor is formed with multiple metal and doped semiconductor traces coupled in series coupled to a pn-diode absolute temperature sensor formed with doped traces. The doping types of the polysilicon traces forming the pn-diode may be reversed in an embodiment, as well as other semiconductor elements, in a compatible manner. The doped traces may be formed as implanted traces.

Figure 42:
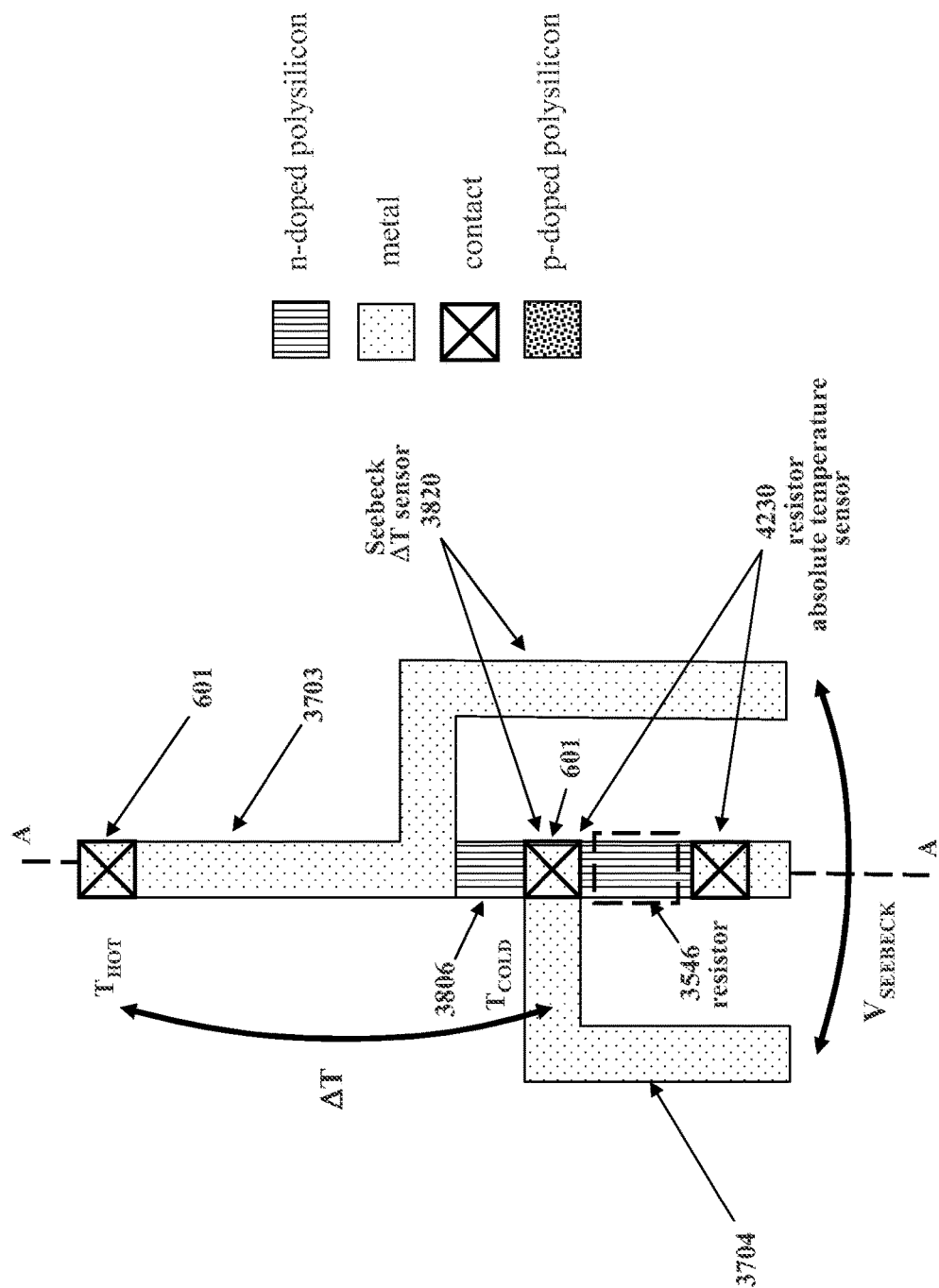
FIG. 42 illustrates a plan-view drawing of a portion of an integrated circuit including a series circuit arrangement of a Seebeck temperature difference sensor formed with a metal trace and a doped semiconductor trace coupled in series with a resistor absolute temperature sensor formed with a doped trace, constructed according to an embodiment.

Turning now to FIG. 42, illustrated is a plan-view drawing of a portion of an integrated circuit including a series circuit arrangement of a Seebeck temperature difference sensor 3820 formed with a metal trace 3703 and a doped semiconductor trace 3806 coupled in series with a resistor absolute temperature sensor 4230 formed with doped trace 3806, constructed according to an embodiment. The figure illustrates the Seebeck temperature difference sensor 4220 coupled in series with resistor 3546. The Seebeck sensor is formed employing an n-doped polysilicon trace and a metal trace. In an embodiment, the Seebeck temperature difference sensor may be formed using a p-doped polysilicon trace and a metal trace. The doped traces may be formed as implants. Thus, an absolute temperature sensor may be formed including a resistor using either an n-doped polysilicon trace or a p-doped polysilicon trace.

Figure 43:
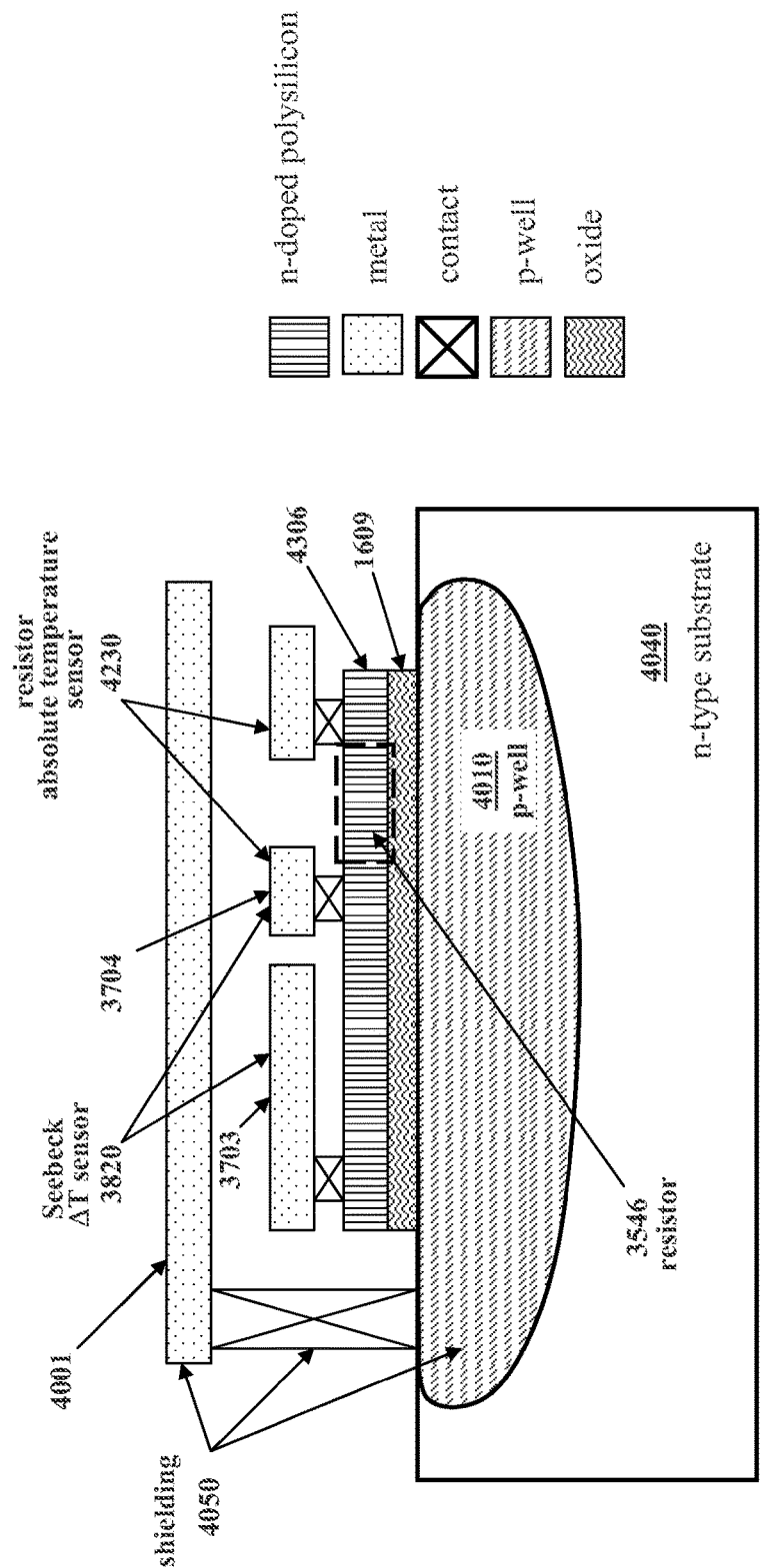
FIG. 43 illustrates a cross-sectional drawing of the embodiment illustrated in FIG. 42 along the axis A-A, illustrating a doped polysilicon trace that forms a temperature-sensing portion of the Seebeck temperature difference sensor and resistor of absolute temperature sensor.

Turning now to FIG. 43, illustrated is a cross-sectional drawing of the embodiment illustrated in FIG. 42 along the axis A-A. FIG. 43 illustrates doped polysilicon trace 4306 that forms a temperature-sensing portion of the Seebeck temperature difference sensor 3820 and resistor 3546 of absolute temperature sensor 4230. An embodiment may be formed changing the doping types of the various elements in a compatible manner. Traces in an embodiment may be formed as implants or as depositions.

Figure 44:
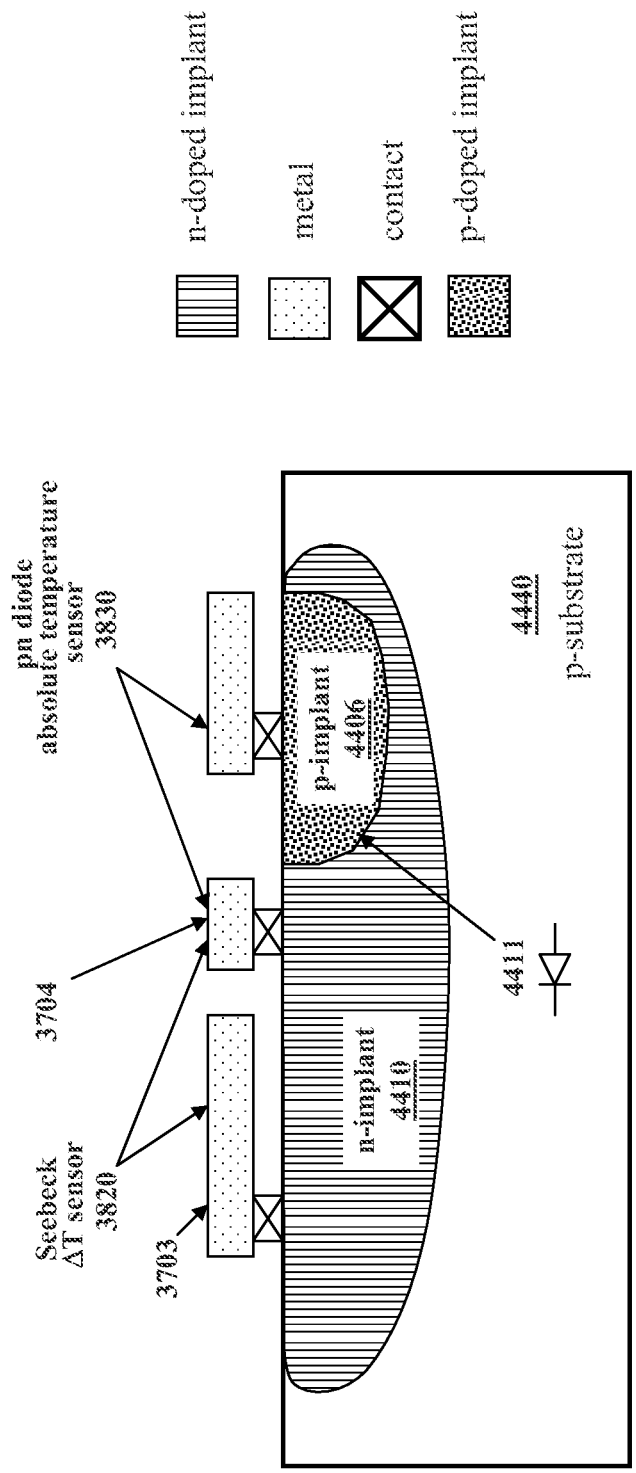
FIG. 44 illustrates a cross-sectional drawing of a portion of a semiconductor integrated circuit including an absolute temperature difference sensor, constructed according to an embodiment.

Turning now to FIG. 44, illustrated is a cross-sectional drawing of a portion of a semiconductor integrated circuit including an absolute temperature difference sensor, constructed according to an embodiment. The cross-sectional view drawing illustrates a semiconductor device including an n-type implant 4410 in a p-type substrate 4440. A p-type implant 4406 is formed in the n-type implant 4410. A pn-diode 4411 is formed at the semiconductor junction of the p-type implant 4406 and the n-type implant 4410 which may be used as the absolute temperature-sensing circuit element. The n-type implant 4410 and the overlying metal trace 3703 are employed to form Seebeck temperature difference sensor 3820. Other doping types may be employed in a compatible manner to form an embodiment similar to that illustrated in FIG. 44. A shield may be formed over the absolute temperature's sensing portion of the circuit as described hereinabove with reference to FIG. 43.

Figure 45:
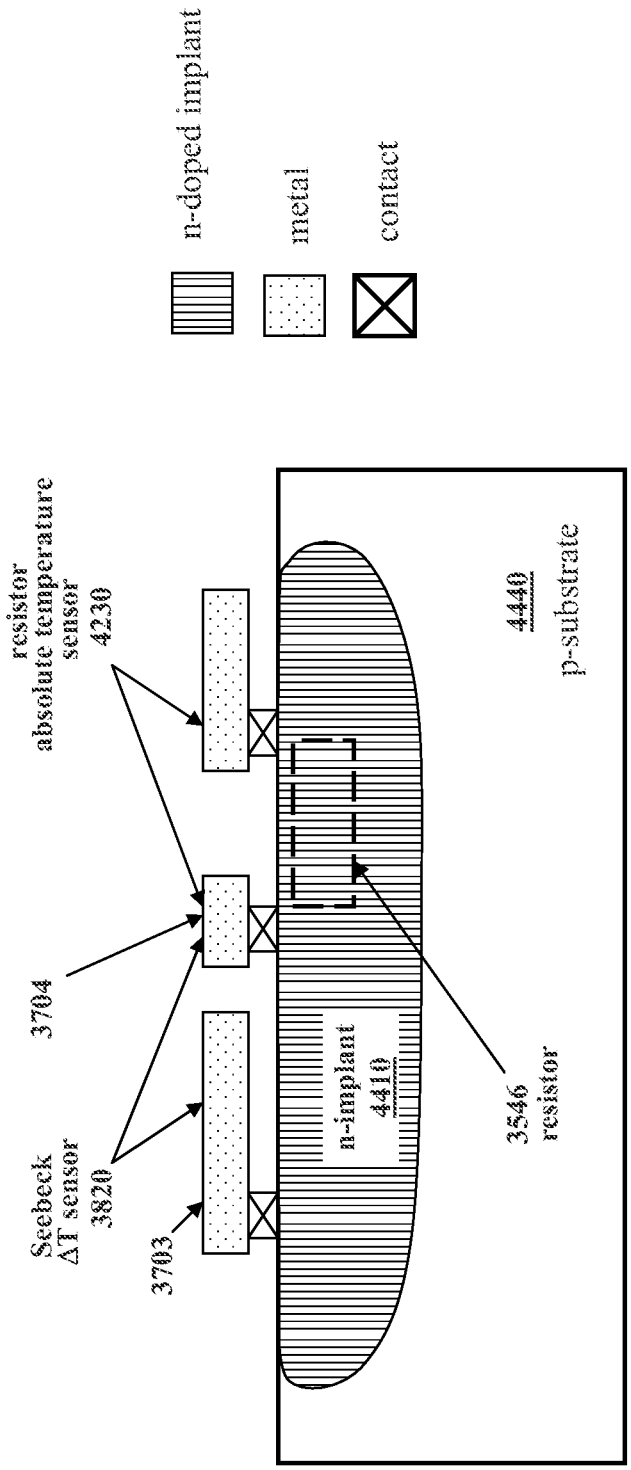
FIG. 45 illustrates a cross-sectional drawing of a portion of a semiconductor integrated circuit formed with a resistor absolute temperature sensor, constructed according to an embodiment.

Turning now to FIG. 45, illustrated is a cross-sectional drawing of a portion of a semiconductor integrated circuit formed with a resistor absolute temperature sensor 4230, constructed according to an embodiment. The cross-sectional view drawing illustrates an n-type implant 4410 in a p-type substrate 4440. A region of the n-type implant 4410 is employed as resistor 3546 which may be used as the absolute temperature-sensing circuit element. The n-type implant 4410 and the overlying metal trace 3703 are employed as illustrated and described with reference to FIG. 44 to form Seebeck temperature difference sensor 3820. Other doping types may be employed in a compatible manner to form an embodiment similar to that illustrated in FIG. 44. A shield may be formed over the absolute temperature's sensing portion of the circuit as described hereinabove with reference to FIG. 43.

In an ideal case the output voltage of a Seebeck temperature difference sensor is proportional to a temperature difference between hot and cold terminals of the Seebeck sensor, $$V_{Seebeck} = \alpha_s(T) \cdot \Delta T,$$

where $\alpha_s(T)$ is the Seebeck coefficient, usually expressed in mV/K, which in practice depends on the (absolute) temperature T. Temperature dependence of the Seebeck coefficient may complicate the use of a Seebeck temperature difference sensor in applications with high temperature gradients, for example, in power semiconductor devices.

Seebeck temperature difference sensors have mainly been used as infrared sensors where the temperature is held constant and the temperature difference to be detected by the sensor is only a few kelvin. In such applications, the Seebeck coefficient is assumed to be constant and temperature independent.

In applications, where a Seebeck temperature difference sensor is embedded in high temperature gradient applications, for example, a power MOSFET, and is used in an automotive environment, the temperature can range from −40° C. to 175° C. In this case, the output voltage of the Seebeck sensor depends on the temperature, since the Seebeck coefficient $\alpha_s$ depends on the temperature.

Particularly at high temperature gradients, such as 60 K between the two ends of the Seebeck sensor, different regions of the Seebeck sensor are exposed to different absolute temperature values, which leads to a non-constant Seebeck coefficient for different temperature gradients.

Hence it is important to have a temperature-independent Seebeck temperature difference sensor to enable its operation in temperature difference protection circuits for smart-power MOSFETs which may operate at different values of temperature, and for different temperature gradients.

As introduced herein, a Seebeck temperature difference sensor is produced with a temperature-independent Seebeck coefficient, and hence a temperature independent output voltage.

The following equations model the temperature-dependent Seebeck coefficient $\alpha_s$ in an n-type and p-type silicon trace, respectively:

$$\alpha_{s\_n} = -\frac{k}{q} \cdot \left( \ln\left(\frac{Nc(T)}{n}\right) + \frac{5}{2} \right) \quad (1)$$

$$\alpha_{s\_p} = +\frac{k}{q} \cdot \left( \ln\left(\frac{Nv(T)}{p}\right) + \frac{5}{2} \right) \quad (2)$$

where $\alpha_{s\_n}$ . . . Seebeck coefficient of a n-type silicon trace,
$\alpha_{s\_p}$ . . . Seebeck coefficient of a p-type silicon trace,
$N_C(T)$ . . . absolute temperature dependent conduction band density of states, $N_V(T)$ ... absolute temperature dependent valence band density of states, n ... electron density (fixed by the n-doping concentration), p ... hole density (fixed by the p-doping concentration), k ... Boltzmann constant ($1.38 \cdot 10^{-23}$ J/K), and q ... elementary charge ($1.602 \cdot 10^{-19}$ As).

Figure 46:
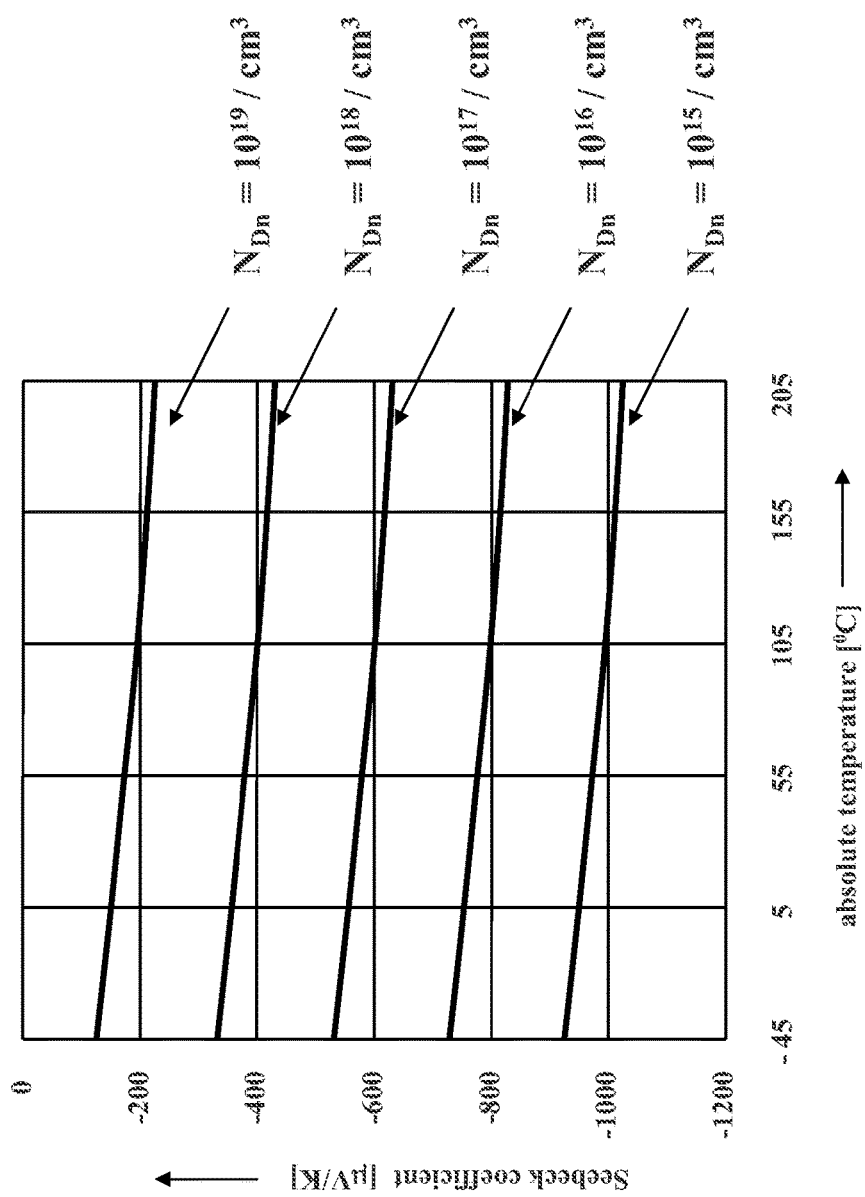
FIGS. 46 and 47 illustrate graphical representations of Seebeck coefficients versus absolute temperature for different doping concentrations, respectively, for a Seebeck temperature difference sensor formed of n-type silicon and p-type silicon traces.
Figure 47:
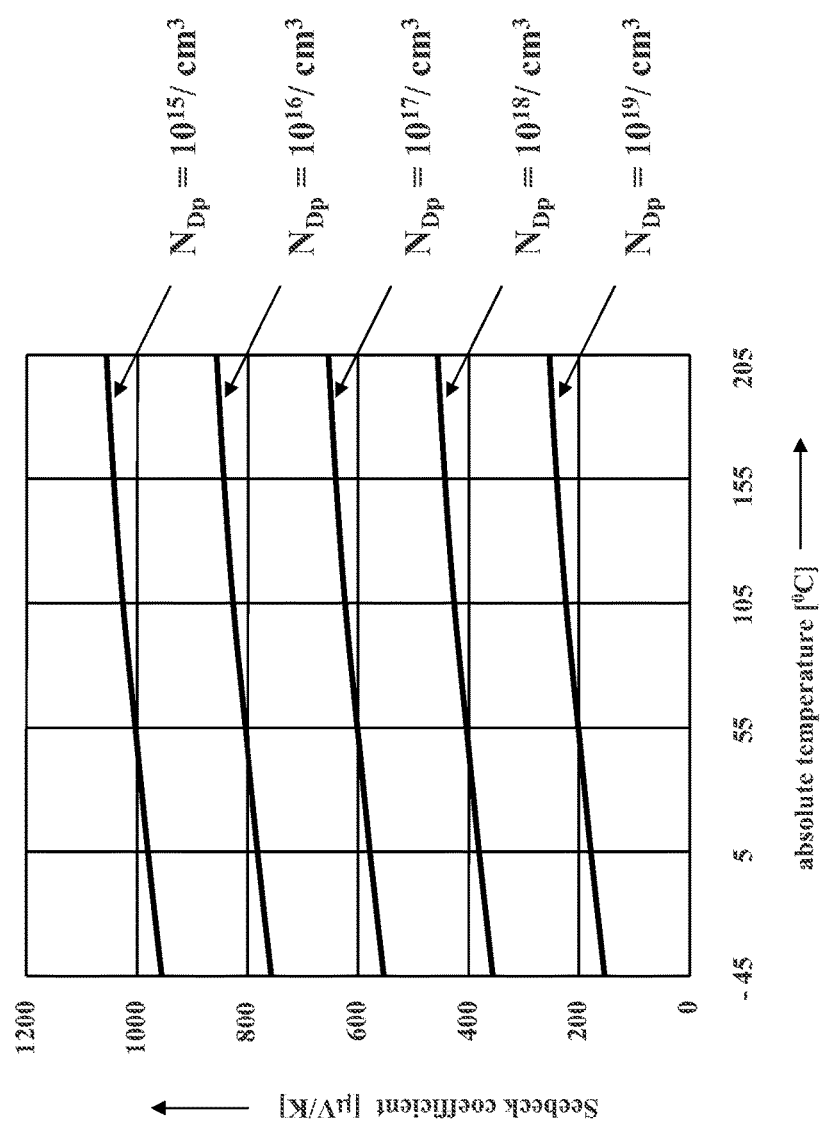

Graphical representations of equation 1 and equation 2 for different doping concentrations are illustrated in FIG. 46 and FIG. 47 for n-type silicon and p-type silicon, respectively, for the indicated electron and hole densities, $N_{Dn}$ and $N_{Dp}$. A strong dependence of the Seebeck coefficient on temperature can be observed in these figures.

Seebeck temperature difference sensors may be formed as described previously hereinabove employing an n-doped or p-doped polysilicon trace and metal contacts, for example, aluminum or copper contacts. Since copper and aluminum have very low Seebeck coefficients, usually in the range of 1.8 μV/K, the Seebeck coefficient of the polysilicon trace dominates the Seebeck coefficient of the metal trace.

To achieve a high output voltage of the Seebeck sensor, multiple n-doped or p-doped polysilicon traces may be coupled in series, such as including metal traces, for example, as illustrated and described hereinabove with reference to FIG. 41.

When connecting a plurality "m" of polysilicon traces in series, the output voltage $V_{Seebeck}$ of the Seebeck sensor is "m" times larger. Correspondingly, the Seebeck coefficient $\alpha_s(T)$ is "m" times larger. A disadvantage is that the dependence of the Seebeck coefficient on the absolute temperature is also larger.

A substantial portion of the temperature dependence of a Seebeck temperature difference sensor may be removed, as introduced herein, by coupling one polysilicon trace with a low doping concentration (n−) and one polysilicon trace with a high doping concentration (n+) in series so that the temperature dependency of the Seebeck coefficient is substantially removed, and the absolute values of the Seebeck voltages of the individual traces are subtracted from each other. Such an arrangement replaces the traditional arrangement of coupling two polysilicon traces with the same doping concentration (n-doped or p-doped) in series.

Figure 48:
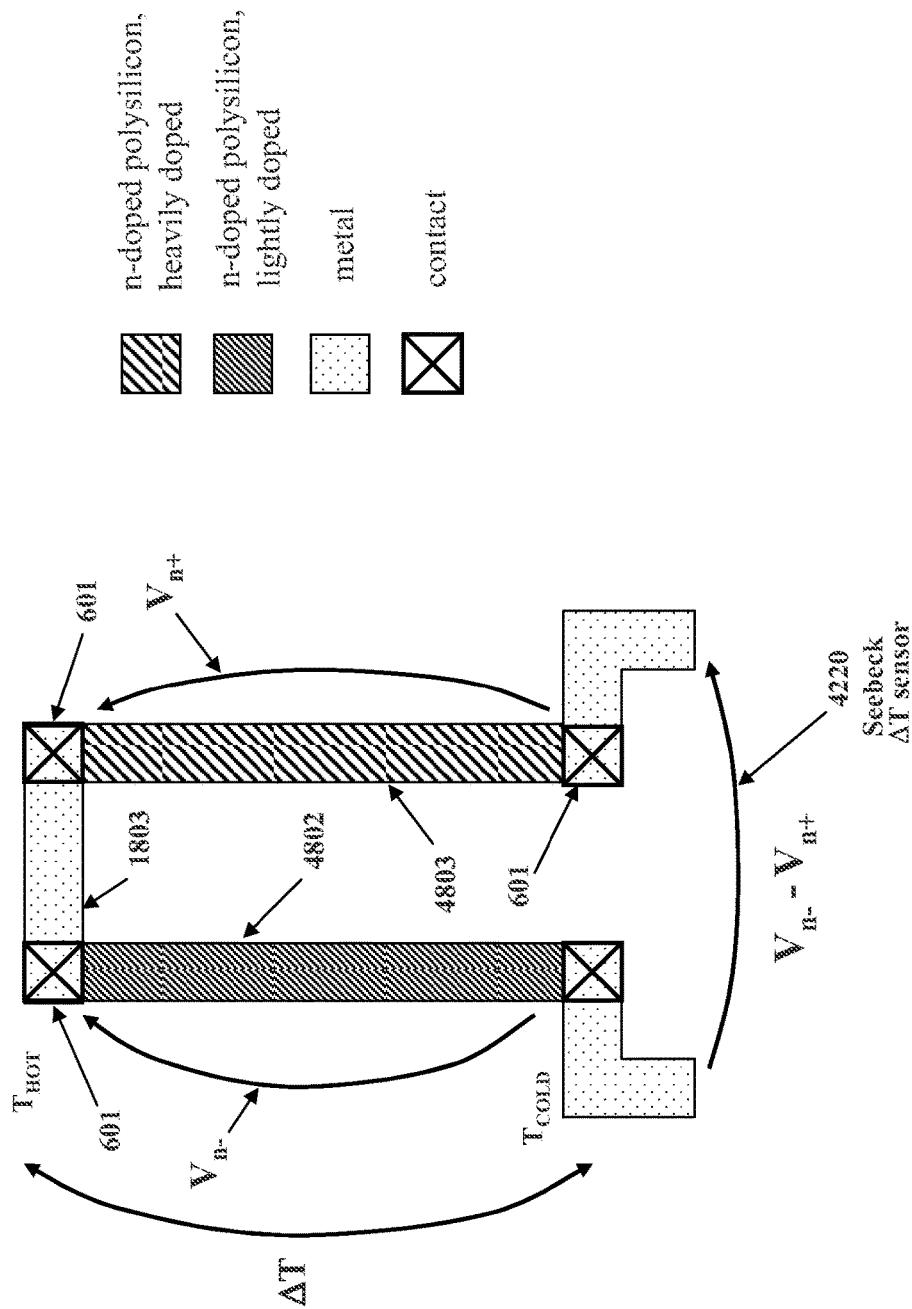
FIGS. 48 and 49 illustrate plan-view drawings of temperature-independent Seebeck temperature difference sensors formed by a lightly doped polysilicon trace and a heavily doped polysilicon trace of the same doping type coupled in series, constructed according to embodiments.

Turning now to FIG. 48, illustrated is a plan-view drawing of a temperature-independent Seebeck temperature difference sensor formed by a lightly n-doped polysilicon trace 4802 and a heavily n-doped polysilicon trace 4803 coupled in series by metal trace 1803, constructed according to an embodiment. The Seebeck sensor produces a temperature-independent sensed voltage $V_{n-}-V_{n+}$.

Figure 49:
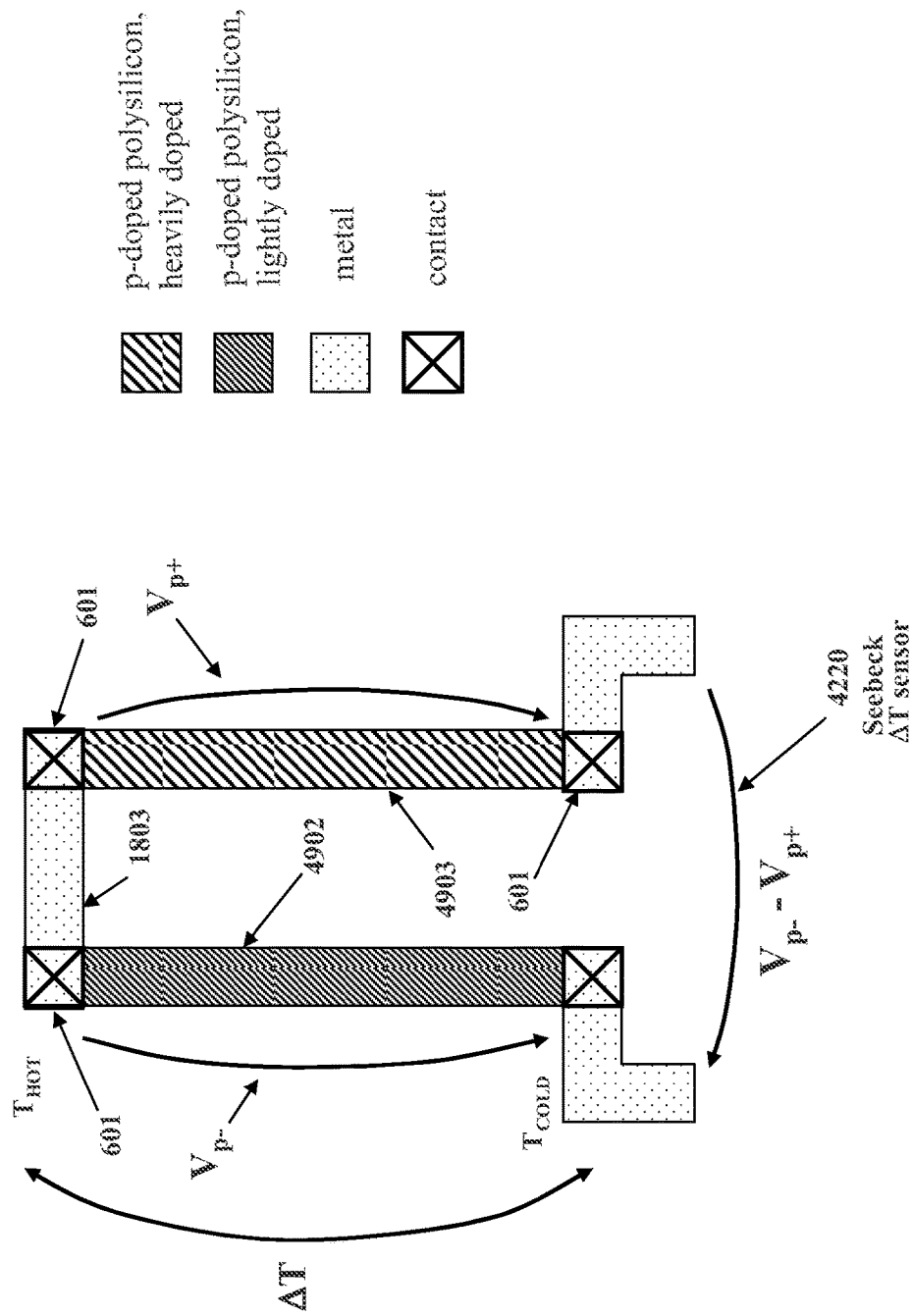

The heavily and lightly doped polysilicon traces illustrated in FIG. 48 may be correspondingly p-doped to produce a temperature-independent Seebeck coefficient with the opposite sense. Turning now to FIG. 49, illustrated is a plan-view drawing of a temperature-independent Seebeck temperature difference sensor formed by a lightly p-doped polysilicon trace 4902 and a heavily p-doped polysilicon trace 4903 coupled in series, constructed according to an embodiment. The Seebeck sensor produces a temperature-independent sensed voltage $V_{p-}-V_{p+}$.

Thus, a Seebeck temperature difference sensor is formed wherein absolute values of Seebeck voltages of single traces are subtracted from each other to produce a temperature-independent output voltage.

Turning now to FIG. 50, illustrated is a plan-view drawing of a temperature-independent Seebeck temperature difference sensor formed by a lightly p-doped polysilicon trace 4902 and a heavily n-doped polysilicon trace 4803 coupled in series, constructed according to an embodiment. The Seebeck sensor produces a temperature-independent sensed voltage $V_{n-}-V_{n+}$.

Figure 51:
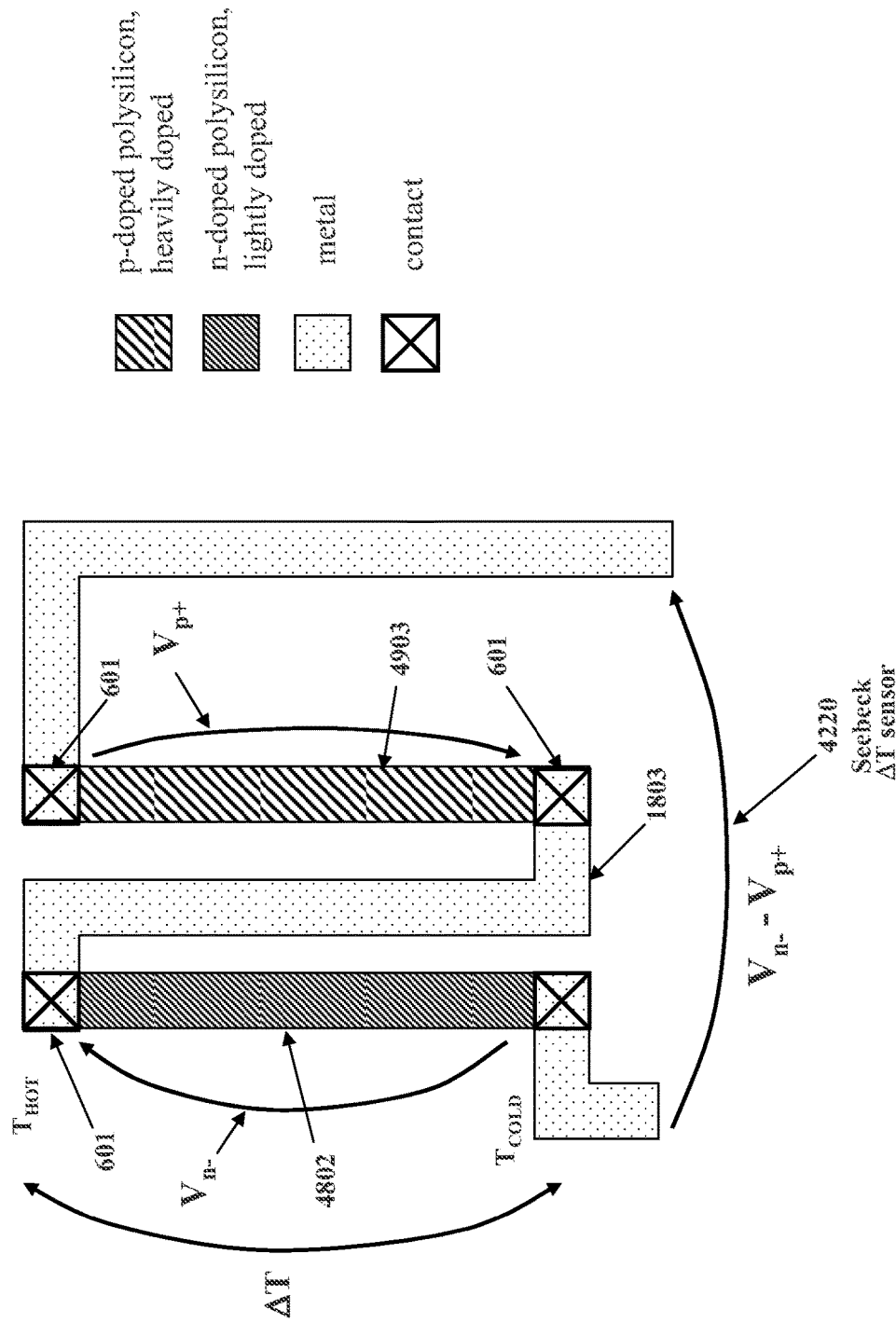

The heavily and lightly doped polysilicon traces illustrated in FIG. 50 may be correspondingly reversed to produce a temperature-independent Seebeck coefficient with the opposite sense. Turning now to FIG. 51, illustrated is a plan-view drawing of a temperature-independent Seebeck temperature difference sensor formed by a lightly n-doped polysilicon trace 4802 and a heavily p-doped polysilicon trace 4903 coupled in series, constructed according to an embodiment. The Seebeck sensor produces a temperature-independent sensed voltage $V_{p-}-V_{p+}$.

Figure 52:
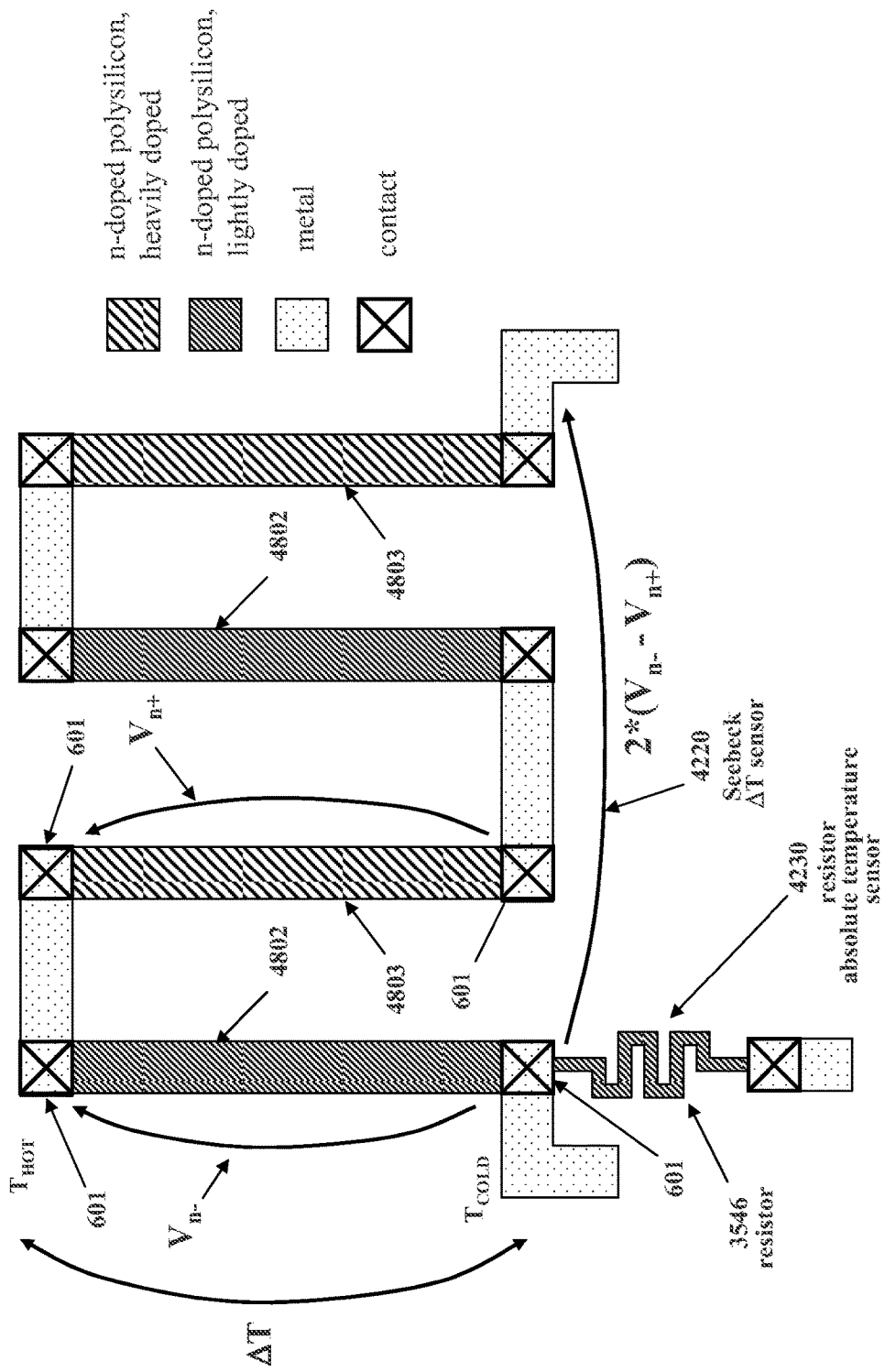
FIG. 52 illustrates a plan-view drawing of an absolute temperature-independent Seebeck temperature difference sensor formed by a plurality of two lightly n-doped polysilicon traces and two heavily n-doped polysilicon traces coupled in series, including a resistor absolute temperature sensor, constructed according to an embodiment.

Turning now to FIG. 52, illustrated is a plan-view drawing of a temperature-independent Seebeck temperature difference sensor formed by a plurality of two lightly n-doped polysilicon traces and two heavily n-doped polysilicon traces coupled in series, constructed according to an embodiment. As illustrated in FIG. 52, a lightly n-doped polysilicon trace, such as trace 4802, is coupled in series with a heavily n-doped polysilicon trace, such as trace 4803. Of course, more than two pairs or only one pair of doped polysilicon traces, one a lightly doped and one heavily doped, may be coupled in series to form a Seebeck temperature difference sensor with different levels of a signal indicating a temperature difference. The Seebeck sensor produces a temperature-independent sensed voltage $2 \cdot (V_{n-}-V_{n+})$. As illustrated further in FIG. 52, a doped polysilicon trace 3546 may be coupled in series with the lightly n-doped polysilicon trace 4802 to form a temperature-dependent resistor for a resistor absolute temperature sensor. The doped polysilicon trace 3546 is illustrated as a zigzag trace to provide a higher level of resistance that may be desired in an embodiment to produce a higher sensed signal corresponding to an absolute temperature. In an embodiment, the heavily and lightly doped polysilicon traces may be correspondingly p-doped to produce a Seebeck coefficient with the opposite sense. Thus, a Seebeck temperature difference sensor is formed with an absolute temperature independent output voltage, and the absolute values of the Seebeck voltages of the single traces are subtracted from each other.

Figure 53:
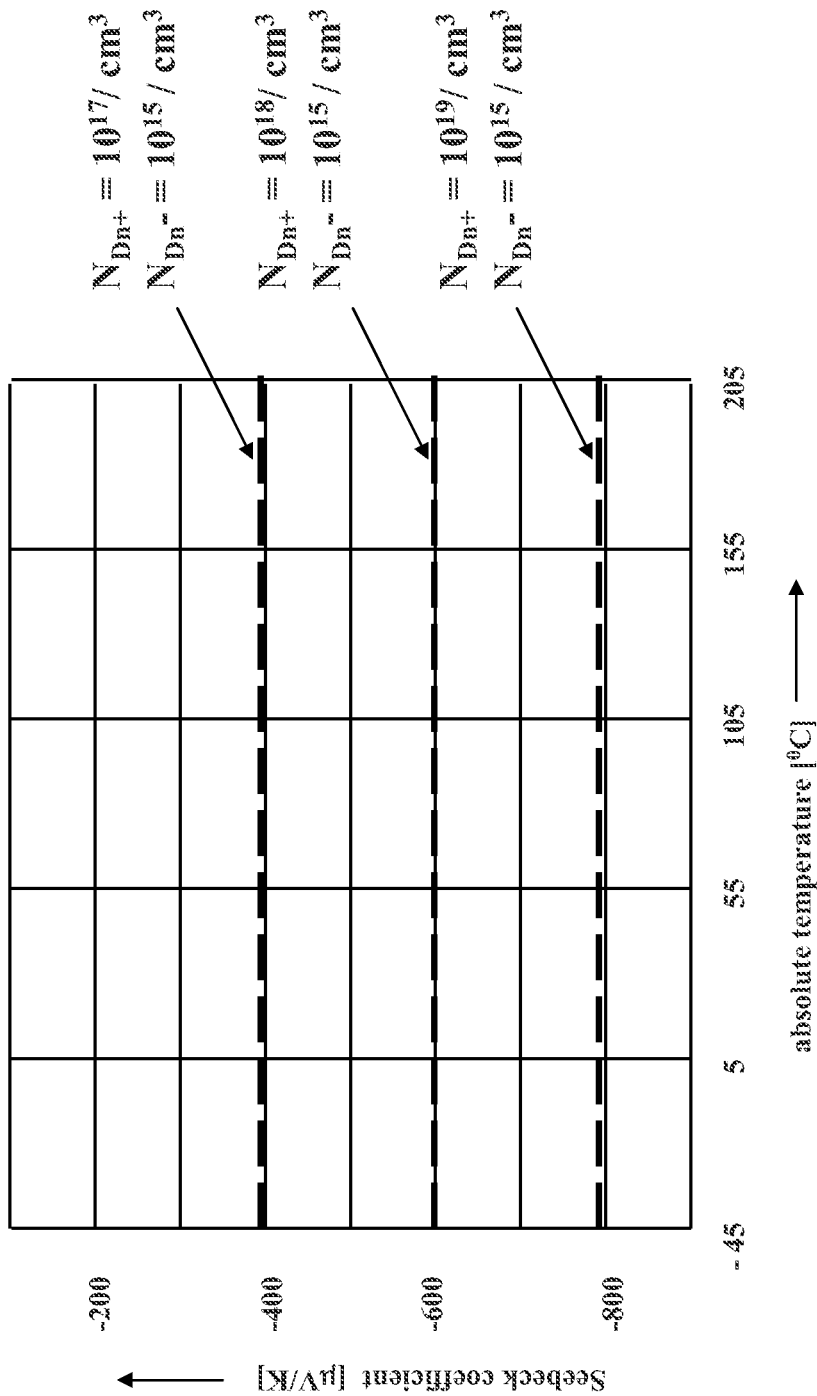
FIGS. 53 through 56 illustrate graphical plots of absolute temperature-independent Seebeck coefficients of a Seebeck temperature difference sensor formed of a pair of a highly doped polysilicon trace and a lightly doped polysilicon trace, versus absolute temperature.
Figure 54:
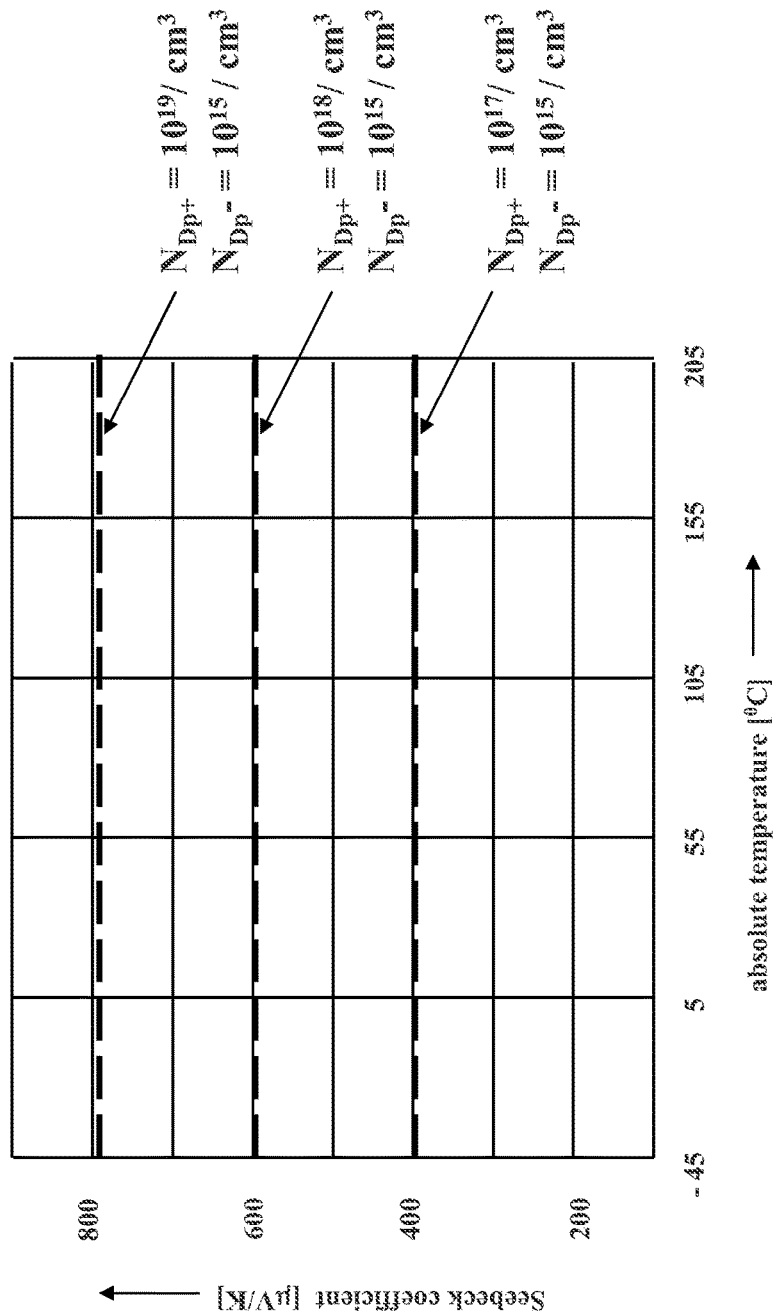
Figure 55:
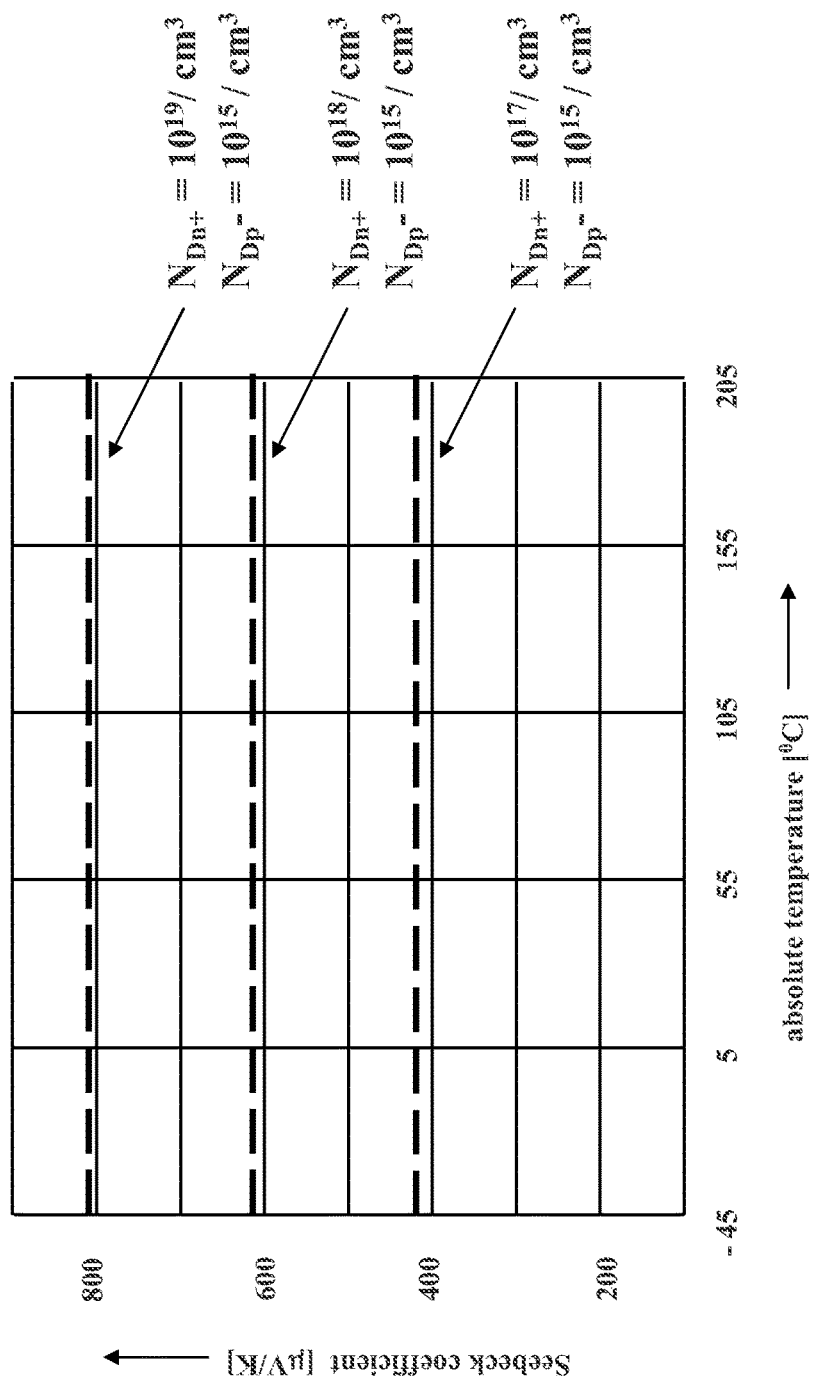
Figure 56:
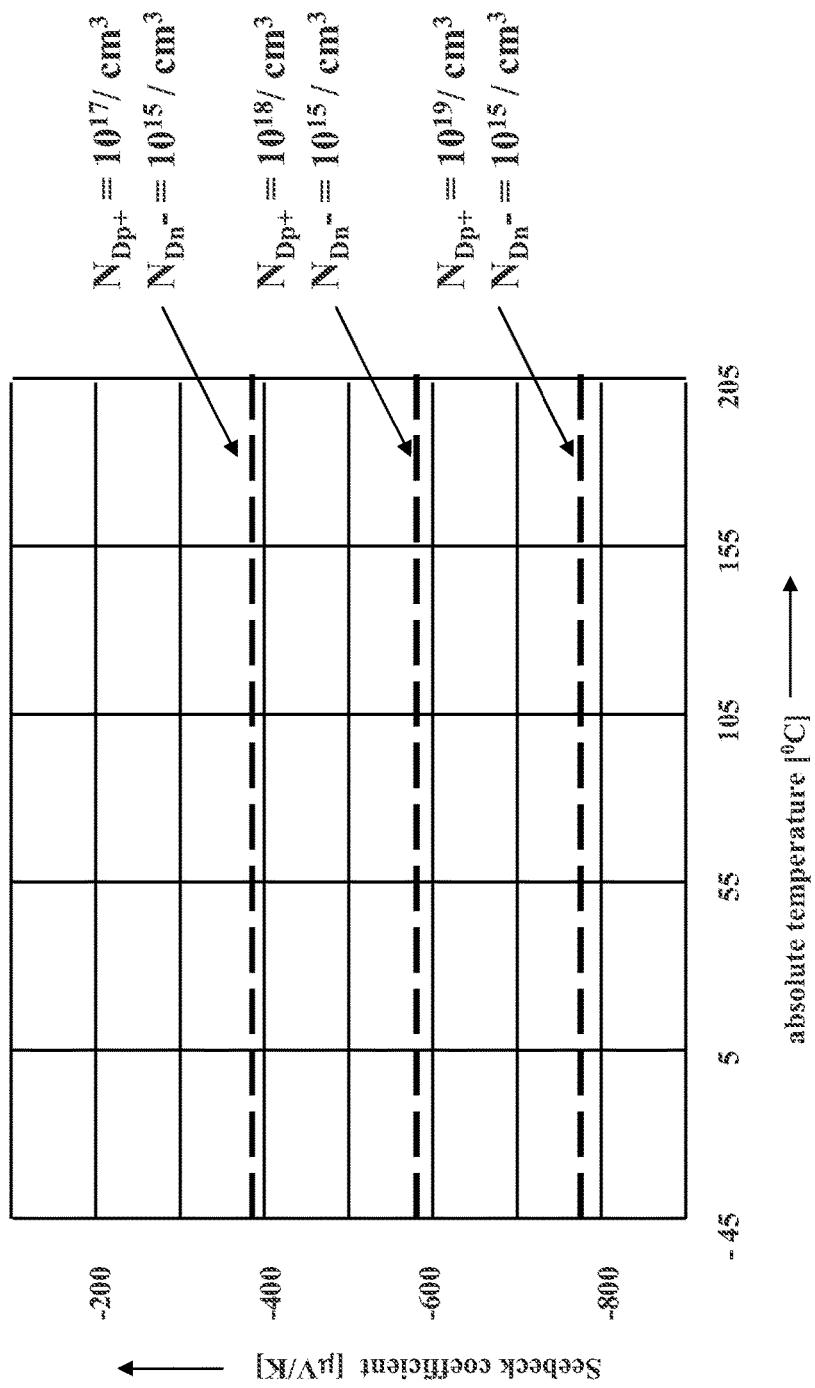

Turning now to FIGS. 53 through 56, illustrated are graphical plots of temperature-independent Seebeck coefficients of a Seebeck temperature difference sensor formed of a pair of a highly doped polysilicon trace and a lightly doped polysilicon trace, versus temperature. FIG. 53 illustrates a graphical plot for a low n-doping concentration of $10^{15}$ cm$^{-3}$ and high n-doping concentrations ranging from $10^{17}$ cm$^{-3}$ to $10^{19}$ cm$^3$. FIG. 54 illustrates a graphical plot for a low p-doping concentration of $10^{15}$ cm$^{-3}$ and high p-doping concentrations ranging from $10^{17}$ cm$^3$ to $10^{19}$ cm$^{-3}$. FIG. 55 illustrates a graphical plot for a low p-doping concentration of $10^{15}$ cm$^3$ and high n-doping concentrations ranging from $10^{17}$ cm$^3$ to $10^{19}$ cm$^3$. FIG. 56 illustrates a graphical plot for a low n-doping concentration of $10^{15}$ cm$^3$ and high p-doping concentrations ranging from $10^{17}$ cm$^{-3}$ to $10^{19}$ cm$^{-3}$. These four figures illustrate resulting temperature-independent Seebeck coefficients. These four figures also illustrate that the higher the difference in doping is, the higher the temperature-independent Seebeck coefficient is.

The concept has thus been introduced of forming a semiconductor device including a Seebeck temperature difference sensor that may be formed of oppositely doped polysilicon traces in a sensor trench. The sensor trench is formed in an epitaxial layer of the semiconductor device. In an embodiment, the oppositely doped polysilicon traces are separated by an oxide layer excepting a point of contact between the oppositely doped polysilicon traces. In an embodiment, the point of contact between the oppositely doped polysilicon traces is an ohmic contact. In an embodiment, the semiconductor device further includes an electrostatic shield formed in another trench adjacent to the sensor trench. In an embodiment, the semiconductor device further includes a first oxide layer formed on a wall of the sensor trench, a conductive shield formed on the first oxide layer, and a second oxide layer formed on the conductive shield. In an embodiment, the semiconductor device further includes an oxide layer deposited over the Seebeck temperature difference sensor, and a conductive shield formed on the oxide layer. In an embodiment, the conductive shield formed on the oxide layer is a metallic shield. In an embodiment, the semiconductor device further includes a power semiconductor device. In an embodiment, the power semiconductor device is a MOSFET, an insulated gate bipolar transistor, etc.

Another exemplary embodiment provides a method of forming a semiconductor device including a Seebeck temperature difference sensor. In an embodiment, the method includes forming the Seebeck temperature difference sensor of oppositely doped polysilicon traces in a sensor trench in an epitaxial layer of the semiconductor device. In an embodiment, the method further includes separating the oppositely doped polysilicon traces with an oxide layer excepting a point of contact between the oppositely doped polysilicon traces. In an embodiment, the point of contact between the oppositely doped polysilicon traces is an ohmic contact. In an embodiment, the method further includes forming an electrostatic shield in another trench adjacent to the sensor trench. In an embodiment, the method further includes forming a first oxide layer on a wall of the sensor trench, forming a conductive shield on the first oxide layer, and forming a second oxide layer on the conductive shield. In an embodiment, the method further includes depositing an oxide layer over the Seebeck temperature difference sensor, and forming a conductive shield on the oxide layer. In an embodiment, the conductive shield formed on the oxide layer is a metallic shield. In an embodiment, the method further includes forming a power semiconductor device in the semiconductor device. In an embodiment, the power semiconductor device is a MOSFET, an insulated gate bipolar transistor, etc.

Another exemplary embodiment provides a Seebeck temperature difference sensor formed on a semiconductor device with an electrically conductive shield also formed thereon. In an embodiment, the Seebeck temperature difference sensor is formed of a junction of dissimilar materials and the shield is formed of an electrically conductive material substantially surrounding the Seebeck temperature difference sensor. In an embodiment, the Seebeck temperature difference sensor is formed of a plurality of the junctions of dissimilar materials. In an embodiment, the dissimilar materials include a semiconductor material and a metal. In a further embodiment, the dissimilar materials include differently doped semiconductor materials. In an embodiment, the shield is electrically coupled to a local ground potential. In a further embodiment, the shield is electrically coupled to a local circuit potential through a resistor. In an embodiment, the shield may be left electrically floating. In an embodiment, the shield includes a doped well in a semiconductor substrate. In a further embodiment, the shield includes a metal layer formed substantially over the Seebeck temperature difference sensor. In an embodiment, the shield is electrically isolated from the Seebeck temperature difference sensor. In an embodiment, the shield includes a trench containing at least one electrically conductive layer. In an embodiment, the semiconductor device includes a power switching device such as a power MOSFET, an insulated gate bipolar transistor, etc.

Another exemplary embodiment provides a method of shielding a Seebeck temperature difference sensor formed on a semiconductor device with an electrically conductive shield also formed thereon. In an embodiment, the method includes forming the Seebeck temperature difference sensor of a junction of dissimilar electrically conductive materials, and substantially surrounding the Seebeck temperature difference sensor with a shield of an electrically conductive material formed on the power semiconductor device. In a further embodiment, the method includes forming the Seebeck temperature difference sensor of a plurality of the junctions of dissimilar materials. In an embodiment, the dissimilar materials include a semiconductor material and a metal. In a further embodiment, the dissimilar materials include differently doped semiconductor materials. In an embodiment, the method includes electrically coupling the shield to a local ground potential. In a further embodiment, the method includes electrically coupling the shield to a local circuit potential through a resistor. In a further embodiment, the method includes leaving the shield electrically floating. In an embodiment, the method includes forming at least a portion of the shield as a doped well in a semiconductor substrate on which the power semiconductor device is formed. In an embodiment, the method further includes forming at least a portion of the shield as a metal layer deposited over the Seebeck temperature difference sensor. In an embodiment, the method includes electrically isolating the shield from the Seebeck temperature difference sensor junction. In an embodiment, the semiconductor device includes a power-switching device such as a MOSFET, an insulated gate bipolar transistor, etc.

Another exemplary embodiment provides a semiconductor device including a Seebeck temperature difference sensor formed of a junction of dissimilar materials, and an absolute temperature sensor, and a related method. In an embodiment, the absolute temperature sensor is coupled in series with the Seebeck temperature difference sensor. In an embodiment, a Seebeck coefficient of the Seebeck temperature difference sensor and a temperature coefficient of the absolute temperature sensor are substantially equal. In an embodiment, the absolute temperature sensor includes a resistor formed as a doped semiconductor trace. In an embodiment, the Seebeck temperature difference sensor includes a plurality of the junctions of dissimilar materials. In an embodiment, the dissimilar materials include differently doped semiconductor materials. In an embodiment, the semiconductor device further includes a shield formed of an electrically conductive material substantially surrounding the Seebeck temperature difference sensor and the absolute temperature sensor. In an embodiment, the shield is electrically coupled to a local ground potential. In an embodiment, the shield includes a doped well in a semiconductor substrate. In an embodiment, the shield includes a metal layer formed over the Seebeck temperature difference sensor. In an embodiment, the semiconductor device includes a power switching device such as a power MOSFET, an insulated gate bipolar transistor, etc.

Another exemplary embodiment provides a semiconductor device comprising a Seebeck temperature difference sensor and a related method. The Seebeck temperature difference sensor is formed of a first junction of a first trace of a semiconductor material and a second trace of the semiconductor material, wherein the first trace and the second trace have different doping concentration, and wherein the first trace and the second trace are coupled by an electrically conductive material. In an embodiment, the first trace and the second trace are formed of the same doping type. In an embodiment, the first trace and a second trace are formed of the same doping type and are doped with the same doping element. In an embodiment, the Seebeck temperature difference sensor further includes a second junction of a third trace of the semiconductor material and a fourth trace of the semiconductor material, wherein the third trace and the fourth trace have the different doping concentration, wherein the third trace and the fourth trace are coupled by a second contact of the electrically conductive material, and wherein the second trace and the third trace are coupled by a third contact of the electrically conductive material. In an embodiment, the semiconductor device further includes an electrically conductive shield surrounding a substantial portion of the Seebeck temperature difference sensor. In an embodiment, the electrically conductive shield includes a doped well in a semiconductor substrate of the semiconductor device. In an embodiment, the electrically conductive shield includes a metal layer formed over the Seebeck temperature difference sensor. In an embodiment, the electrically conductive shield includes a trench containing at least one electrically conductive layer. In an embodiment, the electrically conductive shield is electrically isolated from the Seebeck temperature difference sensor. In an embodiment, the semiconductor device further includes an absolute temperature sensor coupled in series with the Seebeck temperature difference sensor. In an embodiment, the semiconductor device further includes a power MOSFET, an insulated gate bipolar transistor, etc.

Although processes to form a Seebeck temperature difference sensor and related methods have been described for application to a semiconductor power switch such as a power MOSFET, it should be understood that other applications of these processes, such as for other semiconductor switches including, without limitation, bipolar switches and insulated-gate bipolar transistors, as well as other heat-generating semiconductor structures such as high-performance microprocessors are contemplated within the broad scope of the invention, and need not be limited to power MOSFET applications employing processes introduced herein.

Although the invention has been shown and described primarily in connection with specific exemplary embodiments, it should be understood by those skilled in the art that diverse changes in the configuration and the details thereof can be made without departing from the essence and scope of the invention as defined by the claims below. The scope of the invention is therefore determined by the appended claims, and the intention is for all alterations that lie within the range of the meaning and the range of equivalence of the claims to be encompassed by the claims.

What is claimed is:

1. A semiconductor device comprising:
   a Seebeck temperature difference sensor disposed on a semiconductor substrate, the Seebeck temperature difference sensor comprising
      a first portion of an electrically conductive material disposed on said semiconductor substrate,
      a first junction of a first trace of a semiconductor material having a first end conductively connected to a first node of the Seebeck temperature difference sensor and a second end coupled to the first portion of the electrically conductive material, and
      a second trace of the semiconductor material having a first end coupled to a second node of the Seebeck temperature difference sensor and a second end conductively connected to the first portion of the electrically conductive material, wherein the first trace and the second trace have different doping concentrations, and a potential difference between the first node and the second node is proportional to a temperature difference between the first node and the first portion of the electrically conductive material.

2. The semiconductor device as claimed in claim 1, wherein the first trace and the second trace are formed of a same doping type.

3. The semiconductor device as claimed in claim 1, wherein the first trace and the second trace are formed of a same doping type and are doped with a same doping element.

4. The semiconductor device as claimed in claim 1, further comprising an electrically conductive shield disposed above and below a substantial portion of the Seebeck temperature difference sensor.

5. The semiconductor device as claimed in claim 4, wherein the electrically conductive shield comprises:
   a doped region disposed in the semiconductor substrate below the first trace of the semiconductor material and the second trace of the semiconductor material; and
   a conductive region disposed above the first trace of the semiconductor material and the second trace of the semiconductor material opposite the semiconductor substrate.

6. The semiconductor device as claimed in claim 1, further comprising:
   a second portion of the electrically conductive material coupled to the first end of the second trace of the semiconductor material;
   a third portion of the electrically conductive material;
   a third trace of the semiconductor material having a first end coupled to the second portion of the electrically conductive material and a second end conductively connected the a third portion of the electrically conductive material, wherein the third trace of a semiconductor material has a same doping concentration as the first trace of the semiconductor material; and
   a fourth trace of the semiconductor material having a first end conductively connected to the third portion of the electrically conductive material and a second end coupled the second node of the Seebeck temperature difference sensor, wherein the third trace of a semiconductor material has a same doping concentration as the second trace of the semiconductor material.

7. The semiconductor device as claimed in claim 6, wherein:
   the first and third portions of the electrically conductive material are disposed on a first region of the semiconductor substrate configured to have a first temperature; and
   the second portion of the electrically conductive material is disposed on a second region of the semiconductor substrate configured to have a second temperature.

8. The semiconductor device as claimed in claim 1, further comprising an amplifier having a first input coupled to the first node a second input coupled to the second node.

9. A semiconductor device comprising:
   a shielded temperature difference sensor disposed on a semiconductor substrate, the shielded temperature difference sensor comprising a temperature difference sensor and a shield, the shield substantially surrounding the temperature difference sensor, wherein the shield comprises a doped region disposed in the semiconductor substrate below the shielded temperature difference sensor and a conductive region disposed above the temperature difference sensor, and the doped region and the conductive region are conductively connected together; and a MOSFET, wherein the shielded temperature difference sensor and the MOSFET are integrated in the semiconductor device.

10. The semiconductor device as claimed in claim 9, wherein the shielded temperature difference sensor comprises a plurality of shielded temperature difference sensors.

11. The semiconductor device as claimed in claim 10, wherein the plurality of shielded temperature difference sensors is arranged in a series configuration.

12. The semiconductor device as claimed in claim 9, wherein the shield is electrically coupled to a local potential.

13. The semiconductor device as claimed in claim 9, wherein the shield is electrically floating.

14. The semiconductor device as claimed in claim 9, wherein the shield is electrically coupled to the same potential as an output signal of the shielded temperature difference sensor.

* * * * *